United States Patent [19]
Itoh et al.

[11] Patent Number: 5,832,486
[45] Date of Patent: Nov. 3, 1998

[54] DISTRIBUTED DATABASE SYSTEM HAVING MASTER AND MEMBER SUB-SYSTEMS CONNECTED THROUGH A NETWORK

[75] Inventors: Kazuhiko Itoh; Toshio Matsumoto; Masahiro Mizuno; Akira Ogawa; Shiro Ogura; Hitoshi Yamamoto; Hiroshi Baba, all of Kanagawa, Japan

[73] Assignee: Mitsubishi Denki Kabushiki Kaisha, Tokyo, Japan

[21] Appl. No.: 754,510

[22] Filed: Nov. 19, 1996

Related U.S. Application Data

[62] Division of Ser. No. 432,508, May 1, 1995.

[30] Foreign Application Priority Data

May 9, 1994 [JP] Japan ...................................... 6-94870

[51] Int. Cl.$^6$ ................................................. G06F 15/163
[52] U.S. Cl. .................................. 707/10; 707/8; 707/9; 395/200.31; 395/200.38; 395/200.55
[58] Field of Search ..................................... 395/610, 608, 395/609, 615, 617, 618, 200.03, 200.31, 200.38, 200.55; 707/10, 9, 8

[56] References Cited

U.S. PATENT DOCUMENTS

| | | | |
|---|---|---|---|
| 4,881,166 | 11/1989 | Thompson et al. | 364/200 |
| 5,140,689 | 8/1992 | Kobayashi | 395/575 |
| 5,363,121 | 11/1994 | Freund | 395/600 |
| 5,504,900 | 4/1996 | Raz | 395/650 |
| 5,561,797 | 10/1996 | Gilles et al. | 395/600 |
| 5,630,124 | 5/1997 | Coyle, Jr. et al. | 395/614 |

FOREIGN PATENT DOCUMENTS

| | | |
|---|---|---|
| 0441090 | 8/1991 | European Pat. Off. . |
| 0443038 | 8/1991 | European Pat. Off. . |
| 0484804 | 5/1992 | European Pat. Off. . |
| 0567999 | 11/1993 | European Pat. Off. . |
| 0617373 | 9/1994 | European Pat. Off. . |
| 1457030 | 12/1976 | United Kingdom . |
| 2207264 | 1/1989 | United Kingdom . |
| 2230626 | 10/1990 | United Kingdom . |
| 2235798 | 3/1991 | United Kingdom . |
| 2273183 | 6/1994 | United Kingdom . |
| 2277176 | 10/1994 | United Kingdom . |

*Primary Examiner*—Thomas G. Black
*Assistant Examiner*—Jean R. Homere
*Attorney, Agent, or Firm*—Wolf, Greenfield & Sacks, P.C.

[57] ABSTRACT

For the high-speed data access machine, data is distributed in a plurality of hard disk drives coupled to slave processors to achieve ever-higher data reliability and maintenance. One master processor is provided with a plurality of slave processors, each of which is coupled to two hard disk drives containing the same data. A synchronous signal permits two hard disk drives to operate in synchronous rotation in half-a-turn phase difference from each other. The hard disk controller writes the same data in both hard disk drives but reads data from whichever hard disk drive requires less access time to obtain the data. A plurality of hard disk drives holding exactly the same data improves data reliability. Also, by rotating a plurality of hard disk drives in different phase, the rotational delay in data access is cut by half.

10 Claims, 52 Drawing Sheets

| HEAD POSITION OF HDD 0 | HEAD POSITION OF HDD 1 |
|---|---|
| X TRACK | Y TRACK |

FIG. 5A

ACCESS TIME = ROTATIONAL DELAY + SEEK TIME + TRANSFER TIME $$\text{ACCESS TIME} = \begin{pmatrix} \text{ROTATING TIME} \\ \text{FROM CURRENT} \\ \text{POSITION TO} \\ \text{DATA POSITION} \end{pmatrix} + \begin{pmatrix} \text{TIME FROM} \\ \text{CURRENT} \\ \text{HEAD} \\ \text{POSITION TO} \\ \text{OBJECT DATA} \\ \text{TRACK} \end{pmatrix} + \begin{pmatrix} \text{TRANSFER SPEED} \\ \times \\ \text{DATA AMOUNT} \end{pmatrix}$$

FIG. 5B

$$\text{HDD 0 ACCESS TIME} = \frac{1}{4} \times 1 \text{ ROTATING TIME} + \text{TIME FROM X TRACK TO Z TRACK} + \text{TRANSFER TIME}$$

FIG. 5C

$$\text{HDD 1 ACCESS TIME} = \frac{3}{4} \times 1 \text{ ROTATING TIME} + \text{TIME FROM Y TRACK TO Z TRACK} + \text{TRANSFER TIME}$$

ACCESS TIME = THE GREATER OF ROTATIONAL DELAY OR SEEK TIME + TRANSFER TIME

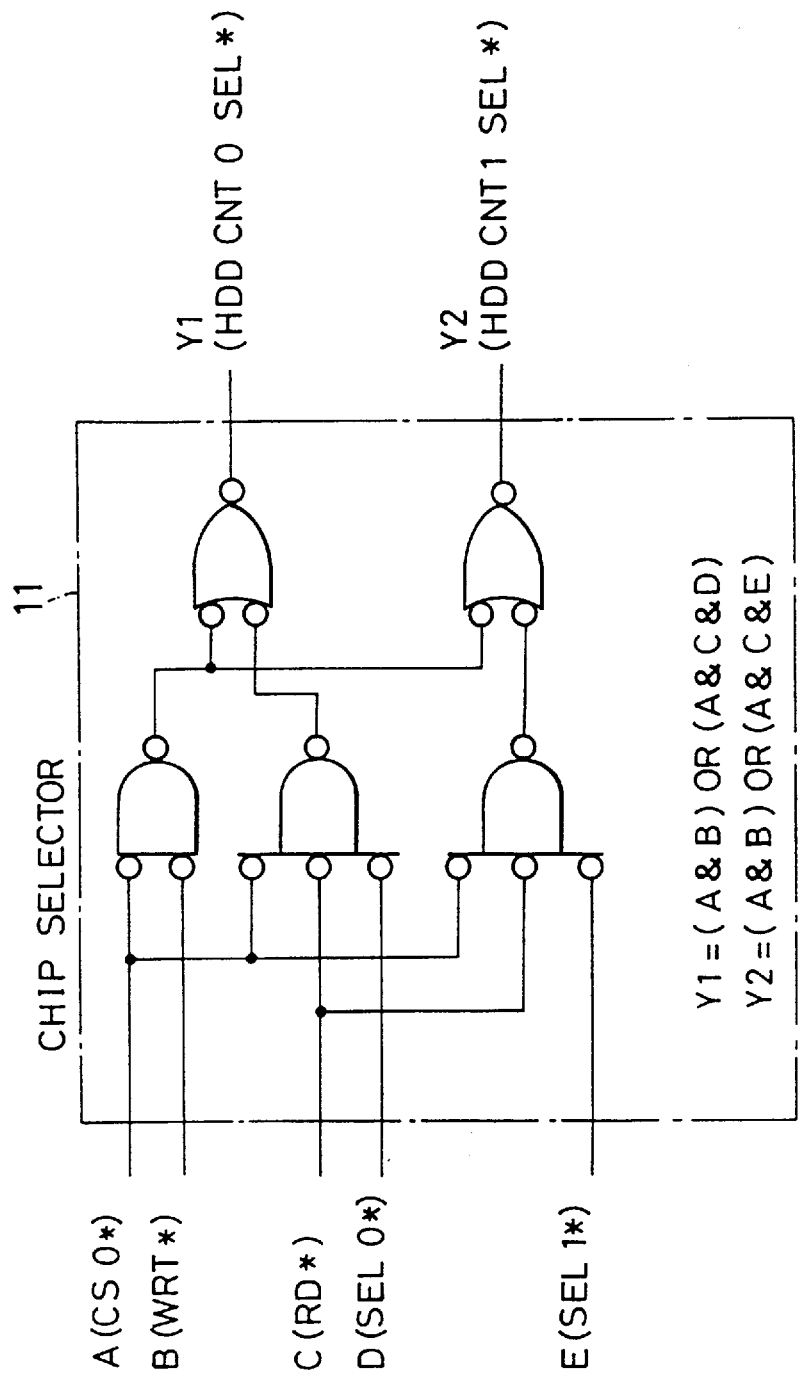

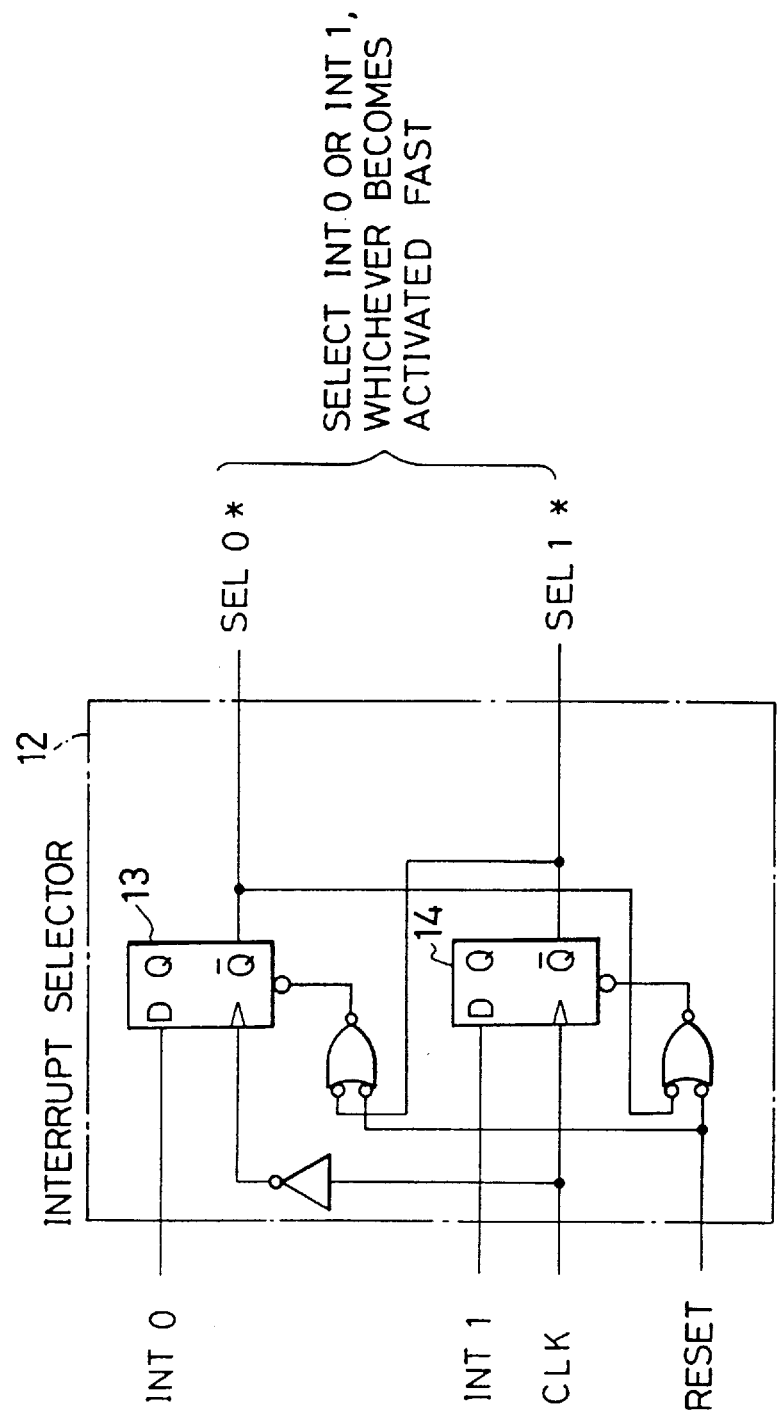

ADDRESS MAPPING AT DATA WRITE

ADDRESS MAPPING AT DATA READ

LUN i BLOCK j ⟶ HDD i BLOCK j IN RAID

LUN i BLOCK j ⟶ HDD i BLOCK (i+1)/n + j IN RAID

LUN i BLOCK j ⟶ HDD j−(j/n)×n
BLOCK (j/n)×n+i IN RAID

LUN i BLOCK j ⟶ HDD j−(j∕(n−1))×(n−1)
             +(n−j)∕(2n−i−1)
         BLOCK (j∕(n−1))
             ×(n−1)+i IN RAID

LUN i BLOCK j ⟶ HDD j − (j/m) × m
            BLOCK (j/m) × n + i IN RAID

LUN i BLOCK j → HDD j - (j/(m-1)) x (m-1)
            +(m-j)/(2m-i-1)
    BLOCK (j/(m-1)) x (n-1) + i IN RAID

FIG. 43

⟨TABLE A⟩
SLAVE 0
[ID0]
TABLE OF
LOGICAL AND PHYSICAL ADDRESS CONVERSION    61a

| LOGICAL ADD. | PHYSICAL ADD. |
|---|---|
| 2f09a | 3c651 |
| 1d46c | 12765 |
| ... | ... |

[ID1]
TABLE OF
LOGICAL AND PHYSICAL ADDRESS CONVERSION    61b

| LOGICAL ADD. | PHYSICAL ADD. |
|---|---|
| 200d0 | 30051 |
| 10422 | 20334 |
| ... | ... |

[ID2]
TABLE OF
LOGICAL AND PHYSICAL ADDRESS CONVERSION    61c

| LOGICAL ADD. | PHYSICAL ADD. |
|---|---|
| 20445 | 30506 |
| 10400 | 4321e |
| ... | ... |

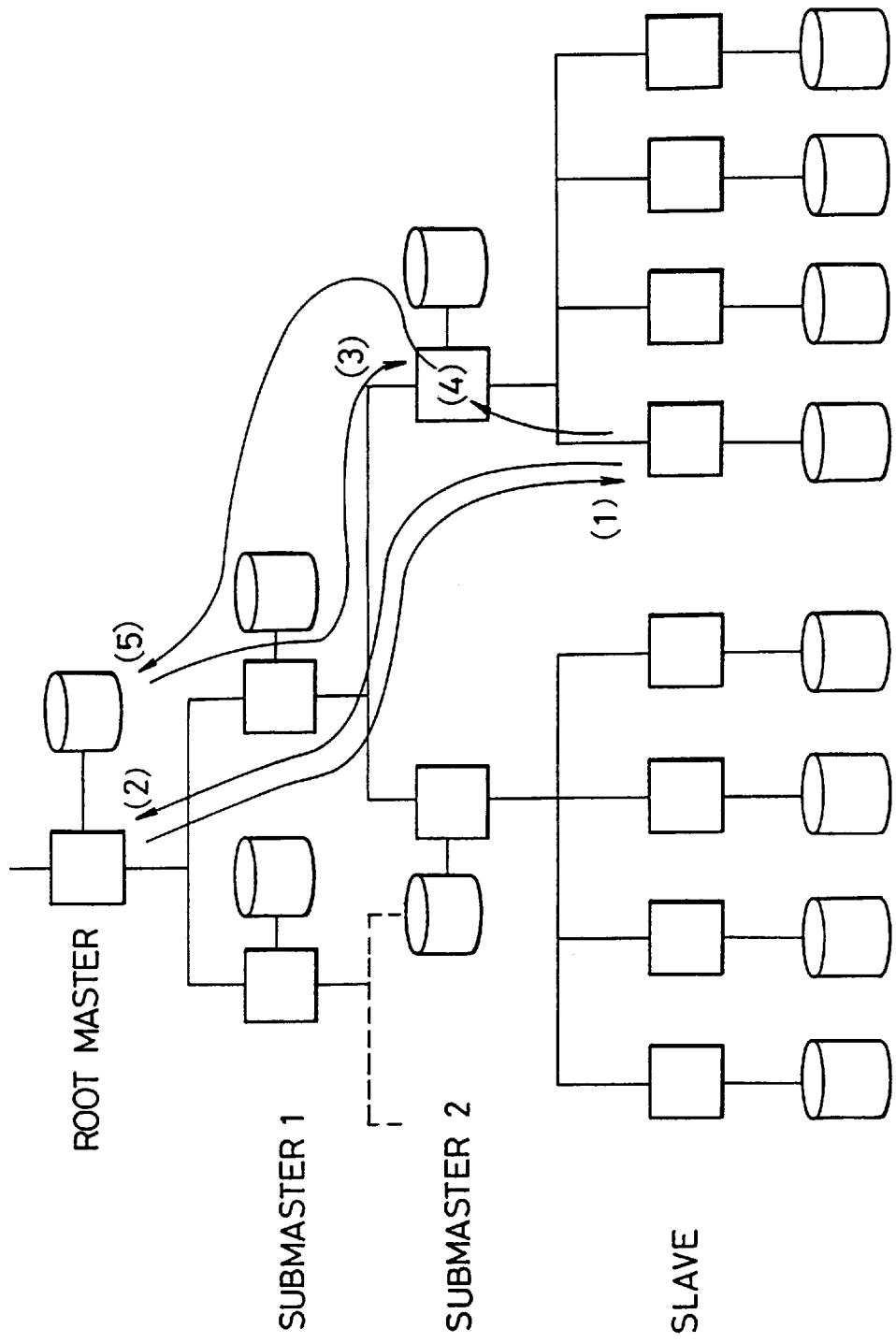
F I G. 47

DISTRIBUTED DATABASE SYSTEM HAVING MASTER AND MEMBER SUB-SYSTEMS CONNECTED THROUGH A NETWORK

This application is a division of application Ser. No. 08/432,508, filed May 1, 1995, entitled DATA ACCESS APPARATUS AND DISTRIBUTED DATA BASE SYSTEM and now pending.

FIELD OF THE INVENTION

This invention relates to a distributed data base system that enables a plurality of data bases to be managed separately under local area network. More particularly, this invention relates to a data access apparatus of a high-speed data access machine.

BACKGROUND OF THE INVENTION

As FIG. 59 illustrates, a conventional data base is configured to store data in each hard disk drive (HDD).

Table A in FIG. 59 consists of four subtables A0 through A3, each of which holds a number of records stored in hard disk drives correspondingly from HDD0 to HDD3. Coupled to a hard disk drive, slave processors 0 though 3 (designated as slave 0 to slave 3 in the drawings), can access subtables held in the hard disk drives.

A processor built in each slave processor enables the slave processor to carry out processing locally.

A master processor (referred to as the master in the drawings) can access Table A by issuing a request to any of the slave processors. The master processor, equipped with its own built-in processor, retrieves data upon request from a host computer and sends the retrieved data to the host computer.

FIG. 60 illustrates a method of retrieving data for the conventional high-speed data access machine. Hard disk drives contain logical and physical address conversion tables, T0 through T3, in addition to subtables A0 to A3. Hard disk drives 0 through 3 store the content of subtables A0 to A3.

The address conversion table, T0 in this example, has logical addresses that indicate the addresses of records in tables and the physical addresses that indicate the addresses on a hard disk drive.

A slave processor reads the logical and physical address conversion table from an HDD and have it reside in its own memory. Then it converts the record address or the logical address in the table requested from the master processor, into an address on a disk, namely physical address. The physical address is used to access an HDD to retrieve data, which is output to the master processor from a slave processor.

After the requested data is retrieved from the slave processor, the master processor performs necessary processing and outputs its result to the host computer.

FIG. 61 shows a conventional distributed data base system in which a client, linked to a local area network, accesses data bases 0 to 3. Data bases 0 through 3 store the content of table A which is divided into four subtables, subtables A0 to A3.

Problems to be solved by this Invention

The biggest problem posed by the conventional distributed data base system is that if a malfunction or a glitch occurs to any of the hard disk drives coupled to the slave processors, the whole system goes down, thus disabling data retrieval.

Moreover, system recovery is time consuming in the event of a malfunction, because data must be reloaded from the host computer into a replaced new HDD.

In addition, rotational delay of an HDD and the seek time taken in accessing data add up to a sizable amount of overhead.

On top of that, a conventional distributed data base system is equipped with only one master processor. It limits the number of slave processors to be coupled in light of the load capacity of the master processor to bear. This is disadvantageous for the increase in the number of slave processors is highly desirable to upgrade parallel processing, thereby achieving more effective and powerful data manipulation. However, in reality, with one master processor, the conventional data access apparatus is unable to accommodate high-speed data manipulation, most notably join processing.

With respect to the distributed data base system presented in FIG. 61, the client would have to access several data bases individually. This increases the load on the part of the client when the client needs to collect data from a plurality of subtables or to perform a joint processing for data from multiple tables.

Furthermore, the function of allocating data to several data bases is entirely rested upon the client, adding another workload of data maintenance to the client.

Accordingly, it is an object of the present invention to achieve high-speed data access by solving the above-mentioned problems. It aims at greater data access capability and higher reliability of the data access apparatus.

Another object of the present invention is to facilitate data recovery in time of system failure in a memory of a data access apparatus.

Another object of this invention is to increase data reliability by creating redundant data in addition to the data distributed in a plurality of hard disk drives.

Also, it is another object of the present invention to upgrade the performance without increasing the number of slave processors.

It is also another object of this invention to reinforce parallel processing capability by adding the number of slave processors without causing any additional load on the master processor.

Another prime object of this invention is to relieve the client from the extra workload of data allocation so as to enable the client to retrieve and maintain distributed data freely.

SUMMARY OF THE INVENTION

It is an object of the present invention to provide a data access apparatus and a distributed data base system which overcome the difficulties associated with the abovementioned prior art techniques, whereby the data access apparatus and the distributed data base system in accordance with the present invention is easy to implement with more powerful and reliable data access capability.

A data access apparatus may include a plurality of memories which store distributed data, a plurality of sub-processors respectively coupled to the plurality of memories, and a main processor, coupled to the plurality of sub-processors, for accessing distributed data stored in the plurality of memories through the plurality of sub-processors.

In the data access apparatus, each of the plurality of memories may include a first memory and a second memory, both of which are coupled to one of the plurality of sub-processor means, and may store duplicated data.

A data access apparatus may include a plurality of memories which store distributed data, a plurality of sub-processors respectively coupled to the plurality of memories, a main processor for accessing distributed data stored in the plurality of memories through the plurality of sub-processors, a redundant memory for storing redundant data of the distributed data stored in the plurality of memories, and a controller coupled to the redundant memory.

The controller may include a redundant data create means and a recover means.

The redundant data create means may create the redundant data and store the redundant data in the redundant memory when the sub-processor writes data of the memories.

The recover means may recover data being stored in a defective memory of the plurality of memories to an alternate memory using the redundant data stored in the redundant memory when one of the plurality of memories is defective and replaced by the alternate memory.

A data access apparatus may include a plurality of memories which store distributed data, a plurality of sub-processors, respectively coupled to the plurality of memories, a main processor for accessing distributed data stored in the plurality of memories through the plurality of sub-processors, a controller, located between the plurality of sub-processor means and the plurality of memories, in which the controller may include means for controlling an access from the sub-processor to the memories, means for creating a redundant data for data being written to the memories from the sub-processor, and means for storing the redundant data to one of the plurality of memories.

A data access apparatus may include a plurality of memories which stores distributed data, a plurality of sub-processors respectively coupled to the plurality of memories, a main processor for accessing distributed data stored in the plurality of memories through the plurality of sub-processor means, and a plurality of memories, coupled to each of the sub-processors, including divisional store means for dividing data and storing the divided data to the plurality of memories.

A data access apparatus may include a plurality of memories which store distributed data, a plurality of sub-processors respectively coupled to the plurality of memories, and a main processor for accessing distributed data stored in the plurality of memories through the plurality of sub-processors.

The main processor include a parent main processor and a plurality of child main processors, in which each of the child main processor means is coupled to the parent main processor and is coupled to each of the plurality of sub-processors.

A distributed data base system may include an access apparatus for accessing distributed data, a plurality of sub-system for storing the distributed data accessed by the access apparatus, and a network for coupling the access apparatus to the plurality of sub-systems.

The plurality of sub-systems includes a manager sub-system and a plurality of member sub-systems.

The manager sub-system may include means for receiving an access request from the access apparatus, means for outputting processing requests to the sub-systems, means for receiving responses from the sub-systems, and means for sending a response to the access apparatus.

Each of the member sub-systems may include means for receiving the processing request from the manager sub-system, means for performing a necessary data processing, and means for returning a response of the data processing to the manager sub-system.

A data access method is for a high-speed data access machine which have a main processor, sub-processors, and memories. Each of the memories may have a first and a second memories for storing duplicated data. The method may include the steps of writing data to both of the first and the second memories, and reading data from one of the first and the second memories.

A data access method is for a high-speed data access machine which have a main processor, sub-processors and memories, in which each of the memories has a first and a second memories for storing duplicated data. The method may include the steps of writing data to both of the first and the second memories, and reading data from one of the first and the second memories.

A data access method is for a high-speed data access machine which have a main processor, sub-processors, and memories. The high-speed data access machine may further have a RAID controller and a redundant memory. The method may include the steps of loading loaded data into the memories, and creating redundant data corresponding to the loaded data with the RAID controller and storing the redundant data to the redundant memory, updating data in the memories, updating the redundant data stored in the redundant memory with the RAID controller, determining that data in one of the memories is defective, and recovering data in the memories with the redundant data with the RAID controller when data in one of the memories is defective.

A data access method is for a high-speed data access machine which have a main processor, sub-processors, and memories. Each of the sub-processors is coupled to a plurality of memories. The method may include the steps of requesting data access from the main processor to the sub-processors, identifying data in the memories relating to the access request with an address convention table provided in each of the sub-processors, accessing data in the memories identified by the address conversion table from each of the sub-processors.

A data access method is for a high-speed data access machine which have a main processor, sub-processors and memories.

The main processor has a plurality of layered main processors which is organized in a tree structure having at least a top layer and a bottom layer. The method may include the steps of sending a request from the top layer or main processor to the bottom layer of main processors, accessing data in the memories by the sub-processors based on the request from the bottom layer of main processors, sending responses from the bottom layer of main processors to the top layer of main processor and joining responses from a lower layer of the main processors for the upper layer of the main processor.

A data access method is for distributed data base which have an access apparatus, a manager sub-system and a plurality of member sub-systems. The access apparatus, the manager sub-system and the plurality of member sub-systems are coupled by a network. The method may include the steps of requesting a data access from the access apparatus to the network, in which the data access corresponds to a related member sub-system of the plurality of member sub-systems, receiving the data access request through the network with the manager sub-system, distributing the data access request to the related member sub-system from the manager sub-system, and receiving and processing the request with the related member sub-system.

BRIEF DESCRIPTION OF THE DRAWINGS

Other objects features and advantages of the invention will be apparent from the following description when taken in conjunction with the accompanying drawings.

In the drawings,

FIGS. 5A to 5C give the methods of computing access time of two mirrored HDDs according to an embodiment of the present invention;

FIG. 13 is a circuit diagram of a chip selector for the hardware mirrored configuration in accordance with an embodiment of the present invention;

FIG. 14 is a circuit diagram of an interrupt selector for the hardware mirrored configuration in accordance with an embodiment of the present invention;

FIG. 43 presents tables of logical and physical address conversion;

FIG. 47 depicts join processing under the hierarchy of system configuration;

DESCRIPTION OF THE PREFERRED EMBODIMENTS

Embodiment 1

Figure 1:
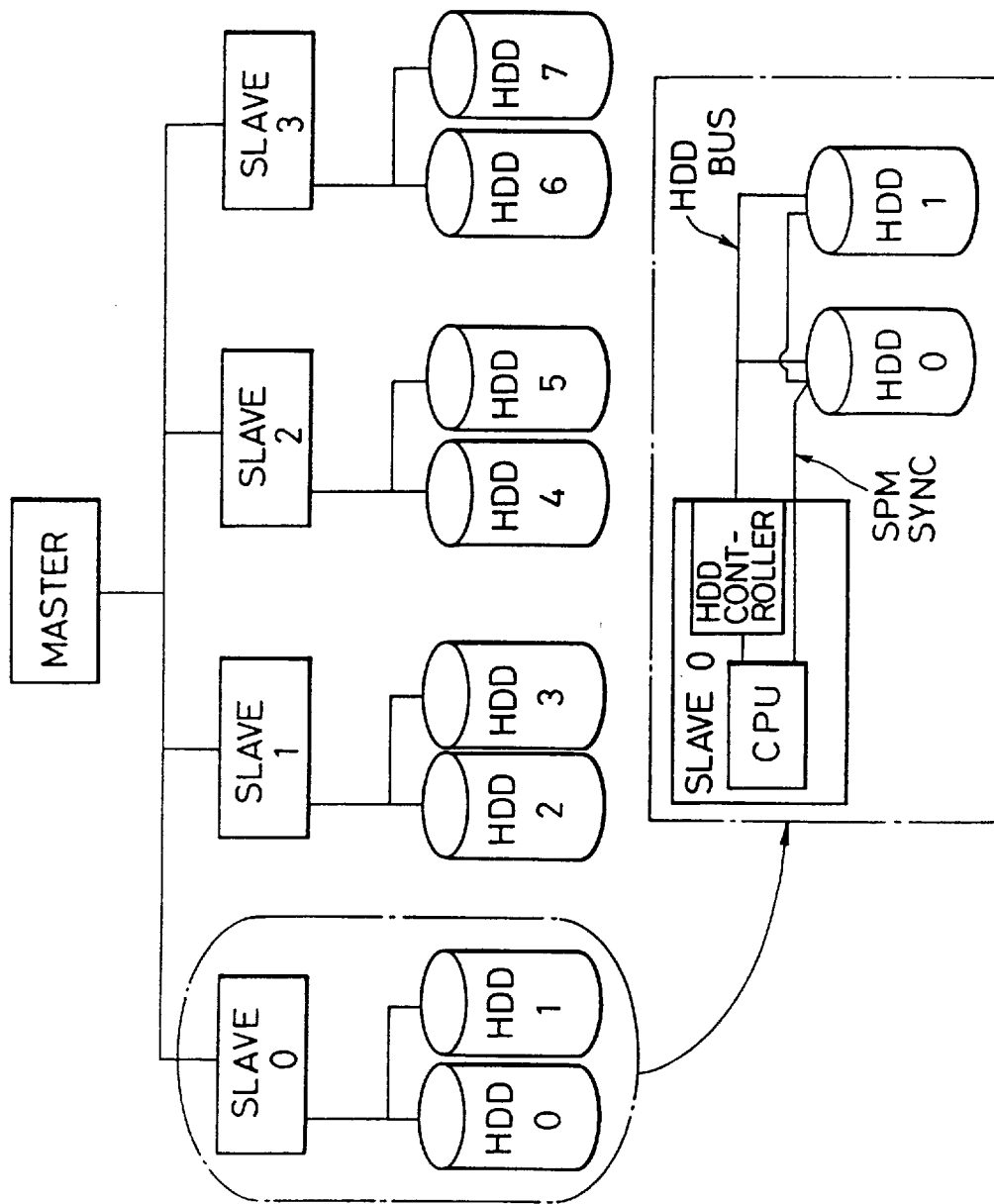
FIG. 1 shows the configuration of a high-speed data access machine in accordance with one embodiment of the present invention.

FIG. 1 represents the configuration of a high-speed access machine of a data access apparatus in accordance with embodiment 1 of the present invention. An improvement of the present invention that marks a significant departure from conventional high-speed access machines is that each slave processor is provided with a plurality of hard disk drives (HDDs) holding duplicated data.

For example, slave processor 0 is provided with two hard disk drives: HDD0 and HDD1. HDD0 and HDD1 are coupled in serial to an HDD controller incorporated in the slave processor 0 via an HDD bus.

The CPU of slave processor 0 outputs a synchronous signal of synchronous rotation (SPM sync) to both HDD0 and HDD1. The synchronous signal may synchronize, for example a spindle motor of HDD0 and that of HDD1. This embodiment is advantageous in that the two HDDs are mirrored by software.

The high-speed data access machine of Embodiment 1 has HDDs holding exactly the same data. That is, one HDD controller duplicates data in two HDDs under software control. Because there is only one HDD controller, a write command must be issued to two HDDs in the program.

To have mirrored HDDs indicates that the same data be written twice into two HDDs. However, data can be read from either of the HDDs. One of the two HDDs is set to rotate ahead of the other by half-a-turn phase difference, enabling the data to be read from the HDD whose rotating track is closer to the data to be accessed. This synchronization with half-a-turn phase difference can be achieved by referencing the synchronous signal. If HDD0 is set to rotate in the same phase with the synchronous signal, then HDD1 is set to rotate in a phase of half-a-turn phase difference from the synchronous signal.

Figure 2:
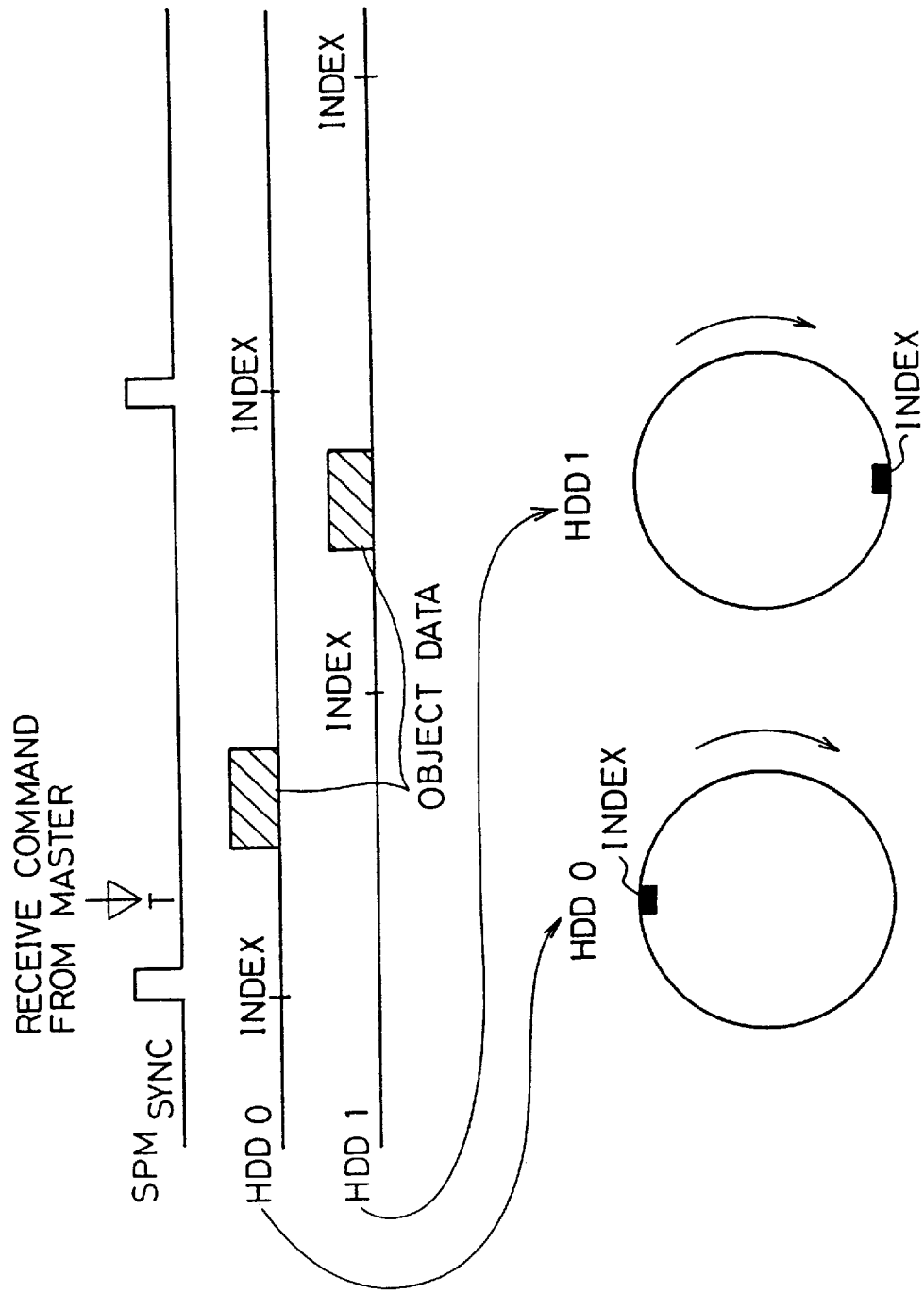
FIG. 2 shows the operation of two mirrored HDDs containing duplicated data in accordance with an embodiment of the present invention.

FIG. 2 shows a concrete example of HDD operation in conjunction with a command issued from the master processor under the system configuration thus far explained. When the pulse of a synchronous signal starts to rise, HDD0 detects the index mark. On the other hand, HDD1 detects the index mark at the midpoint of the synchronous signals. Upon receiving a read command from the master processor, a slave processor computes the current position of two rotating HDDs in order to access the object data. The fact that the CPU of the slave processor outputs synchronous signals makes it possible for the slave processor to obtain the current positions of the two rotating HDDs. The read command is sent to whichever HDD is positioned closer to the object data.

In FIG. 2, a read command, received at time T, is output either to HDD0 or HDD1. Since, as shown in FIG. 2, it is obvious that the data to be accessed is located closer in HDD0 than in HDD1, the read command is sent to HDD0.

Sending a read command to one of the HDDs that is positioned closer to the data in demand logically halves access time from what would have conventionally been required.

Figure 3:
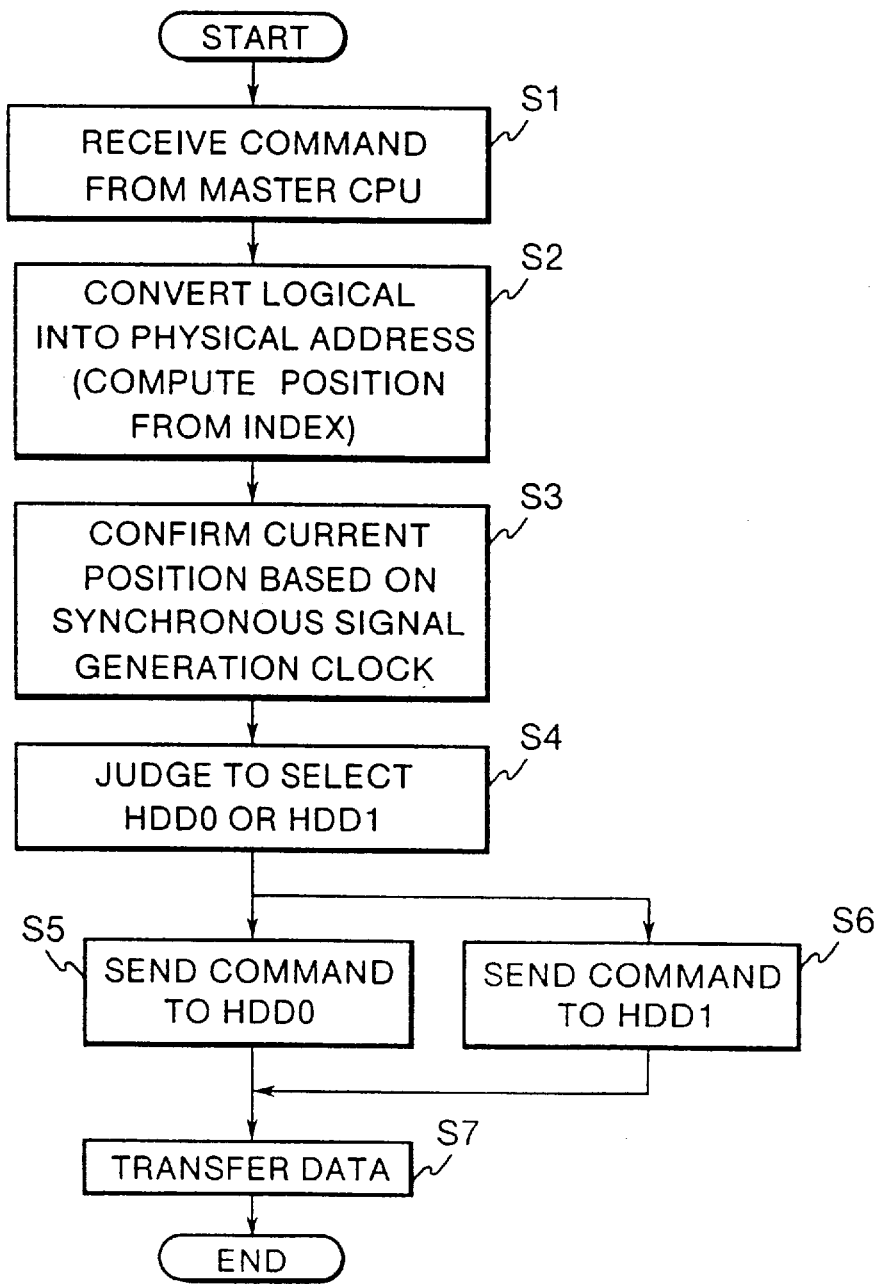
FIG. 3 is an operational flowchart for two mirrored HDDs containing duplicated data.

FIG. 3 is an operational flowchart of a slave processor.

At Step 1 (S1), a slave processor receives a read command from the master processor. At S2, the logical address of the record specified in the read command is then converted into the physical address of the disk at which the data is stored. The physical address is represented in the combination of sector number, track number, cylinder number, and so on. The distance of the physical address from the index determines which HDD the read command should be sent to.

Then at S3, using the clock value for generating synchronous signals, the current position of the disk head is confirmed. In particular, the distance between the head and this index may be calculated based on the clock value.

The physical address obtained at S2 and the current head position calculated at S3 are compared at S4 to determine which HDD to send the read command. At S5 or S6, the read command is sent.

At S7, the HDD sends out the data requested in the read command to the slave processor.

This embodiment realizes a highly cost-effective and reliable high-speed data access machine without requiring any additional hardware. Moreover, the rotational delay at data access is logically halved by setting HDDs to rotate in the phase of half-a-turn time difference from the other.

Embodiment 2

Referring now to FIGS. 4A, 4B, 5A, 5B, and 5C, the method of achieving higher access capability will be discussed by reducing rotational delay and seek time of the head.

As previously described in Embodiment 1, to send a read command to one of the two duplicated HDDs involves two different phases with which the HDDs are set to rotate. This means that the heads of two HDDs are to be found in different positions at a certain particular moment. This physical positioning of the heads is stored in the memory table of the slave processor shown in FIG. 4A and used to calculate the seek time.

Figures 4A, 4B:
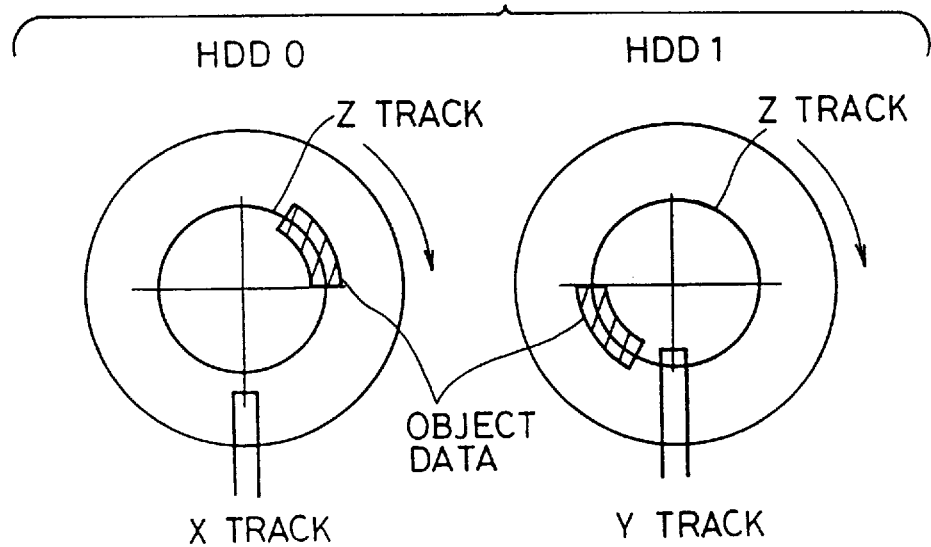
FIGS. 4A and 4B describe the location of object data and head position of two mirrored HDDs containing duplicated data.

FIG. 4B shows that HDD0 and HDD1 are synchronously rotating in half-a-turn time difference. Assuming that the head of HDD0 is on track X and that of HDD1 on track Y, data on track Z is to be accessed.

As shown in FIG. 5A, access time is the sum of rotational delay, seek time, and transfer time. Rotational delay indicates the rotation time taken to reach the object data from the current head position. Seek time is the time taken to reach the track containing the object data from the current head position. Meanwhile, transfer time is the value expressed with "transfer speed" X "data amount to be transmitted".

Referring to the example in FIG. 4B, the rotational delay for the object data for HDD0 is one fourth while that for HDD1 is three fourths because the object data in HDD0 is located one-fourth turn away from the current head position and the object data in HDD1 is located three-fourths turn away from its current head position. The seek time for HDD0 is the time taken for its head to move from track X to track Z. The seek time for HDD1 is, in the same manner, the time taken for its head to reach from track Y to track Z. The transfer time for HDD0 and HDD1 is equal given the same transfer speed and the amount of data. Thus, the access time of HDD0 is obtained by equation shown in FIG. 5B and the access time of HDD1 is obtained by equation given in FIG. 5C.

By comparing the access time needed to reach the object data in two HDDs, the read command will be sent out to the HDD having shorter access time.

The head position of each disk retained in the memory of the slave processors enables selection of a HDD with shorter access time including the seek time.

Figures 6, 7:
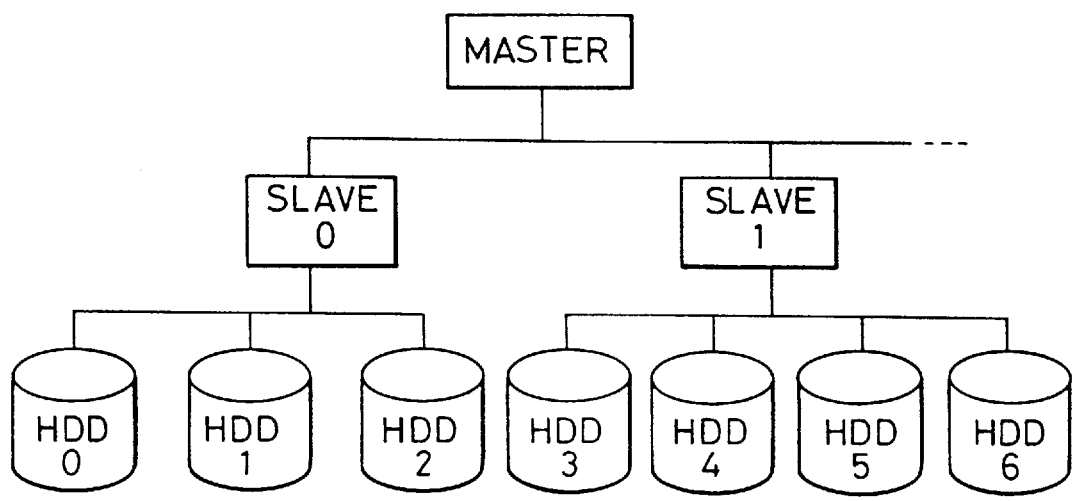
FIG. 6 is another method of obtaining access time of two mirrored HDDs in accordance with an embodiment of the present invention.
FIG. 7 illustrates another way of system configuration of two mirrored HDDs in accordance with an embodiment of the present invention.

Although data access in this example is viewed as the total of rotational delay, seek time, and transfer time, it is possible to construe the rotational delay and seek time as a simultaneous operation. In such a case, access time is obtained by the greater of either rotational delay or seek time plus transfer time as shown in FIG. 6. This equation is also highly effective in selecting the HDD with shorter access time without disregarding the seek time as heretofore explained.

Embodiment 3

FIG. 7 illustrates an improved version modelled on Embodiment 2 by increasing the number of HDDs to be coupled to a slave processor. In the example shown in FIG. 7, slave processor 0 has three HDDs while slave processor 1 has four.

The increase in the number of HDDs helps produce higher reliability. It also reduces access time because each HDD is set to rotate in different phases. In coupling three HDDs, they may be set to synchronously rotate by one-third a turn time difference from one another, and in coupling four HDDs, they may be set to synchronously rotate by one-fourth a turn time difference. Of course, additional HDDs may also be included.

Embodiment 4

Figure 8:
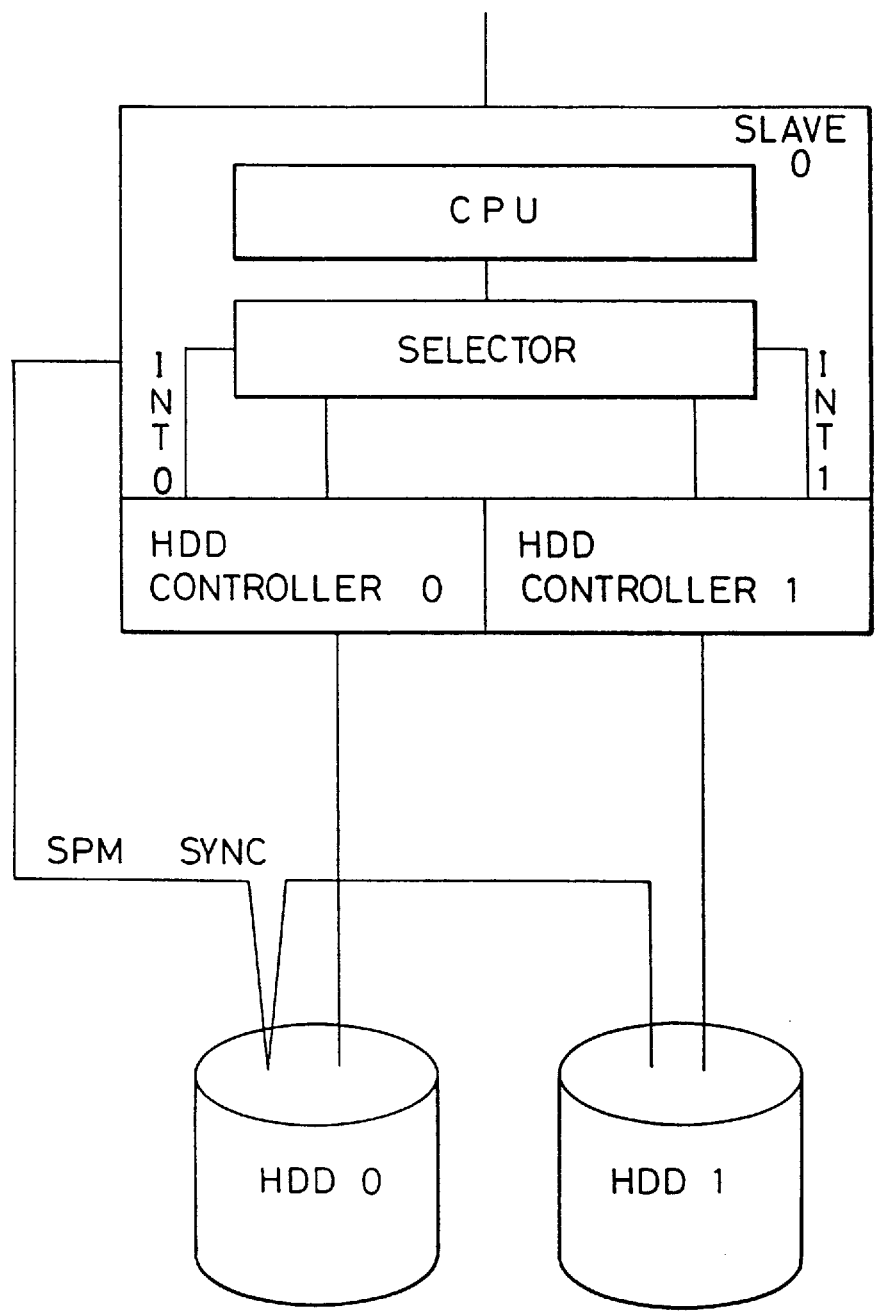
FIG. 8 shows the hardware mirrored configuration in accordance with an embodiment of the present invention.

FIG. 8 depicts another example of configuring a slave processor and HDDs in accordance with the data access apparatus of the present invention.

In this embodiment, each HDD has its own controller. Also, a selector is provided to transmit commands from the CPU to HDD controllers and vice versa. The CPU regards two or more HDD controllers as a single controller despite its plurality because of this selector. The selector not only transmits the data but also selects one HDD controller and sends its data to the CPU.

In writing data, a write command is issued to two HDD controllers, resulting in writing the same data in two mirrored HDDs. This embodiment is advantageous in that the two HDDs are mirrored by hardware.

When there are two HDDs, the slave processor outputs a synchronous signal to the HDDs to rotate them synchronously by half-a-turn time difference. Additional HDDs may be included and synchronized as described in embodiment 3.

The two controllers are accessed from the CPU using the same address. Because the two controllers have the same address, the CPU regards the two controllers as one controller. In reading data from an HDD, the selector selects one of the HDDs using an interrupt signal output from the HDD controllers.

Figure 9:
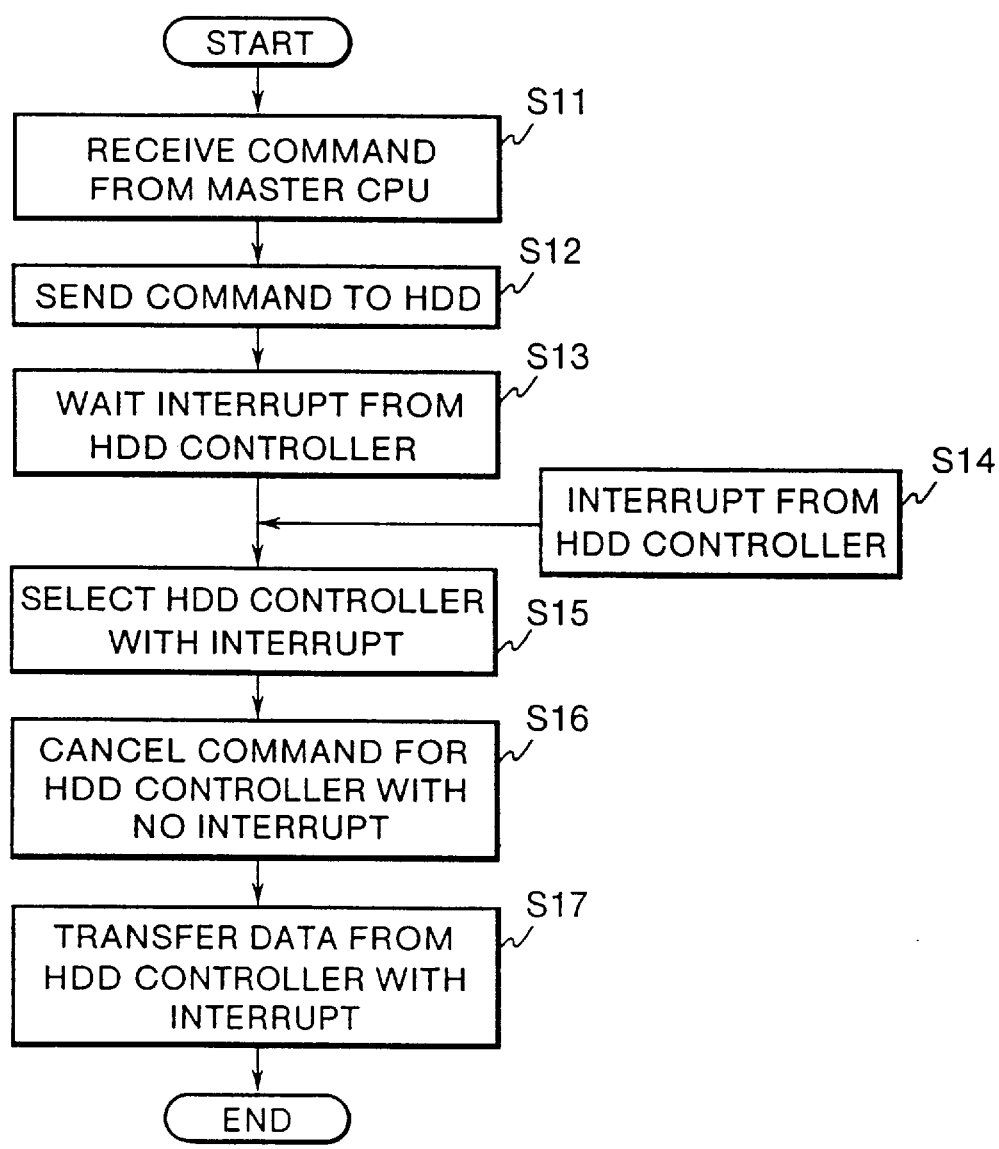
FIG. 9 is an operational flowchart for the hardware, mirrored configuration of the data access apparatus in accordance with an embodiment of the present invention.

Referring now to FIG. 9, the operational flow of a slave processor is described below.

At S11, a slave processor receives a command from the CPU of the master processor. At S12, the slave processor sends the command to the HDDs.

Figure 10:
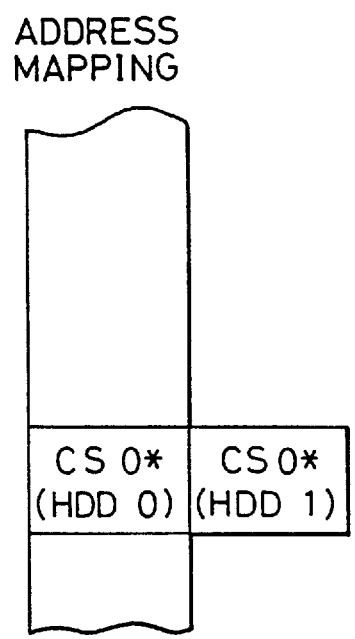
FIG. 10 indicates an address mapping for the hardware mirrored configuration of the data access apparatus in accordance with an embodiment of the present invention.

The address with which to access the HDD controllers is the same for both HDD controller 0 and HDD controller 1 as shown in FIG. 10. Thus at S12, the command is issued only once to the address. Upon receiving the command, two HDD controllers start to operate.

Then at S13, the CPU of the slave processor waits for an interrupt from one of the HDD controllers. At S14, either HDD0 or HDD1 generates an interrupt signal at the termination of command processing, which is then sent back to the CPU of the slave processor.

At S15, the selector selects the HDD controller that generated the interrupt signal. Then at S16, the command is canceled for the HDD controller that does not come up with an interrupt signal. Then, at S17, data is sent from the HDD controller with the interrupt signal.

Figure 11:
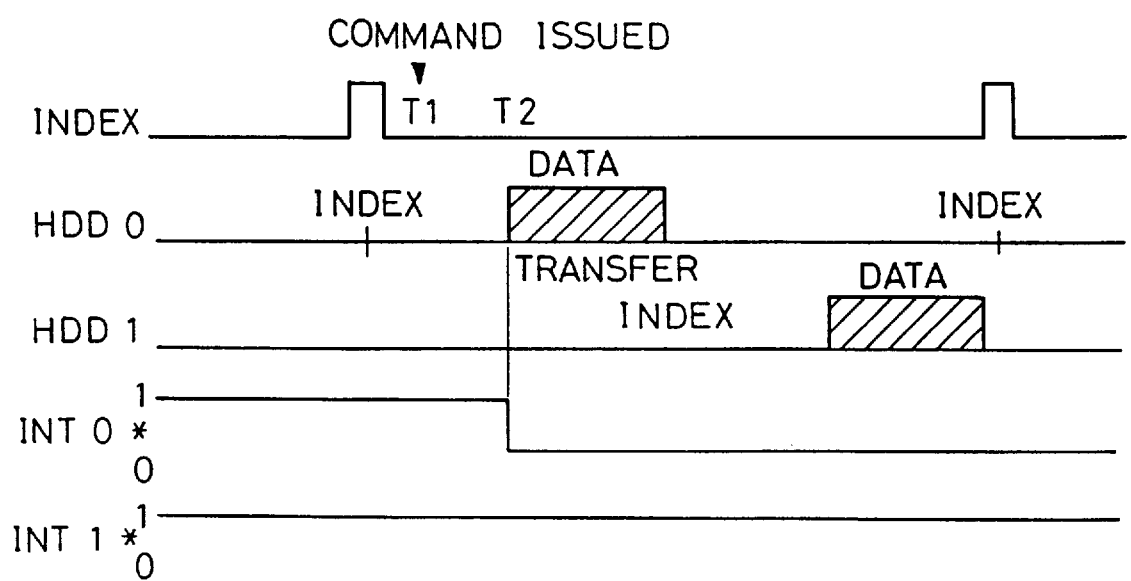
FIG. 11 illustrates the operation for the hardware mirrored configuration of a data access apparatus in accordance with an embodiment of the present invention.

The timing chart that elucidates the above operation is given in FIG. 11. A command is issued at T1. An interrupt signal is received at T2 from HDD0.

The selector detects the interrupt was made from HDD controller 0 and let data from HDD0 transfer. Meanwhile, the selector outputs a cancel of data transmission to HDD controller 1 to prohibit the HDD1 data from getting transmitted.

Figure 12:
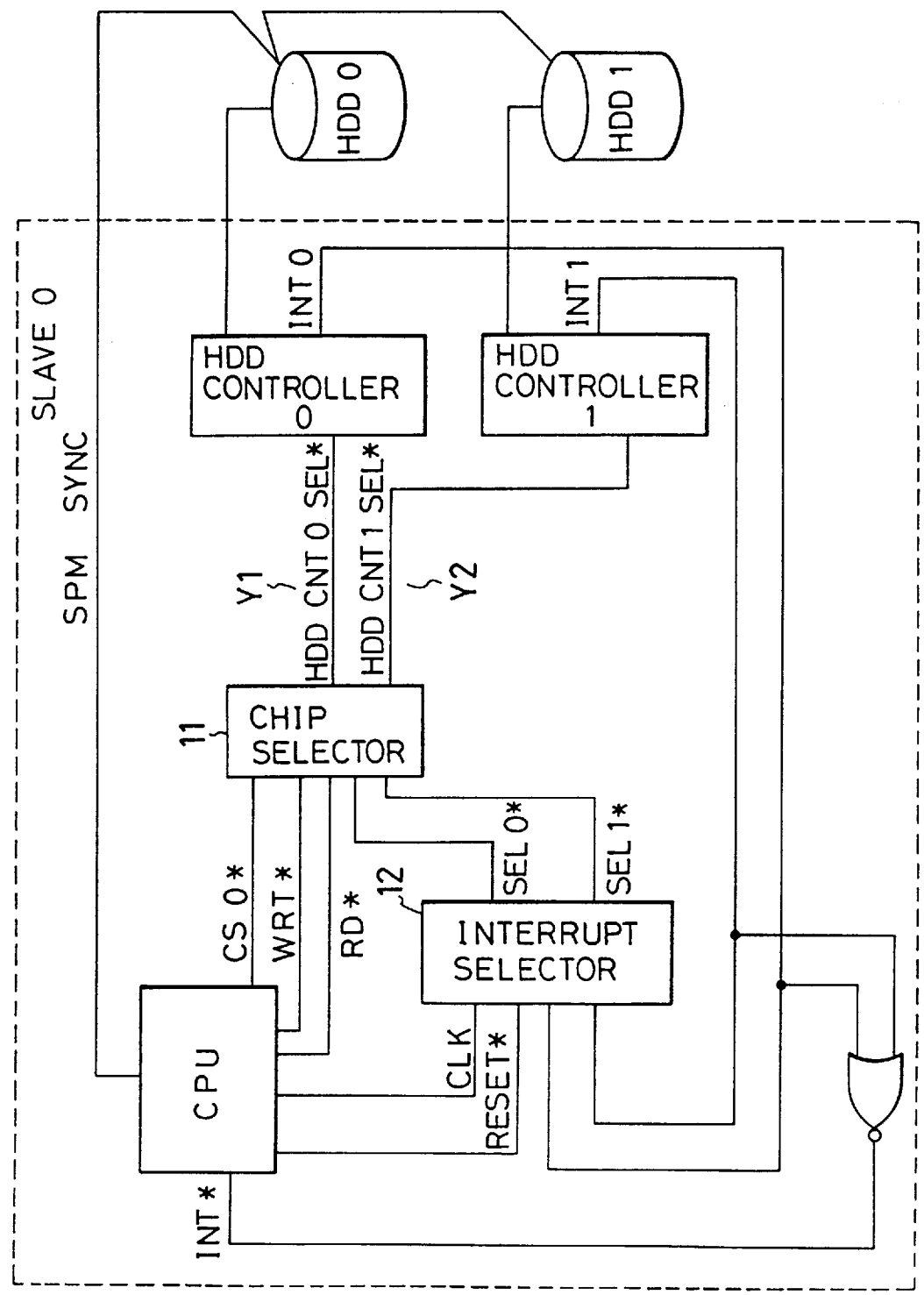
FIG. 12 is a block diagram of a slave processor for the hardware mirrored configuration in accordance with an embodiment of the present invention.

FIG. 12 is a block diagram of the slave processor. The selector consists of a chip selector 11 and an interrupt selector 12. The circuit diagrams of chip selector 11 and interrupt selector 12 are illustrated in FIG. 13 and FIG. 14, respectively.

When the CPU activates a chip select signal CS0, chip selector 11 activates an HDD controller 0 select signal Y1 and an HDD controller 1 select signal Y2 to select either HDD controller 0 or HDD controller 1.

As indicated in FIG. 13, HDD controller 0 select signal Y1 is activated if chip select signal CS0 and write signal WRT are activated, or when select signal SEL0 from the interrupt selector for selecting HDD0 is active as well as chip select signal CS0 and read signal RD are active.

On the other hand, HDD controller 1 select signal Y2 becomes activated when chip select signal CS0 and write signal WRT are active, or when select signal SEL1 from interrupt selector 12 becomes activated to select HDD1 as well as chip select signal CS0 and read signal RD are activated.

When a write command is issued from the CPU, chip selector 11 sends both select signal Y1 to HDD controller 0 and select signal Y2 to HDD controller 1.

However, when a read command is issued, chip selector 11 sends a select signal to one of the two HDD controllers based on the select signal output from interrupt selector 12.

FIG. 14 describes interrupt selector 12. From HDD controller 0 and HDD controller 1, interrupt signal 0 and interrupt signal 1 are output to the interrupt selector. Input interrupt signals are held in flip-flop 13 and flip-flop 14. When one of the interrupt signals is retained in one flip-flop, a-reset signal is output to another flip-flop. A flip-flop that retains an interrupt signal ahead of the other flip-flop is entitled to hold the signal. Flip-flop 13, upon holding interrupt signal 0, outputs the select signal SEL0 for selecting HDD0 to chip selector 11. When flip-flop 14 holds interrupt signal 1, it outputs the select signal SEL1 for selecting HDD1 to chip selector 11. Interrupt selector 12 informs chip selector 11 of an interrupt signal that has become active ahead of the other.

When interrupt selector 12 detects an interrupt from one of the HDD controllers, the interrupt selector outputs a signal to select the HDD controller that made the interrupt ahead of the other. Thus, data is to be read from an HDD that makes an interrupt ahead of the other HDD.

When one of the interrupt signals is held in one flip-flop, the other interrupt signal of the other flip-flop will not be set. Thus the HDD controller that outputs an interrupt signal behind the other will not be selected, leaving the interrupt signal ignored. If the read command is not canceled, two HDDs perform the same operation and one of them is just ignored. However, it may be advantageous to cancel the read command for it can curtail unnecessary operation by the other HDD.

Mirrored HDDs coupled to slave processors render data highly reliable. By setting HDDs to rotate in different time phases, rotational delay can be logically halved.

The HDD, controller provided for each HDD allows any command to be issued simultaneously to the HDDs, eliminating software overhead for writing twice to serially coupled HDDs by means of a single bus.

Typically, when data is duplicated in multiple HDDs coupled via one bus, data is written twice, first in HDD0 and then in HDD1. This embodiment aims at overcoming this software overhead problem caused by writing twice through the application of a plurality of HDD controllers that can be operated simultaneously with one command.

Embodiment 5

Figure 15A:
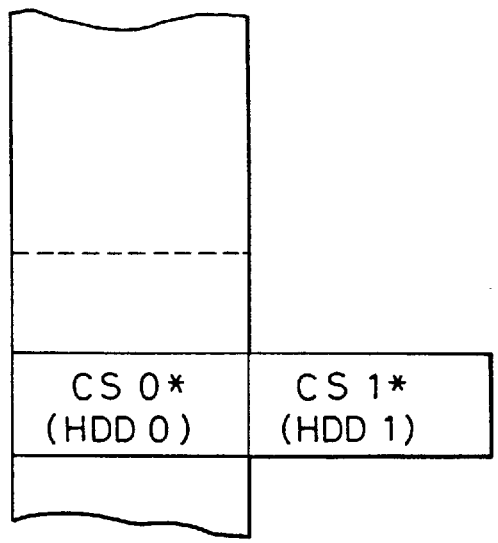
FIGS. 15A and 15B show the address mapping for reading and writing data for the hardware mirrored configuration in accordance with an embodiment of present invention.
Figure 15B:
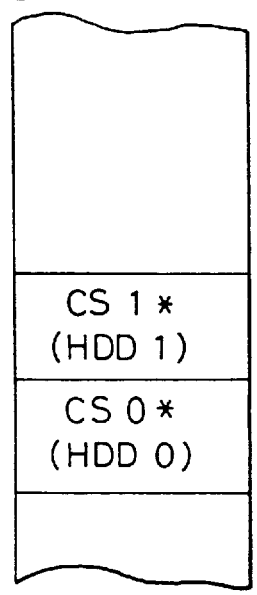

FIGS. 15A and 15B depict another example of data duplication in a plurality of HDDs. Unlike the previous embodiment, in which data write and data read are conducted using the same address in two HDD controllers, this embodiment sets forth to use different addresses for data write and data read.

To write data in two or more HDDs, HDD controllers having the same address may be advantageous as shown in FIG. 15A. For data read, however, HDD controllers are accessed with different addresses since data can be read from one of the two HDDs as in FIG. 15B.

In this way, the CPU can perform data transfer by specifying one of the two HDDs. The differences in addresses at data write from data read can be realized easily by changing circuitry.

Embodiment 6

With reference now to FIGS. 16 through 23, an example of a high-speed data access machine of the data access apparatus of the present invention will be discussed.

Figure 16:
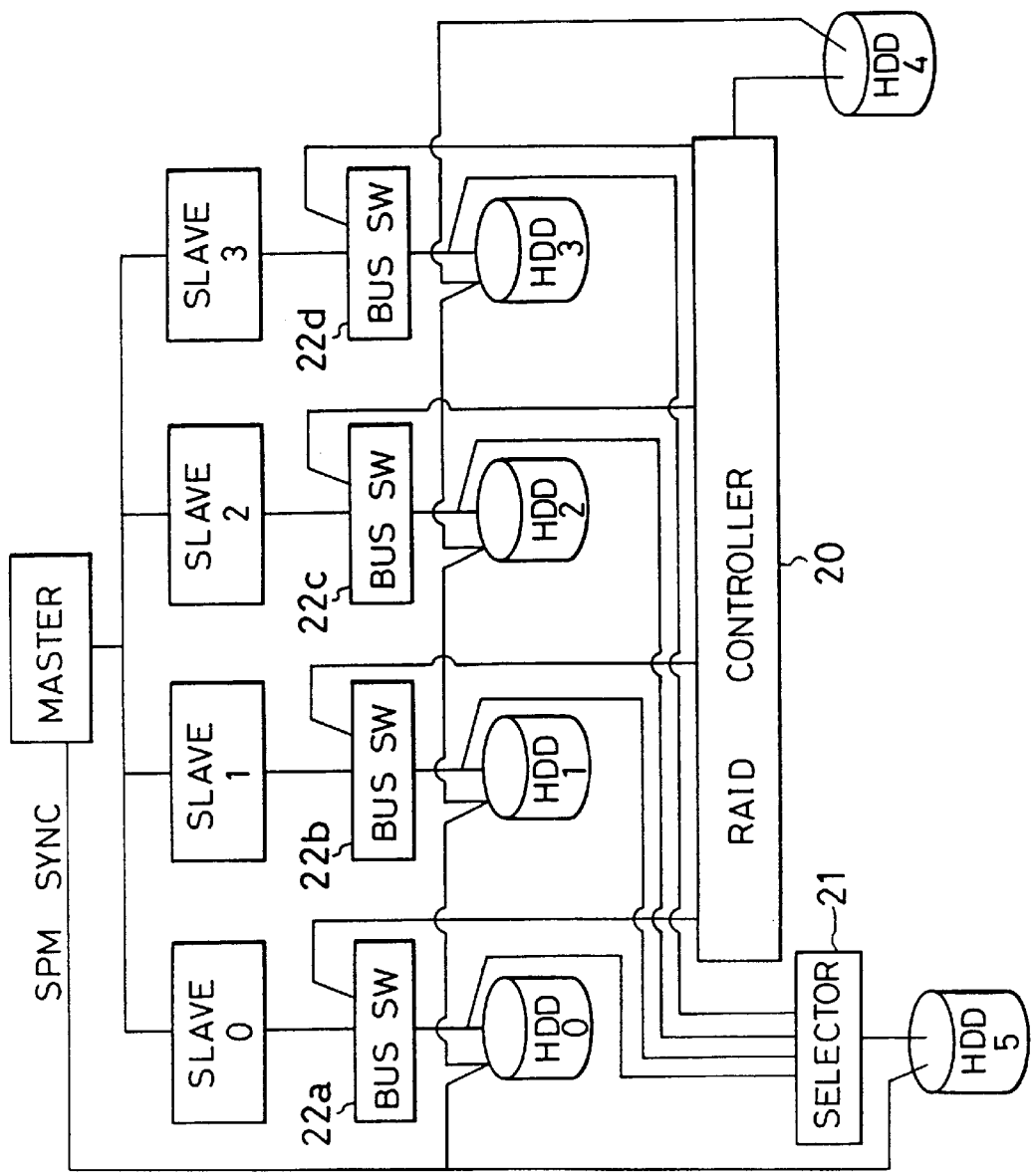
FIG. 16 lays out the high-speed data access machine equipped with the RAID controller in accordance with an embodiment of the present invention.

FIG. 16 gives the general description of the high-speed data access machine. It is characterized by bus switches 22a to 22d provided between the slave processors and the corresponding HDDs. The bus switches are coupled not only to the slave processors and the HDDs but also to Redundant Arrays of Inexpensive Disks (RAID) controller 20. The RAID controller is further coupled to HDD4 which stores parity data or redundant data of HDD0 to HDD3. In addition, HDD5, which is coupled between the bus switches and HDDs via selector 21, may work as a backup disk if a failure should occur to any of HDDs.

In loading data into HDD0 to HDD3, RAID controller 20 enables the system configuration of what might be termed as the RAID level 4. The RAID level 4 system refers to the system of having one additional parity disk in which the parity data of all other disks is stored. If a failure has occurred in a disk, the data in the disk is recovered using the parity in HDD4. Meanwhile, HDD5, a hot standby disk, automatically takes the place of the failed disk via selector 21.

Figure 17:
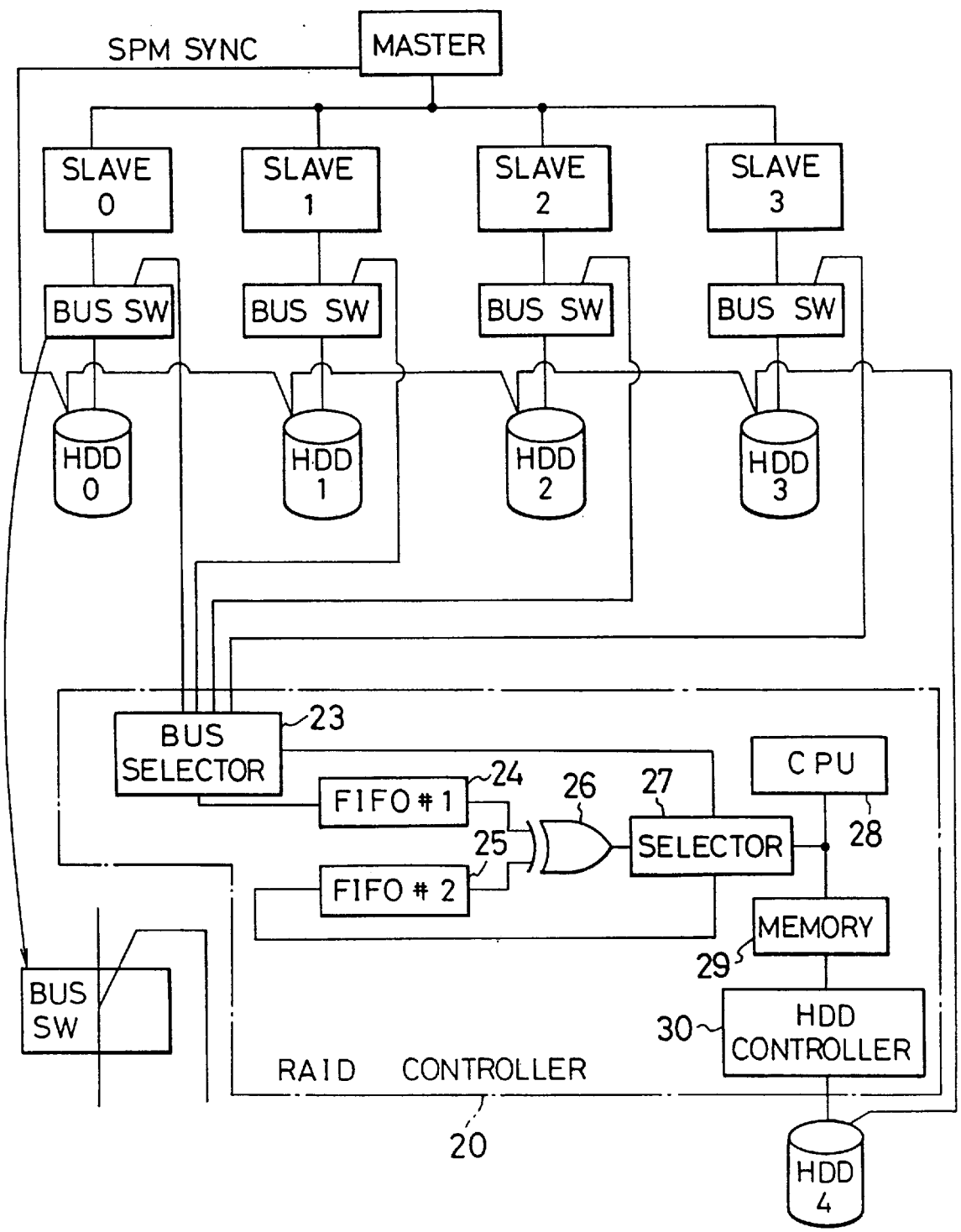
FIG. 17 is a block diagram of the RAID controller in accordance with an embodiment of the present invention.

FIG. 17 shows the details of RAID controller 20. RAID controller 20 contains bus selector 23, FIFO#1 24, FIFO#2 25, EXCLUSIVE-OR (XOR) circuit 26, selector 27, CPU 28, memory 29, and HDD controller 30.

The RAID controller performs four major operations: it loads data into HDDs, reads data from HDDs, updates and recovers data.

Figure 18:
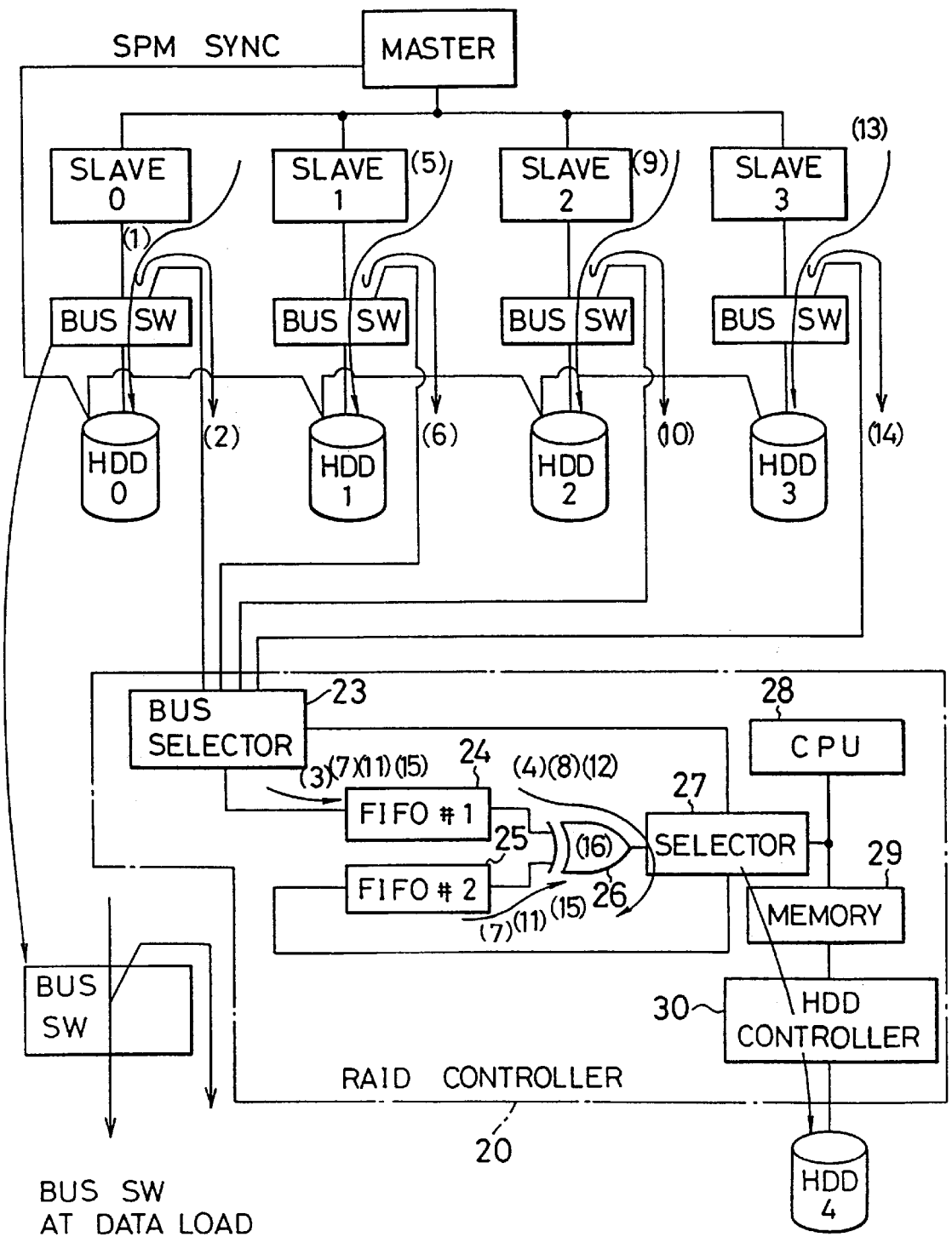
FIG. 18 depicts operations of the RAID controller.

First, data loading is described following arrows shown in FIG. 18.

When data is to be loaded into HDDs, the bus switches couple the slave processors to the HDDs and to RAID controller 20 at the same time. Data from the slave processor is output to HDDs and to RAID controller 20 simultaneously. The procedure of writing redundant data to HDD4 by taking exclusive-OR with data written to HDD0 through HDD3 is explained below, with reference to the numbered arrows.

1 Data is loaded from slave 0 into HDD0.

2 Data is simultaneously sent to RAID controller 20 via an HDD0 bus by the bus switch.

3 Bus selector 23 selects the HDD0 bus to write data in FIFO#1.

4 After the data written into FIFO#1 is XORed with the 00 data that has been stored in FIFO#2 as a preset, the result is again stored in FIFO#2 by selector 27.

5 Data is loaded from slave 1 into HDD1.

6 The data is simultaneously loaded into RAID controller 20 via an HDD1 bus by the bus switch.

7 Bus selector 23 selects the HDD1 bus to write data into FIFO#1.

8 The data in FIFO#1 and FIFO#2 are XORed, and the result is again stored in FIFO#2.

9 Data is loaded from slave 2 into HDD2.

10 The data is simultaneously loaded into RAID controller 20 via an HDD2 bus by the bus switch.

11 Bus selector 23 selects the HDD2 bus to write data into FIFO#1.

12 The data in FIFO#1 and FIFO#2 is XORed, and the result is again stored in FIFO#2.

13 Data is loaded from slave 3 into HDD3.

14 The data is simultaneously loaded into RAID controller 20 via an HDD3 bus by the bus switch.

15 Bus selector 23 selects the HDD3 bus to write data into FIFO#1.

16 The data in FIFO#1 and FIFO#2 is XORed, and the result is written in HDD4 by selector 27.

Thus parity data from HDD0 through HDD3 is created in HDD4. After data has been loaded into HDDs, data addition may be performed. Data addition can also be carried out in the same procedure.

Figure 19:
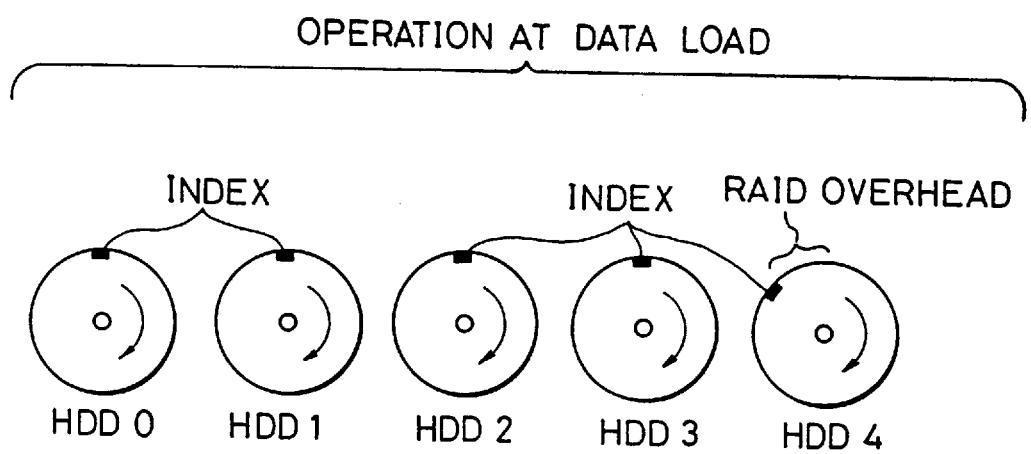
FIG. 19 shows positions of rotating HDDs at data loading with the RAID function in accordance with an embodiment of the present invention.

As shown in FIG. 19, while data is being loaded into HDDs, HDD0, HDD1, HDD2, and HDD3, those disks rotate synchronously while HDD4 rotates behind those HDDs due to the overhead time taken by RAID controller 20. RAID controller 20, therefore, can write parity data into HDD4 immediately, without having any rotational delay.

Figure 20:
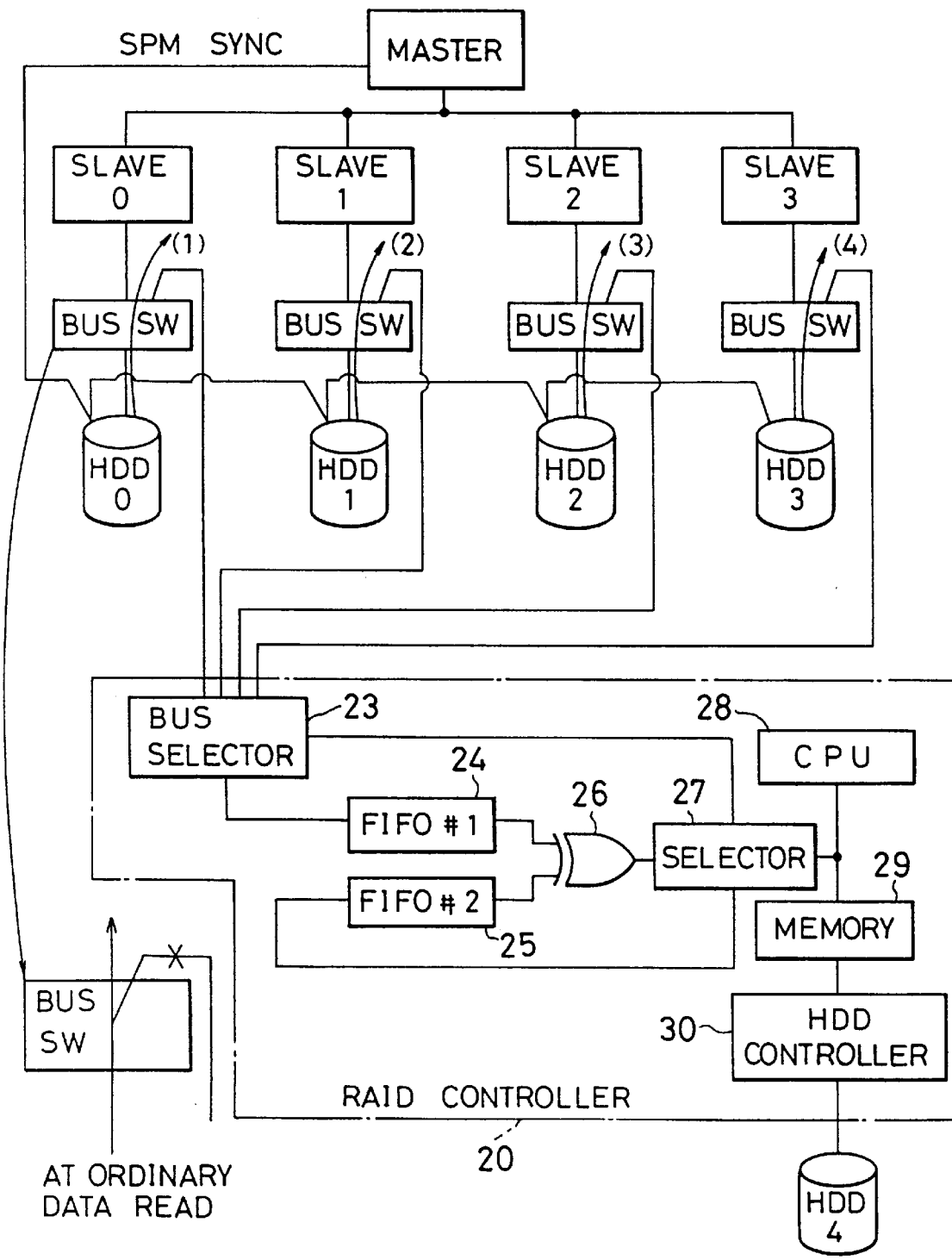
FIG. 20 depicts operations at data reading with the RAID controller in accordance with an embodiment of the present invention.

Next, an ordinary data read operation is explained with FIG. 20. At an ordinary data read, the bus switches couple the slave processors to the HDDs but decouple them from the RAID controller just as the read operation explained before.

In an ordinary data read, HDDs are accessed separately from the slave processors because there is no need for HDDs to rotate synchronously.

Figure 21:
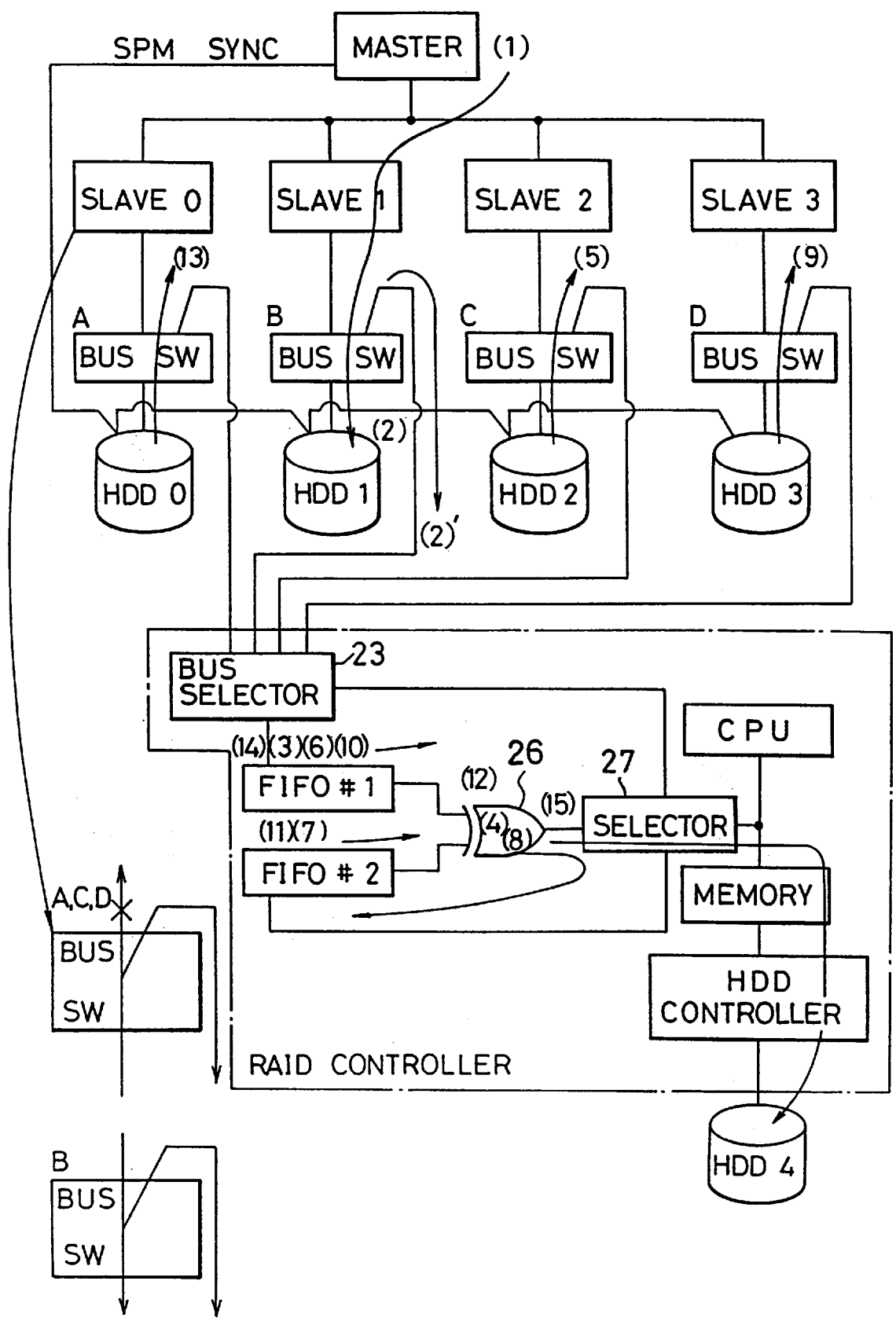
FIG. 21 depicts operations at data updating with the RAID controller in accordance with an embodiment of the present invention.

With FIG. 21, the procedure of updating data in one HDD is explained below.

1 From master processor, data to be updated is transmitted to slave processor 1.
2 Slave processor 1 updates data in HDD1.
2' At the same time, update data is transferred to the RAID controller by means of bus selector 23.
3 Bus selector 23 transfers the update data to FIFO#1.
4 EXCLUSIVE-OR circuit 26 exclusive-ORs the transferred update data with null code '00'. The result will be then stored in FIFO#2 by selector 27.
5 Data corresponding to the data updated at 2 is read from HDD2.
6 The data read is transferred to FIFO#1.
7 The data from FIFO#1 and from FIFO#2 is exclusive-ORed.
8 Via selector 27, the result is stored in FIFO#2.
9 The data corresponding to the data updated at 2 is read from HDD3.
10 The data read is transferred to FIFO#1.
11 The data from FIFO#1 and FIFO#2 is exclusive-ORed.
12 Via selector 27, the result is stored in FIFO#2.
13 The data corresponding to the data updated at 2 is read from HDD0.
14 The data read is transferred to FIFO#1.
15 The data in FIFO#1 and in FIFO#2 is exclusive-ORed. The result will be then stored in HDD4, the parity disk, thereupon concluding the procedure of data updating.

The same procedure will be applied to updating data in two or three HDDs except that the number of HDDs from which data corresponding to the update data to be read decreases. In case of updating data in all four HDDs, however, the operation for data loading will be applied.

Figure 22:
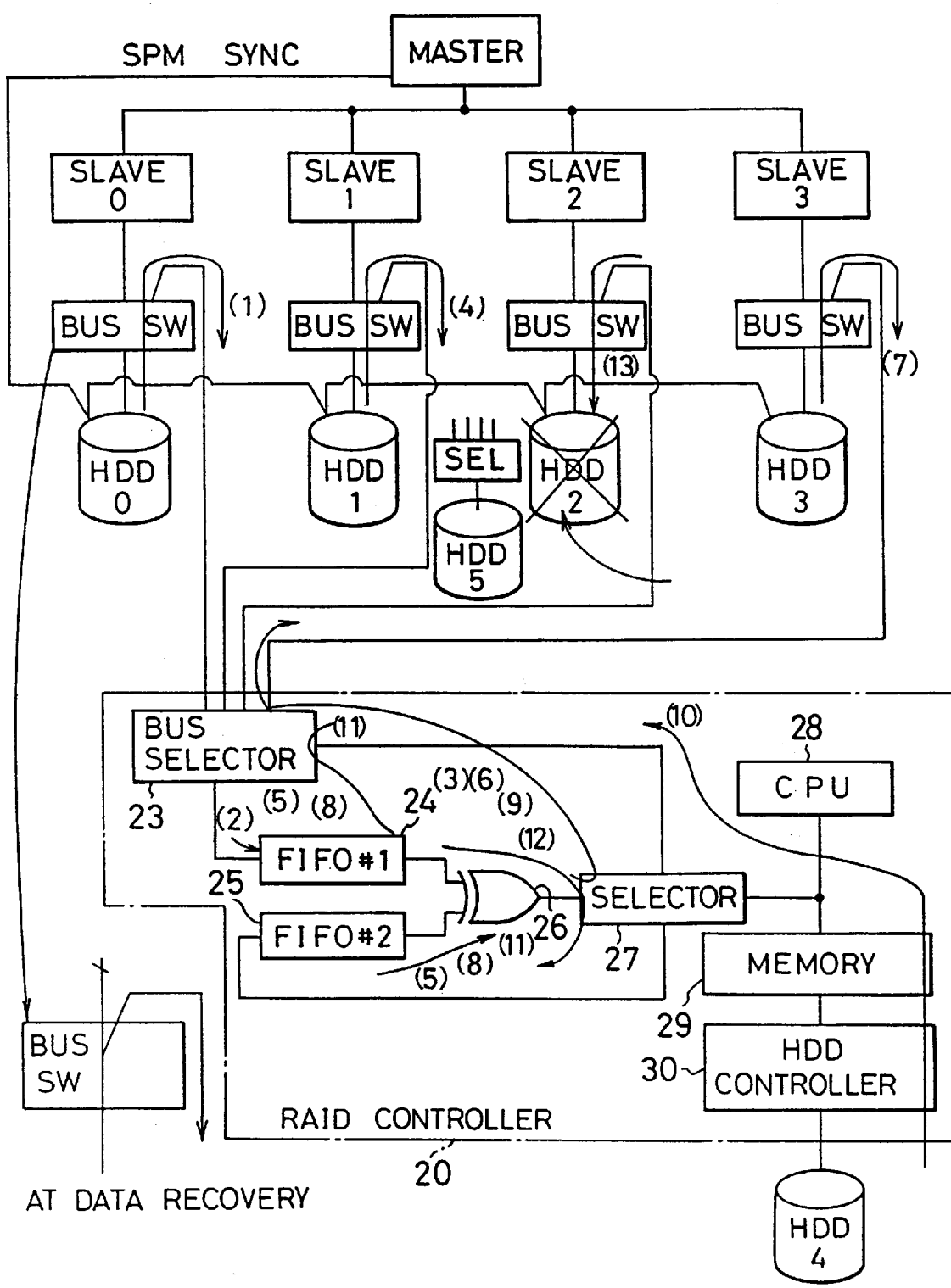
FIG. 22 depicts operations at data recovery with the RAID controller in accordance with an embodiment of the present invention.

Now with FIG. 22, data recovery will be discussed below.

Assuming that a failure has occurred to HDD2, the bus switches couple the HDDs to RAID controller 20. Then by means of selector 21, failed HDD2 is replaced with HDD5 as follows;

1 Data is read from HDD0 and then loaded into RAID controller 20 via the bus switch,
2 Bus selector 23 writes the data transferred from the HDD0 bus into FIFO#1,
3 The data that has just been written in FIFO#1 and the null data, 00, in FIFO#2 is exclusive-ORed. The result will be then stored in FIFO#2.
4 Data is read from HDD1 and then loaded into the RAID controller via the bus switch,
5 As bus selector 23 selects the HDD1 bus, the data is written into FIFO#1,
6 The data that has just been written in FIFO#1 and the data in FIFO#2 is exclusive-ORed. The result will be then stored in FIFO#2,
7 Data is read from HDD3 and then loaded into RAID controller 20 by means of the bus switch,
8 As bus selector 23 selects the HDD3 bus, the data is written into FIFO#1,
9 The data that has just been written in FIFO#1 and the data in FIFO#2 is exclusive-ORed. The result will be then stored in FIFO#2,
10 Data is read from HDD4 and then sent to bus selector 23,
11 As bus selector 23 selects the data from HDD4, the data is written in FIFO#1,
12 The data that has just been written in FIFO#1 and the data in FIFO#2 is exclusive-ORed. The result will be then sent to bus selector 23,
13 Bus selector 23 selects the HDD2 bus. The data is then written in HDD5, thereupon completing data recovery.

Data in a failed HDD, HDD2 in this example, can be recovered by exclusive-ORing the data in HDD0, HDD1, and HDD3 with the redundant data created at data load.

Figure 23:
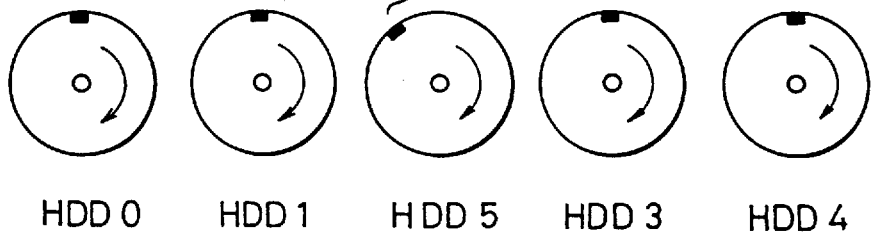
FIG. 23 shows the position of HDDs in synchronous operation at data recovery with the RAID controller.

As shown in FIG. 23, during data recovery, HDD0, HDD1, HDD3, and HDD4 operate in synchronous rotation while HDD5 rotates behind the above four for the overhead taken by RAID controller 20. Thus, RAID controller 20 can write recovered data into HDD5 without any rotational delay.

In this embodiment, RAID controller 20 is composed of bus selector 23, FIFO memories 24 and 25, EXCLUSIVE-OR circuit 26, selector 27, CPU 28, cache memory 29 for parity, and HDD controller 30. Together with the HDDs coupled to the slave processors and the HDD coupled to the RAID controller, the system of RAID level 4 is complete to facilitate data recovery and replace a failed disk with a standby in the event of a system failure.

Embodiment 7

Figure 24A:
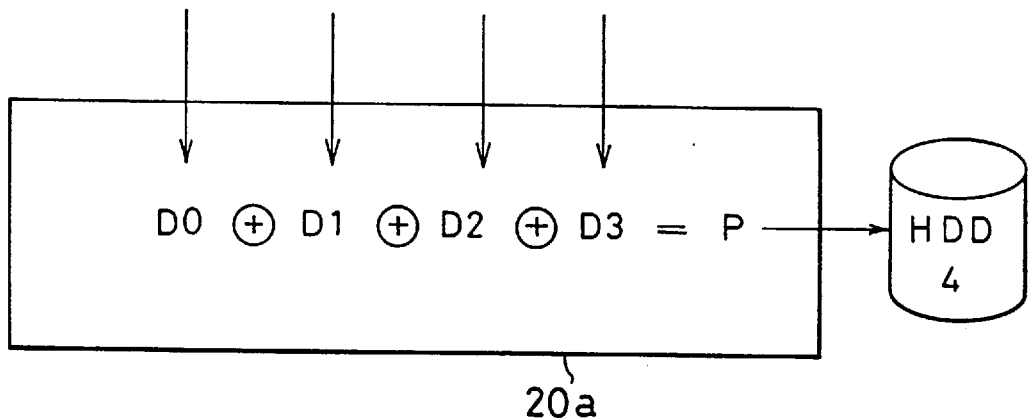
FIGS. 24A and 24B show another methods of creating parity data by the application of the RAID controller.
Figure 24B:
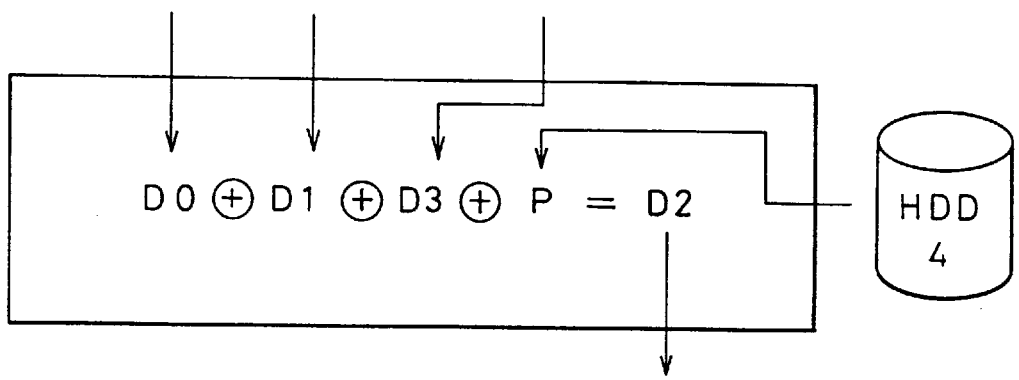

Modelled on Embodiment 6, it is also possible that the RAID controller manipulates data from HDDs simultaneously to create parity data. In FIG. 24A, in simultaneous as well as in parallel operation, the RAID controller inputs data 0 through data 3 from the individual slave processors. By performing exclusive ORs one by one, the result is stored as the parity data. Although the example presented in FIG. 24A is confined within the conceptual scope, EXCLUSIVE-OR circuit can be realized with software or hardware. The parallel data input to the RAID controller enables high-speed parity data creation as shown in FIG. 24A and high-speed data recovery as shown in FIG. 24B.

Embodiment 8

Instead of providing an additional HDD as a hot standby as discussed in Embodiment 6, a failed HDD can be replaced with a new HDD manually at failure occurrence.

Embodiment 9

Figures 25, 26:
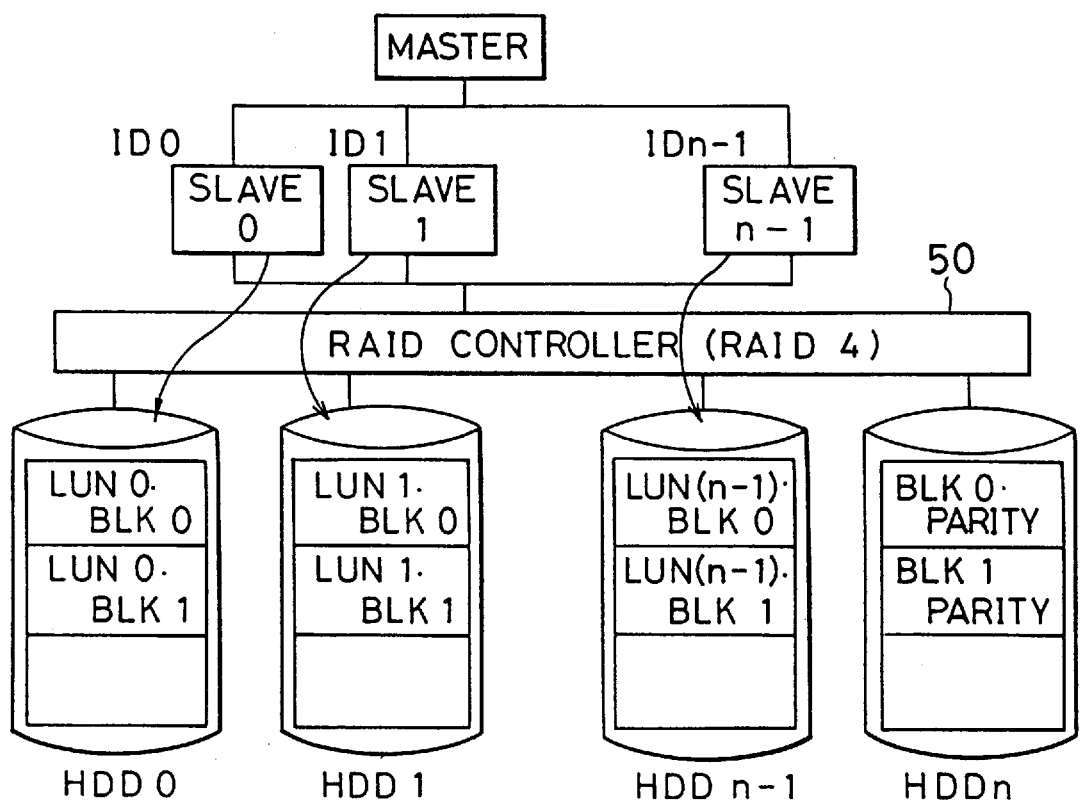
FIG. 25 gives another example of applying the RAID controller to a high-speed data access machine.
FIG. 26 indicates addressing from a slave processor to an HDD in accordance with an embodiment of the present invention.

FIG. 25 depicts an example of high-speed data access machine of the data access apparatus of the present invention. The high-speed data access machine in this example has RAID controller 50 between the slave processors and the HDDs. The number of HDDs is the number of slave processors plus one, with which the system configuration of RAID level 4 is achieved.

From the processors, accesses to RAID controller 50 are made using the logical unit number (LUN). HDDs are assigned on the basis of the LUN. Because accesses from slave processors to the HDDs are made asynchronously, HDDs are assigned correspondingly to the slave processors. Accordingly, HDDs may be fixedly assigned based on the LUN in the RAID controller.

The n+1th HDD is used as the parity disk, thus realizing highly reliable data base operation.

Another possible way of assigning HDDs is to addressing them in serial except for the parity disk in RAID controller 50.

FIG. 26 indicates the correspondence between addresses from the slave processors and the HDDs in the RAID controller when the RAID controller is performing serial addressing to n HDDs.

When a slave processor makes an access to the address at LUN i and block j, RAID controller 50 converts the address into HDD i and block j. In addressing n HDDs in serial, address in the slave processors can be converted into the address in HDDs.

In this embodiment, an access from a slave processor is made to a specific HDD. Because slave processors are operating independently and asynchronously in physically separate arrangement, it may be more appropriate to specify an HDD in the access request.

When a slave processor reads data serially, separate disks are more effective in reducing seek time and in the use of cache memory.

When a slave processor reads data randomly, separate disks are also more advantageous in that access can be distributed thoroughly.

An identifier allocated to each slave processor can be used for LUN, or the numbers specially assigned from the master processor can be used as well.

Accessing data using LUN is also very convenient. For instance, data stored in a different slave processor can be read by outputting an access request to RAID controller 50, using the LUN of the slave processor.

Thus, this embodiment outperforms conventional slave processors coupled directly to HDDs. In a conventional case, a request to read data stored in an HDD coupled to another slave processor had to be first issued to the slave processor. In this embodiment, it is possible to read data stored in an HDD coupled to another slave processor by using the LUN.

Embodiment 10

With referring to FIG. 27, the system configuration of RAID level 5 will be enlarged upon below.

Unlike the previously discussed level 4 system configuration, the level 5 system does not have a fixed parity disk. Rather, parity data is distributed (striped) in HDDs, aiming at improved input/output efficiency. The increase in the data write often results in excessive load onto parity disk. This embodiment is more effective than RAID level 4 in handling more frequent data write. Because there is no disk designated as parity disk per se, the number of HDDs corresponds to that of slave processors.

Figures 27, 28:
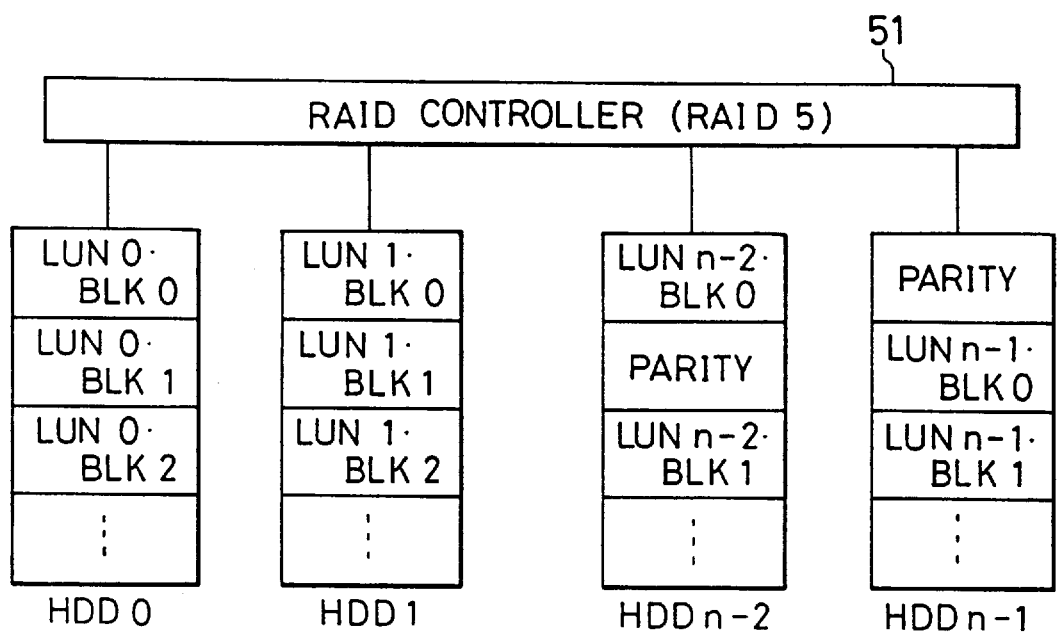
FIG. 27 shows another method of applying the RAID controller to the high-speed data access machine in accordance with an embodiment of the present invention.
FIG. 28 indicates addressing from a slave processor to an HDD in accordance with an embodiment of the present invention.

FIG. 27 shows the striped parity data in n HDDs. If, for instance, a slave processor specifies the data located at address LUN i and block j, RAID controller 51 determines the location according to the computation given in FIG. 28, in which HDD i and block address is (i+1)/n+j. Using the level 5 RAID system, redundant data is thus created in n HDDs for n slave processors in this example.

Embodiment 11

Figure 29:
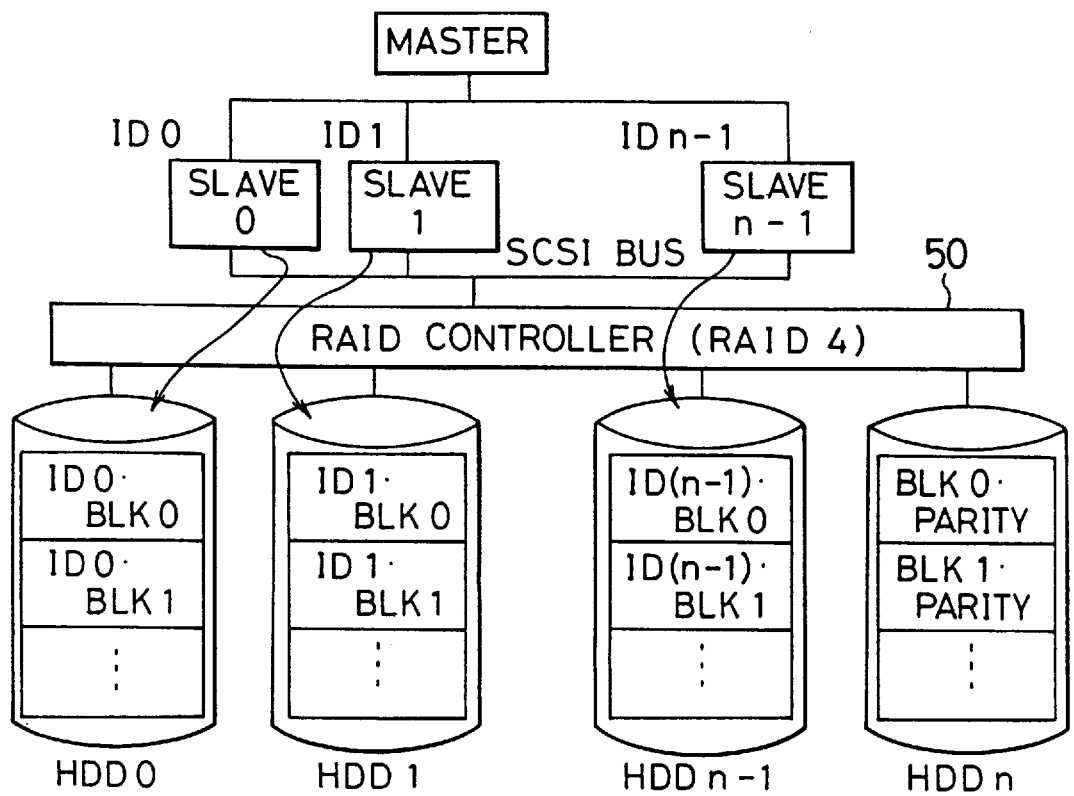
FIG. 29 shows another method of applying the RAID controller to the high-speed data access machine in accordance with an embodiment of the present invention.

FIG. 29 depicts an example in which slave processors are coupled to RAID controller 50 via a small computer system interface (SCSI) bus. Slave processor 0 is assigned to SCSI-ID 0 and slave processor 1 is assigned to SCSI-ID 1. The SCSI-ID is assigned to devices coupled to the SCSI bus, to automatically identify the device from which data has been transferred.

Upon receiving an access request via the SCSI bus, RAID controller 50 can automatically tell which slave processor has issued the request. Access can be made without any LUN as in the previous Embodiment.

After receiving an access request, RAID controller 50 makes an access to an HDD in the same manner as described in Embodiment 9 except that HDDs in this example are identified with SCSI-IDs.

By coupling slave processors to the RAID controller by means of the SCSI bus, the slave processors can request to make accesses without being aware of the RAID controller. This embodiment is applicable to conventional high-speed data access machine without changing the master processor and slave processors at all.

Embodiment 12

Figure 30:
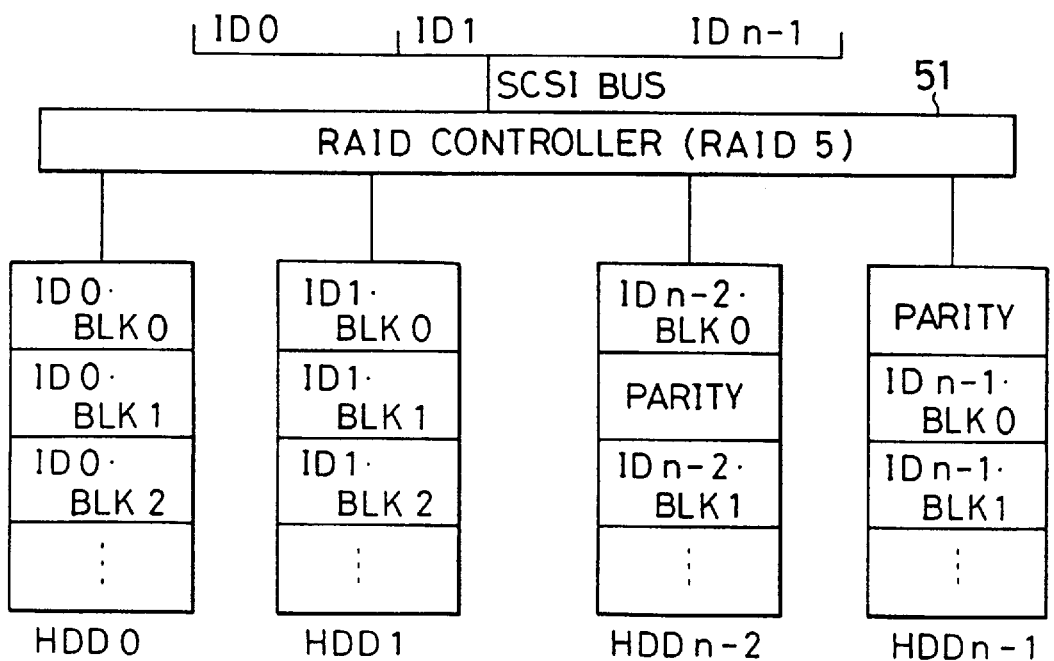
FIG. 30 shows another method of applying the RAID controller to the high-speed data access machine in accordance with an embodiment of the present invention.

FIG. 30 shows the RAID level 5 system configuration with RAID controller 51, in which slave processors are coupled to RAID controller 51 via the SCSI bus. For the level 5 system configuration, data in HDDs can be accessed using the SCSI-ID.

Embodiment 13

Embodiment 13 sets forth another RAID system where the arrangement of LUNs and blocks are reversed.

Figures 31, 32:
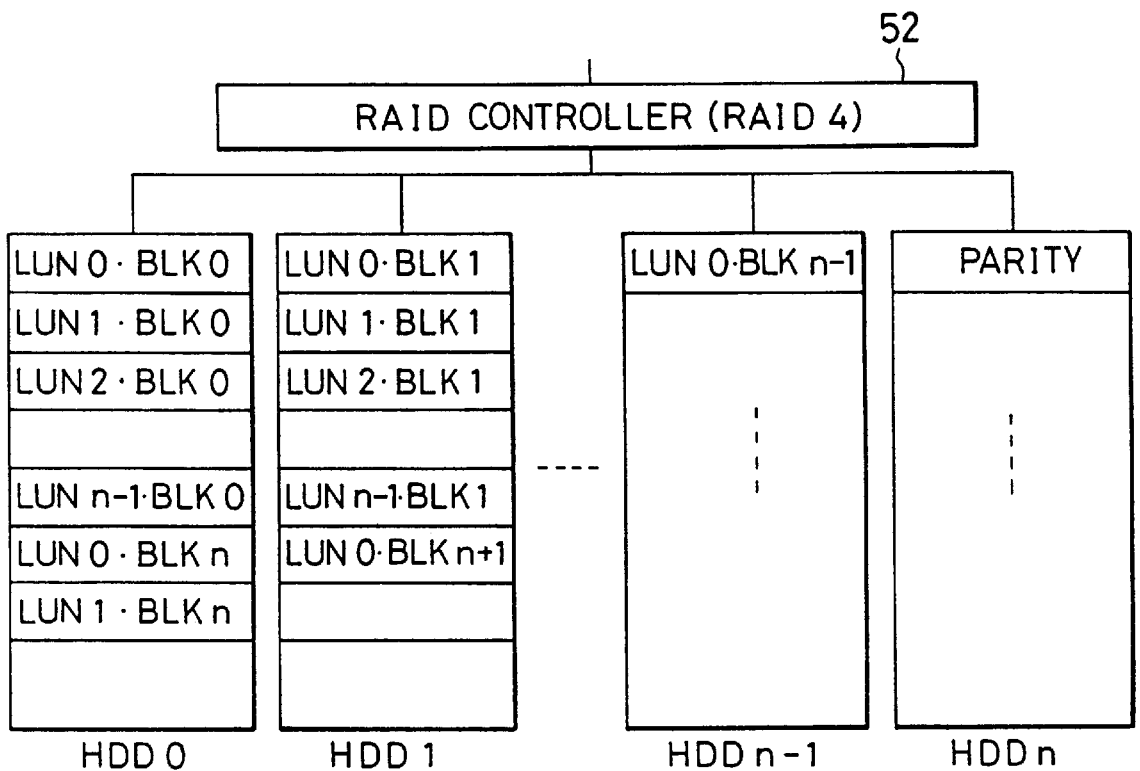
FIG. 31 gives yet another method of applying the RAID controller to the high-speed data access machine in accordance with an embodiment of the present invention.
FIG. 32 indicates addressing from a slave processor to an HDD in accordance with an embodiment of the present invention.

In FIG. 31, n block 0s are consecutively arranged from the top of HDD0. These block 0s are numbered from LUN 0 to LUN n−1. On the other hand, block numbers increase from 0 to n−1 from HDD0 to HDDn−1.

The reversed arrangement of LUNs and blocks makes it possible to locate an access with LUN and block based on the formula given in FIG. 32. Other aspects of this embodiment are the same as discussed with FIG. 25.

This system configuration provides better burst transfer speed. For instance, when continuous access is made from block 0 to block n−1, the access is distributed among n HDDs thus averting excessive load on one single HDD.

Although not shown in FIG. 31, when slave processors and RAID controller 52 are coupled by means of the SCSI bus, SCSI-ID will be used for LUN. The use of SCSI-ID serves to build the RAID system without changing slave processors.

Embodiment 14

Figures 33, 34:
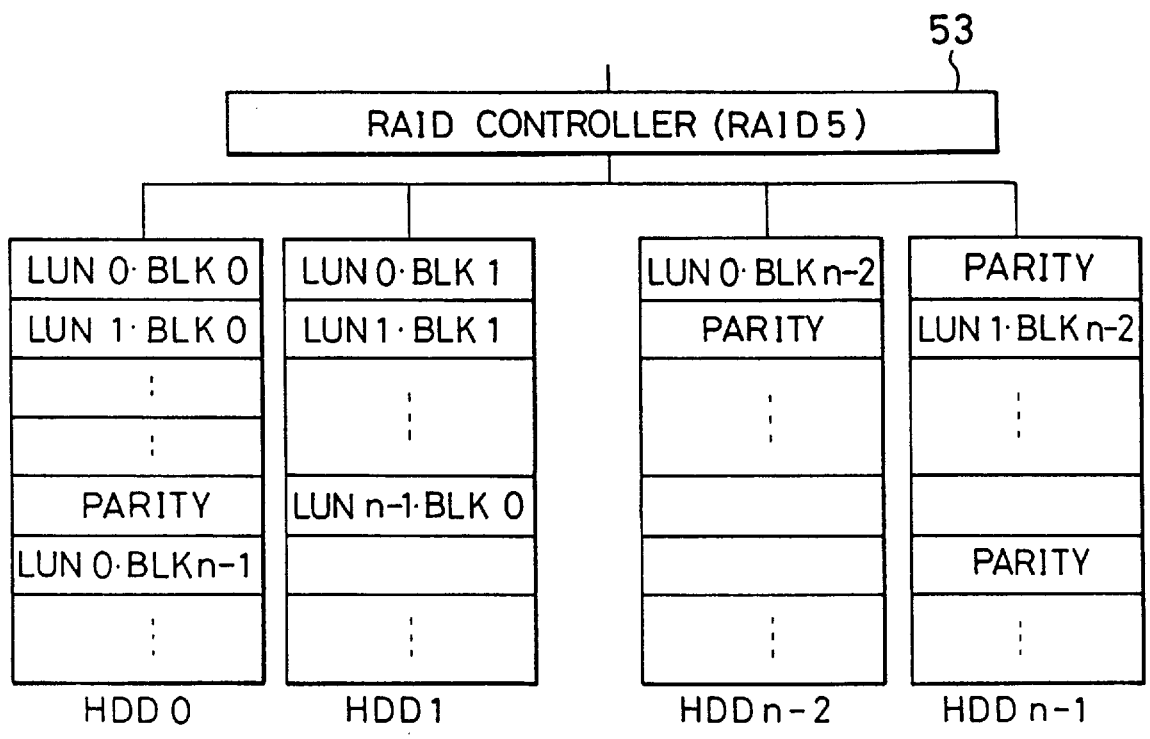
FIG. 33 shows another example of applying the RAID controller to the high-speed data access machine in accordance with an embodiment of the present invention.
FIG. 34 indicates addressing from a slave processor to an HDD in accordance with an embodiment of the present invention.

FIG. 33 illustrates an example of the RAID level 5 system configuration. This embodiment can be characterized by the parity data distributed in a striped arrangement in addition to the reversed arrangement of LUNs and blocks just as the previous embodiment.

As indicated in FIG. 34, RAID controller 53 can locate a data block in an HDD in response to the access requested from a slave processor. If an SCSI bus is applied in this example, the SCSI-ID can be substituted for LUN.

Embodiment 15

Figures 35, 36:
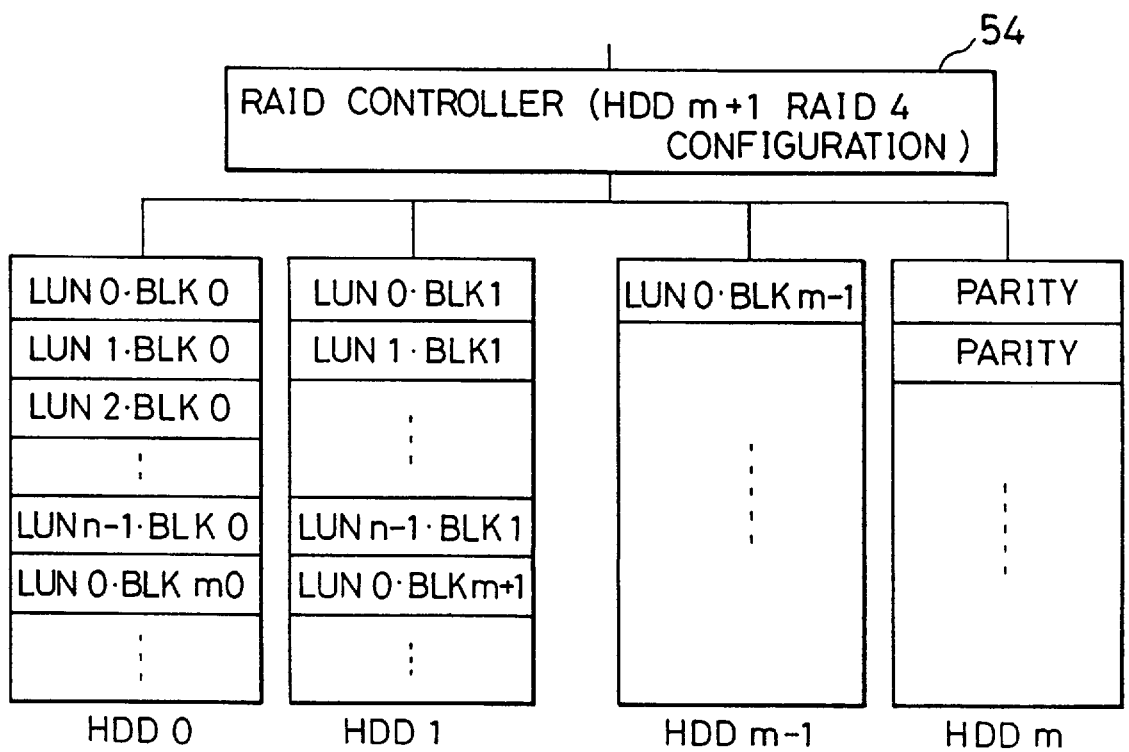
FIG. 35 shows another example of applying RAID controller to the high-speed data access machine in accordance with an embodiment of the present invention.
FIG. 36 is an example of addressing from a slave processor to an HDD.

FIG. 35 represents another example of using m+1 HDDs instead of n+1, where m denotes any arbitrary number. Unlike the examples previously discussed, in which the number of slave processors and that of HDDs are equal, HDDs can be added or removed discretionally in this example because of RAID controller 54. When an access with LUN and block specified is requested from a slave processor, the block in an HDD to be accessed can be determined with the formula given in FIG. 36. It is also possible to use the SCSI-IDs for LUN in this example.

Embodiment 16

In Embodiment 15, m+1 HDDs are coupled to the slave processors. In this embodiment, because the level 5 system is applied, m HDDs are used.

Figures 37, 38:
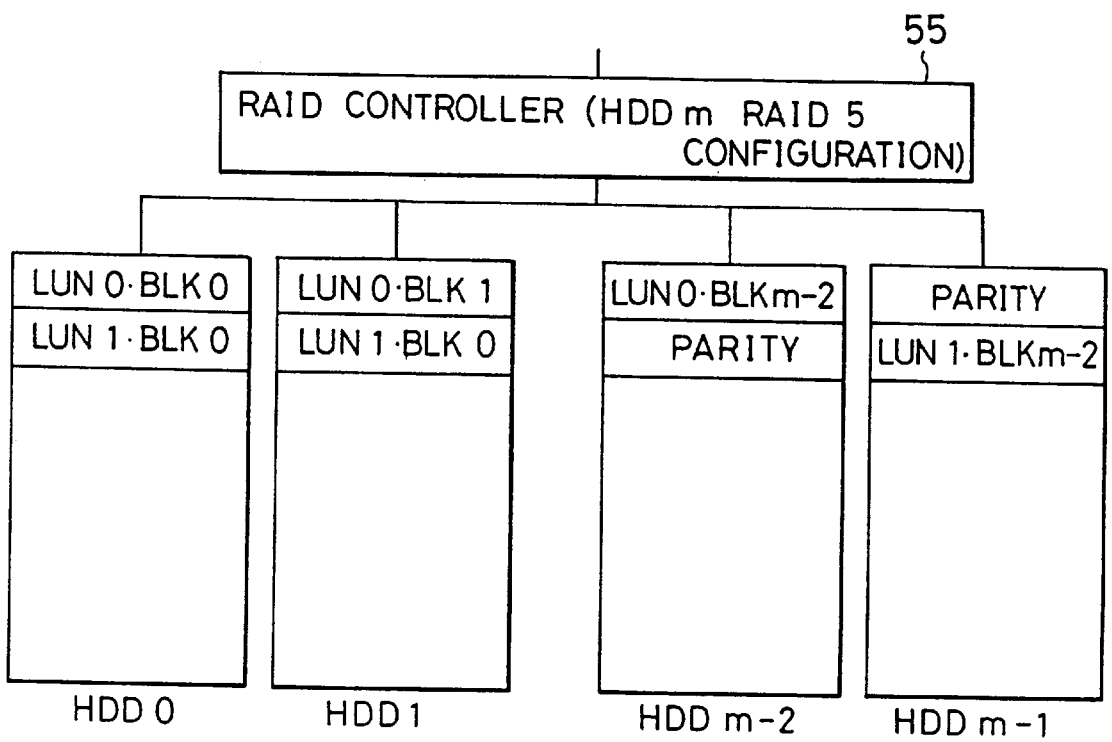
FIG. 37 shows the application of RAID controller to the high-speed data access machine in accordance with an embodiment of the present invention.
FIG. 38 is an example of addressing from a slave processor to an HDD.

When an access with LUN and block specified is requested from a slave processor, the block in an HDD can be determined with the formula given in FIG. 38. It is possible to use the SCSI-IDs for LUN in this example, too.

Embodiment 17

An access to data bases is commonly made by a page. To effectively process the access requested in a page size, HDDs are blocked into the size of one divided by the integer of the page size.

Figure 39:
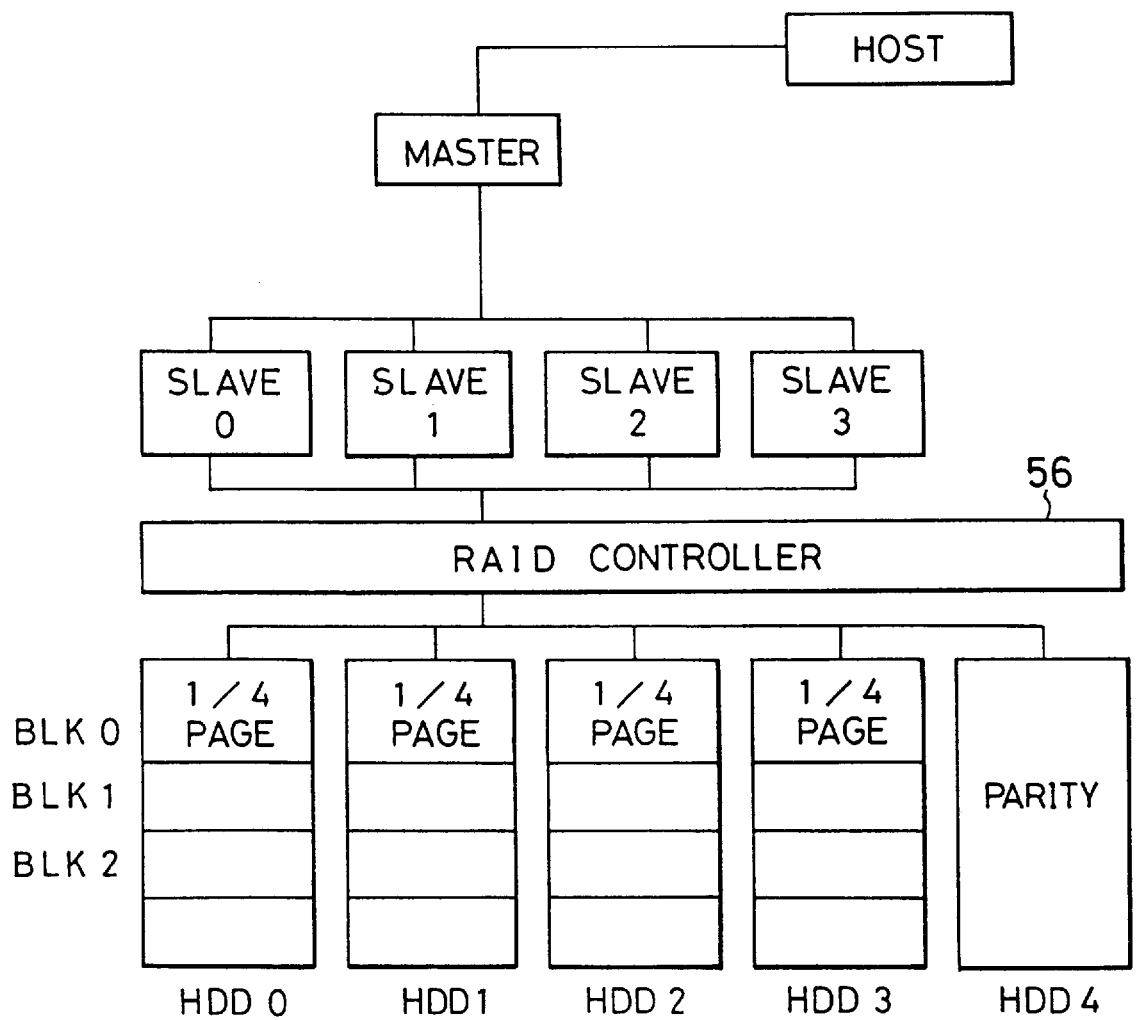
FIG. 39 shows the size of data blocking for the high-speed data access machine.

In an example depicted in FIG. 39, a data base processing program operating in slave processors outputs a request to read or write data for a page. The one-page access request is then divided into a block of one fourth a page in each HDD, thus making one-page data to be written in or read from four blocks equally distributed in four HDDs, HDD0 to HDD3. Of course, this embodiment is applicable to other quantities of HDDs as well.

When the master processor issues a command to the slave processors, the data base processing program of the slave processors requests an access by pages to the RAID controller. In Embodiments 9 to 12, if the size of blocking is made equivalent to an integer divided page size, data access from the RAID controller will be expedited. By extension, for Embodiments 13 to 14, a high-speed and efficient data access will be attained if the size of horizontally aligned data blockings is made equivalent to an integer divided page size.

The block structure in which the size of blockings is made equivalent to an integer divided page size cuts wastes in HDD storage. Writing or reading one-page data with a single access to HDD0 to HDD3 realizes a powerful data access capability.

Access can also be divided based on factors other than the number of HDDs. One block made equivalent to the size divided by an integer enables the efficient use of HDDs. It is possible to block the HDDs by one third a page size or by one fifth a page size even though the number of HDDs is four.

Embodiment 18

Figure 40:
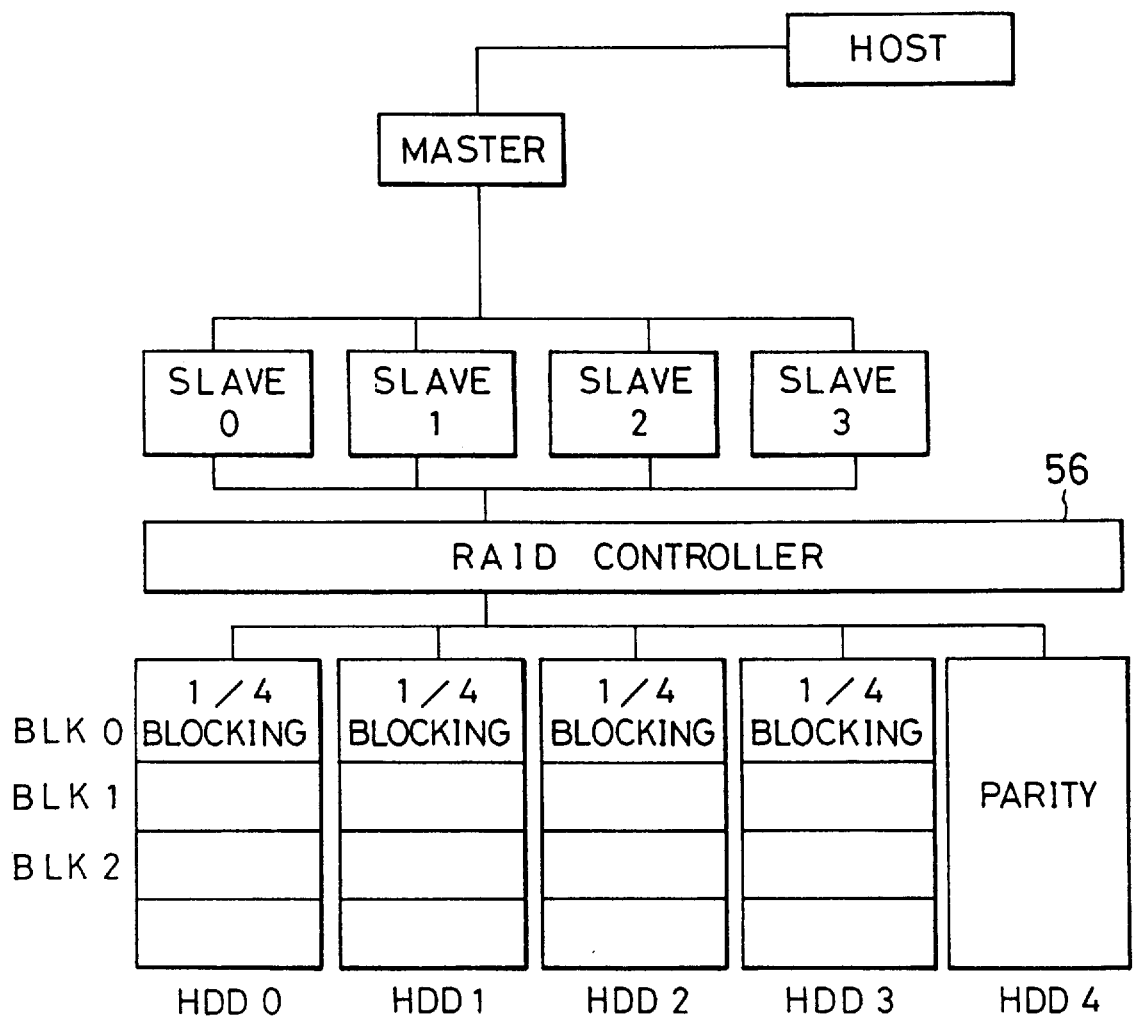
FIG. 40 shows another example of data blocking for the high-speed data access machine.

FIG. 40 demonstrates a method of optimizing data blocking. The operating system implements data blocking for making a data access. Because an access is made based on the size of data blockings, HDDs are blocked into the size equivalent to that divided by the integer of the blocking size in the operating system.

In this example, the blocking size of the operating system is divided into four HDDs, e.g., each block size of HDDs is one fourth of blocking size of the operating system of the slave processors.

When the master processor issues a command to the slave processors, the data base processing program of the slave processors may request an access by blocks. The operating system of the slave processors blocks the access before outputting it to the RAID controller. Therefore, in Embodiments 9 to 12, data access from the RAID controller is expedited if the size of the HDD blocks are made equal to the one divided by the integer of the blocking size.

For Embodiments 13 to 14, a high-speed and efficient data access is achieved if the size of horizontally aligned data blocks are made equal to one divided by the integer of the blocking size.

It is possible to block data size into one half, one third, or one fifth instead of one fourth as set forth in this example.

Embodiment 19

In the data base system, creation of temporary files or transient tables are often required. These files or tables can be recreated later on based on the files in the master processor or slave processors.

If a failure has occurred to an HDD, these temporary files or transient tables can be recreated based on the original data. These temporary files or transient tables are stored in a work area. Normally, the RAID controller does not create parity data for the data stored in the work area.

By not creating parity for the data stored in the work area, the processing of the RAID controller is expedited, resulting in ever-faster data accesses.

Figure 41:
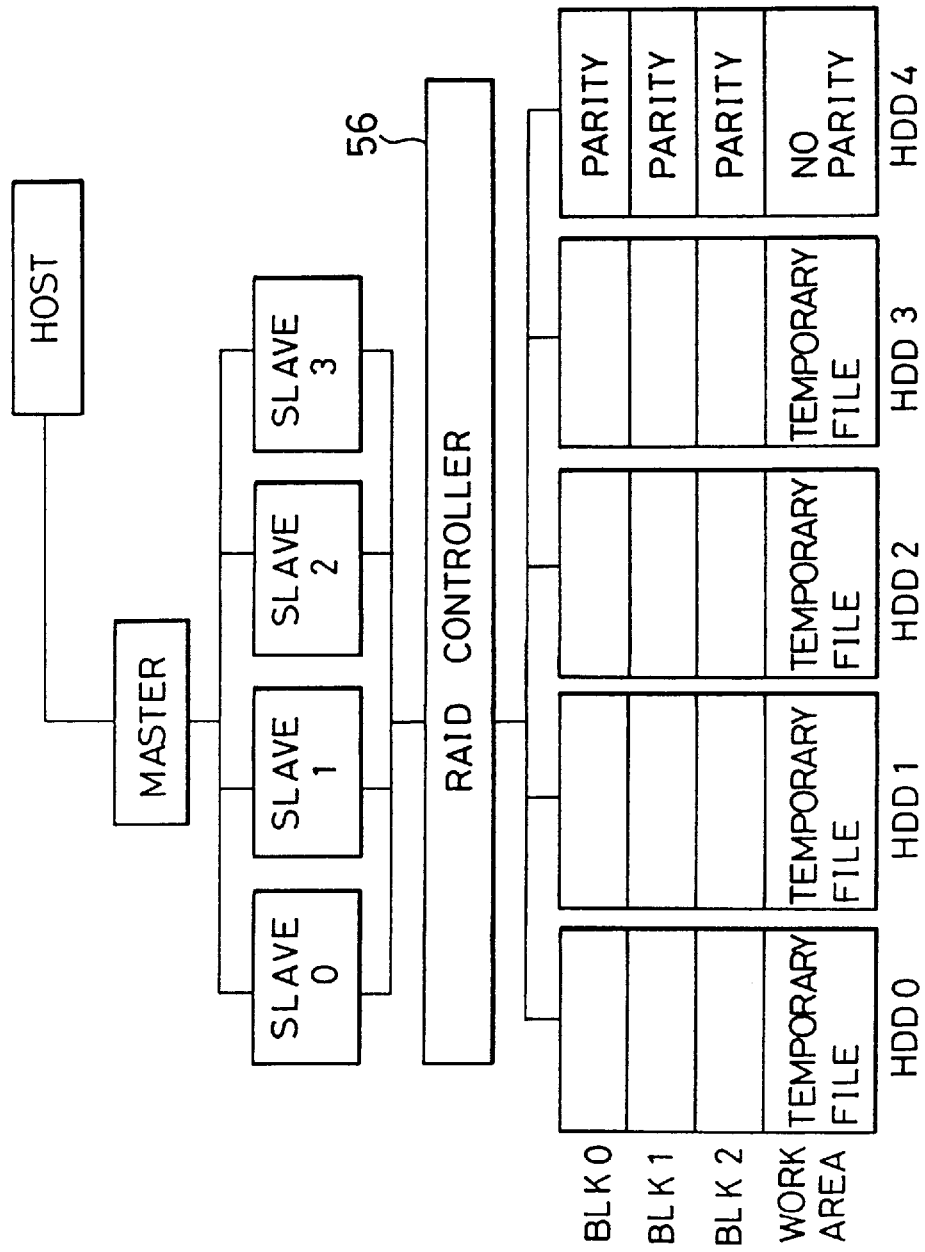
FIG. 41 illustrates work area of the high-speed data access machine.

Referring to FIG. 41, although RAID controller 58 creates parity data for block 0 to block 2, in this example RAID controller 58 does not create parity data for the temporary or transient files in the work area. This facilitates high-speed processing because the load on the RAID controller 58 is reduced.

If a failure has occurred to an HDD, it is impossible to recover the temporary or transient files because the parity data for these files are simply not available. However, because the temporary files or tables are based on the master processor files or the original data stored in block 0 to block 2, they can be created again.

Embodiment 20

With referring now to FIGS. 42 to 47, examples of high-speed data access machine of the present data access apparatus are set forth hereinbelow.

Figure 42:
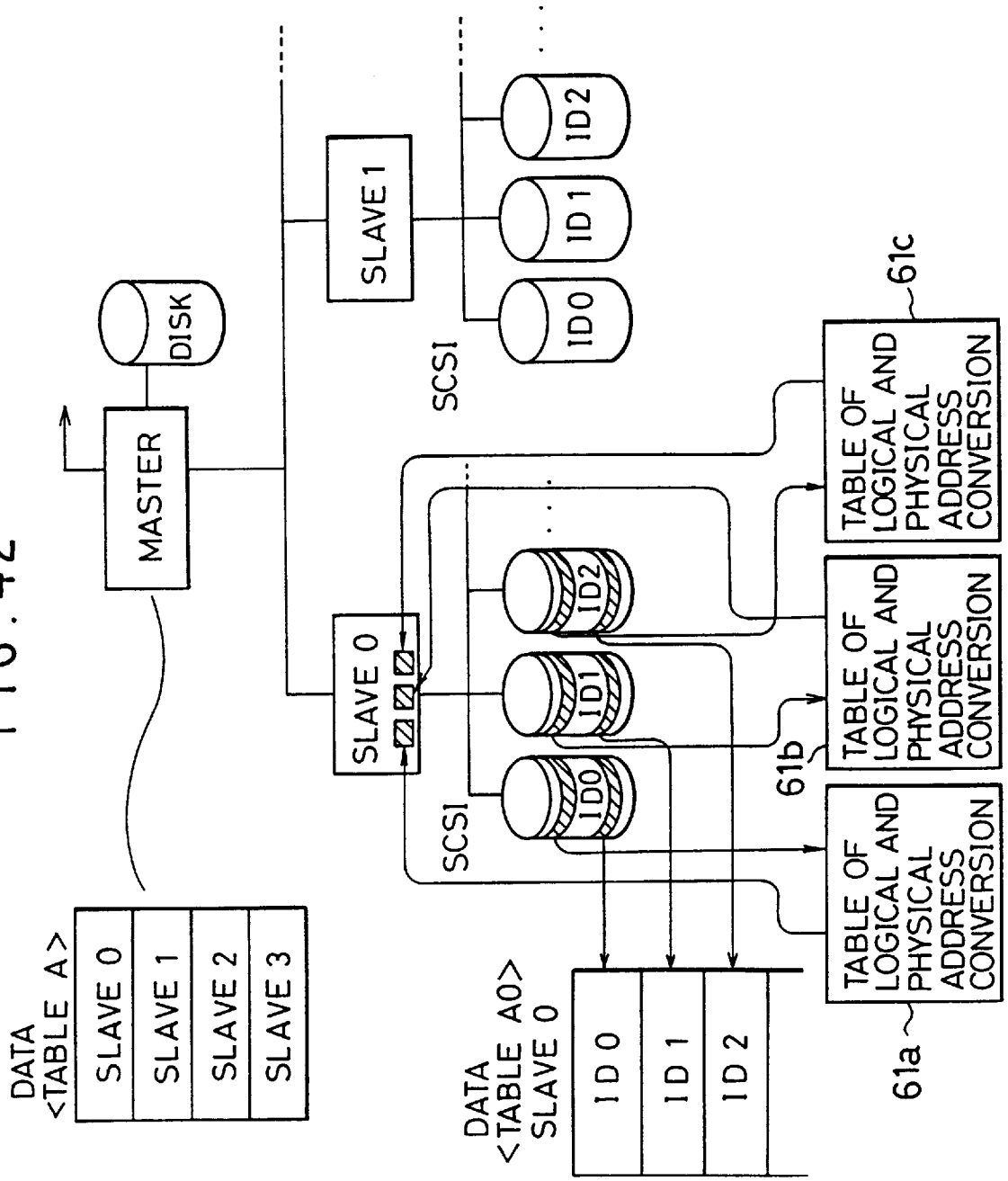
FIG. 42 depicts a plurality of memories contained in a single slave processor.

FIG. 42 depicts a system configuration which can be characterized by a plurality of HDDs coupled to each single slave processor interfaced with the SCSI bus. Thus each HDD is assigned with an SCSI-ID.

Each slave processor divides the data before storing it in two or more HDDs. The master processor in this example divides the data for each slave processor, in which the divided data is further divided into a plurality of HDDs.

FIG. 43 gives examples of logical and physical address conversion tables 61a to 61c stored in each HDD.

Figure 44:
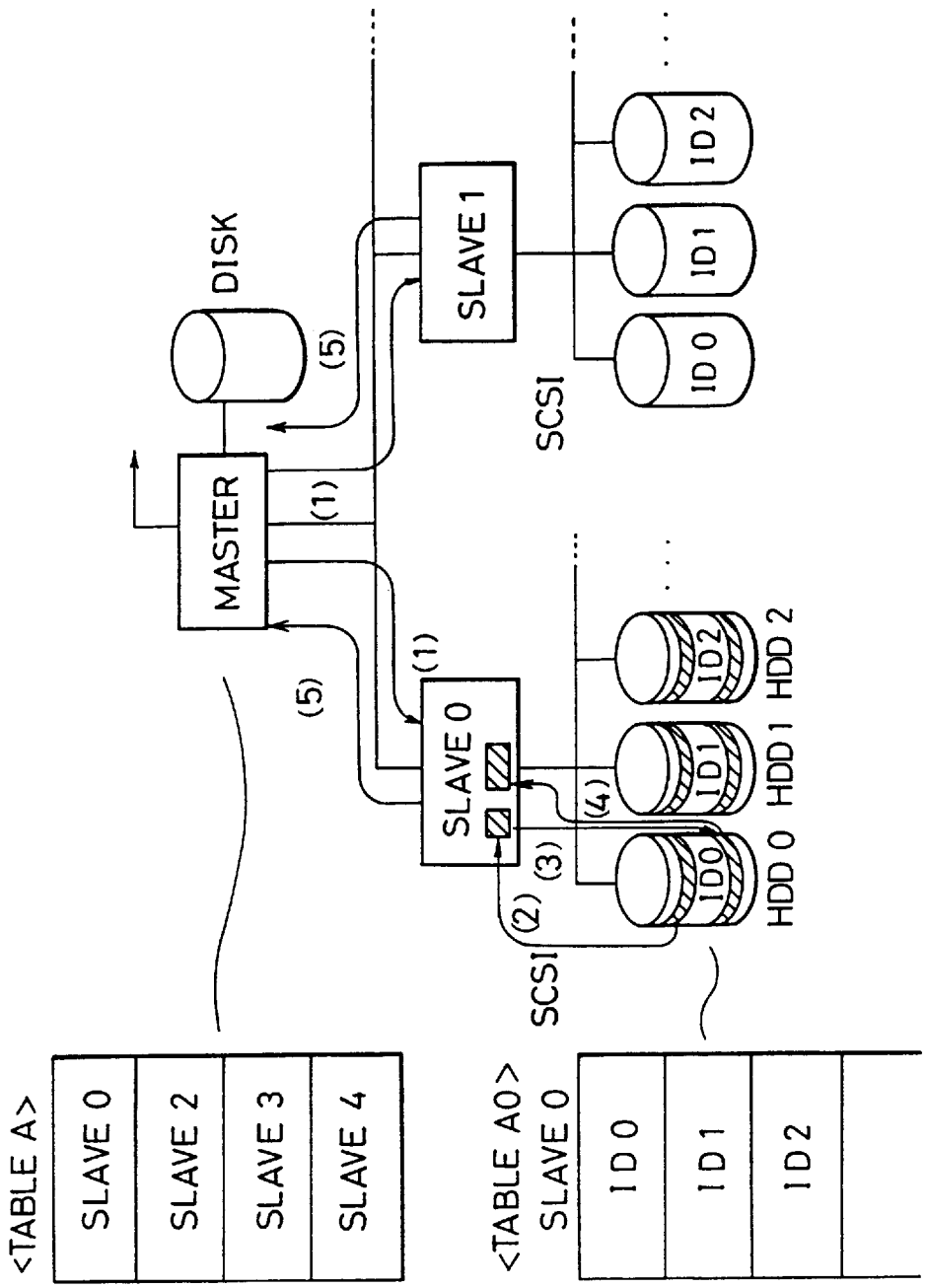
FIG. 44 illustrates the operation of a slave processor with a plurality of memories.

Referring now to FIG. 44, the operation of a high-speed data access machine is elaborated below, with reference to numbered elements.

1 Master processor transmits the retrieval conditions to the slave processors by specifying the tables in slave processor 0 and slave processor 1.

2 Slave processor 0 reads logical and physical address conversion table 61a from HDD0 and stores it in its memory.

3 Slave processors 0, by using logical and physical address conversion table 61a, converts the logical addresses to physical addresses to access data in the HDD.

4 Data read from HDD0 is stored in the memory of slave processor 0.

If the data to be retrieved has been stored in HDD1, the steps from 2 to 4 are carried out for HDD1. Or, if the data is distributed in two HDDs, the steps 2 to 4 are performed for the two HDDs. In this way, slave processor 0 can read data and load it into the memory.

5 The data read from the HDD is sent to the master processor.

As the above procedure is carried out for the individual slave processors, the master processor can obtain the results from each slave processor.

If the number of HDDs to be coupled to a single slave processor is assumed to be n, the amount of data to be read from one HDD becomes 1 divided by n.

By adding the number of HDDs, the performance of data retrieval will be improved and the amount of storing data can be increased without adding the number of slave processors.

Embodiment 21

Figure 45:
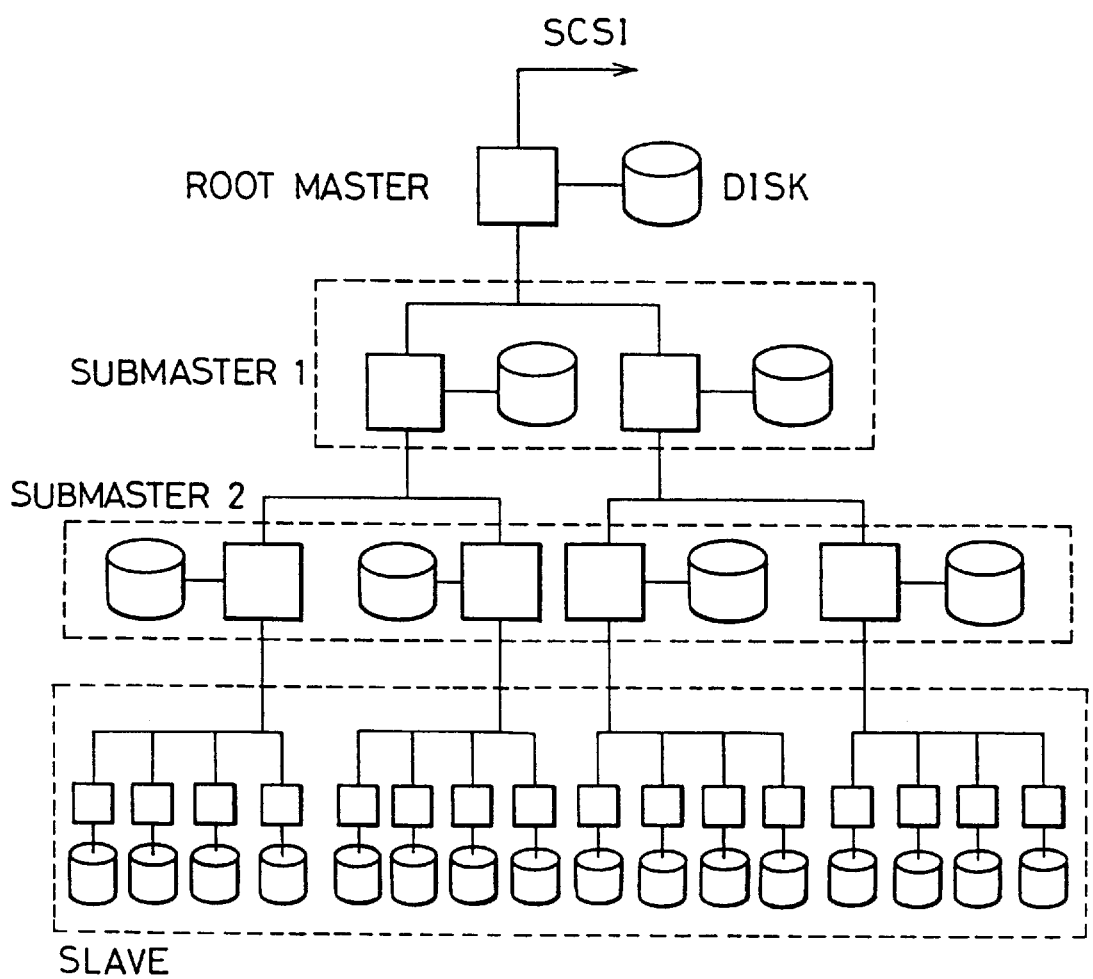
FIG. 45 indicates the hierarchy of a high-speed data access machine in accordance with an embodiment of the present invention, with the root master processor at the top.

FIG. 45 shows the master processors configured in three layers, which highlights the feature of this Embodiment. This configuration helps upgrade the parallel processing capability of the slave processors. With one root master processor atop, two submaster processors are provided, each of which has two submaster processors, which are further coupled to four slave processors.

The data stored in slave processors are processed by its direct report submaster processors 2, the result of which is output and processed by submaster processors 1, and then sent to the root master processor, where this join processing undergoes the final computation.

Figure 46:
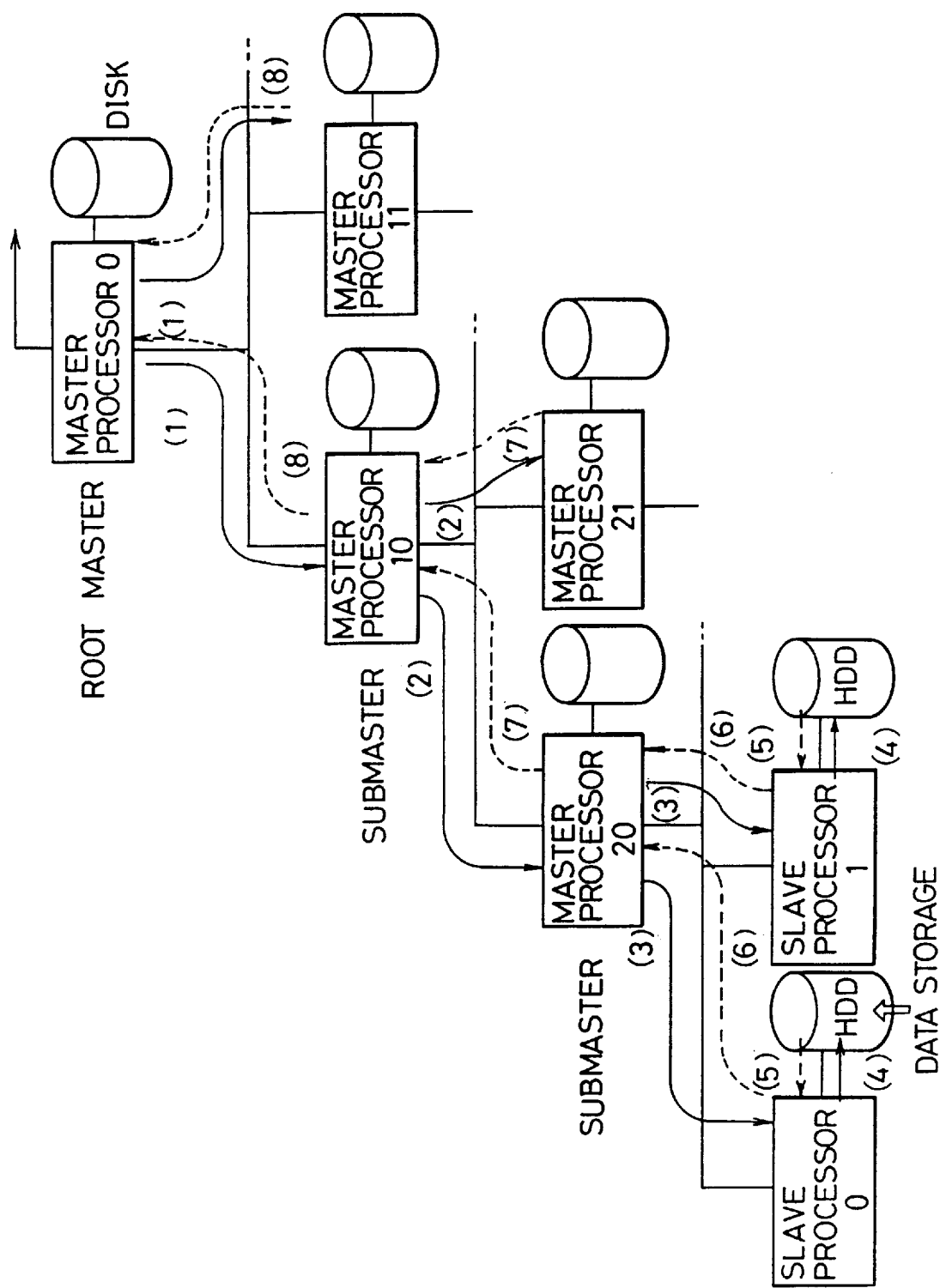
FIG. 46 illustrates the operation under the hierarchy of system configuration in accordance with an embodiment of the present invention.

The join processing is described below with referring to FIG. 46.

1 Master processor 0 outputs the retrieval conditions to submaster processors 10 and 11.

2 Master processor 10 then further transfers the retrieval conditions to its submaster processors 20 and 21.

3 Master processor 20 transfers the retrieval condition further down to the coupled slave processors 0 and 1.

4 The slave processors access the HDDs based on the retrieval conditions.

5 Based on the access request, the HDDs send the specified data to the slave processors.

6 The data is sent from the slave processors to master processor 20. Master processor 20 receives data from other slave processors, too.

7 Upon receiving data from slave processors, master processor 20 merges them and sends the result to master processor 10.

8 Master processor 10 merges the data received from its submaster processors and then sends the result to master processor 0.

Master processor has now completed the access to all HDDs.

When the data contained in a column in one table and the data contained in another column of a different table have been joined, submaster processor may check the data.

When slave processors send a data contained in a pertinent column of their tables to their master processors, e.g., submaster processors 2, the plurality of data are collected to be sorted/merged, and then sent to submaster processors 1, where the results get again sorted/merged. The data is then sent to the root master and then once again sorted/merged.

The root master outputs the data of the column to submaster 1 and further down to submaster 2, where the data is checked with the data stored in each slave processor. The result is then sent to the root master via submaster processors. The plurality of data are sorted and merged for the last time at the root master processor.

The join processing is explained with referring to FIG. 47 below.

1 Information of a pertinent table and a column to be joined is sent from the root master to the coupled slave processors.

2 From each of slave processors, the data corresponding to the above is sent to the upper layer of master processors, where the plurality of data are sorted and merged, and ultimately to the root master where the plurality of data are sorted and merged once again.

3 The data merged at the root master is sent to submaster 2.

4 Information of another table and a column to be joined is sent from submaster 2 to a slave processor. The data is checked. Based on the checked result, necessary data is retrieved from a pertinent slave processor and merged at submaster processor 2.

5 The results are then sent to and merged at submaster 1, and then to the root master, where the plurality of data are once again merged to get the final result.

The hierarchial arrangement of the master processors allows the load on master processors to be distributed, thereby enabling efficient join processing. Although FIGS. 45 and 46 show the hierarchy in which two child-master processors are coupled to one parent-master processor, three or four child-master processors can be coupled to one parent-master processor.

The parallel processing of the master and submaster processors can be further upgraded if each slave processor can have two or more HDDs, as shown in FIG. 42, as the load can be evenly distributed as a whole.

Embodiment 22

Figure 48:
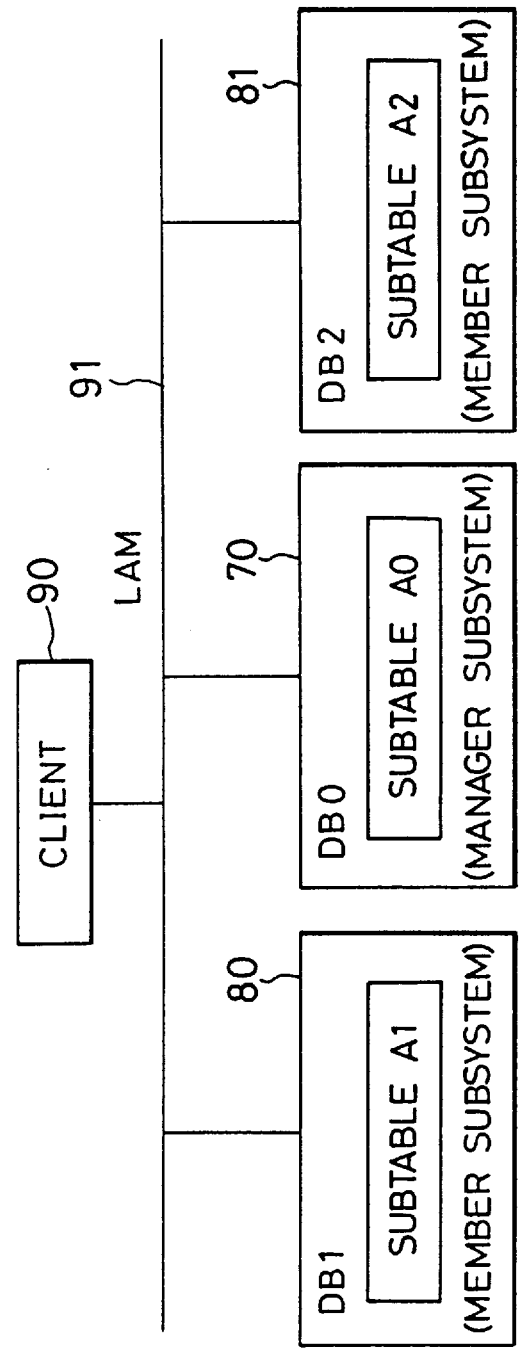
FIG. 48 gives one example of distributed data base system in accordance with an embodiment of the present invention.

FIG. 48 depicts an example of distributed data base system in which subsystems are divided into the manager and the member subsystems. Subsystem 70 is the manager subsystem (called DB0 also) and subsystems 80 and 81 are the member subsystems (called DB1 and DB2 also). In this system, the manager subsystem 70 is assumed to take the role of distributing and managing the data bases.

Figure 49:
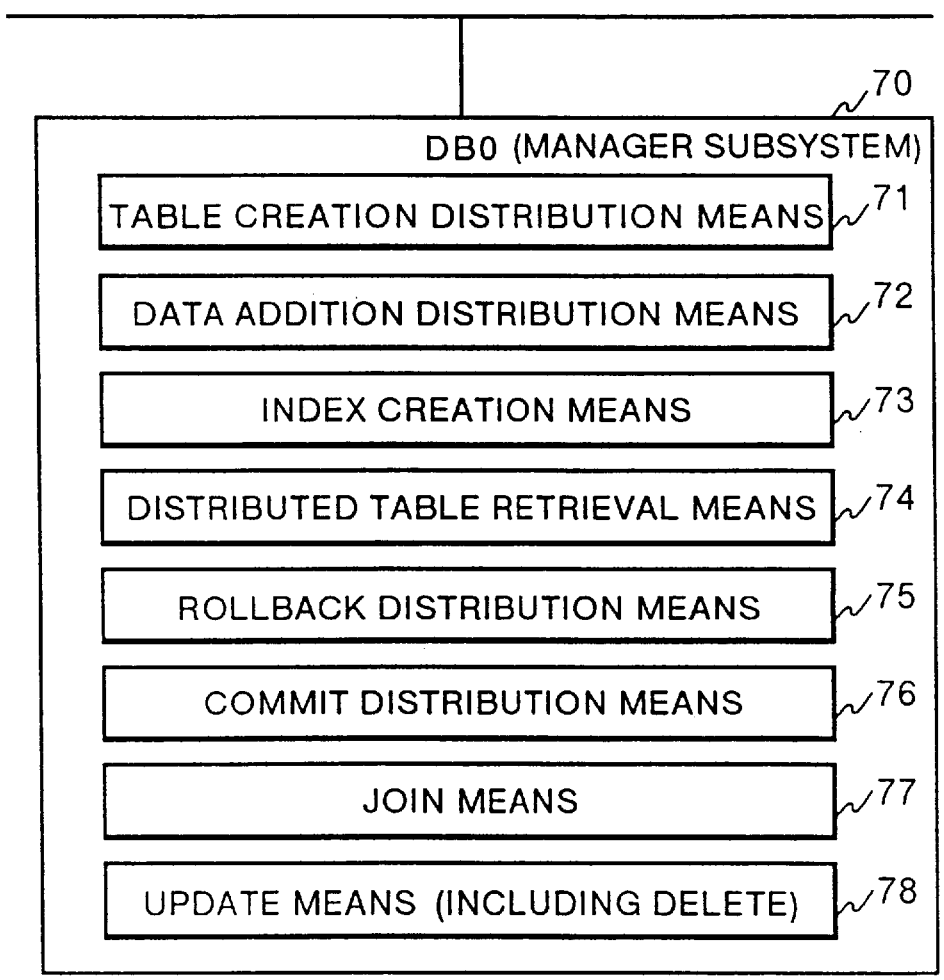
FIG. 49 shows the manager subsystem configuration in accordance with an embodiment of the present invention.

FIG. 49 exemplifies the order of various means manager subsystem 70 is equipped with to perform the distribution and management of data bases as requested from the client.

When a data creation command is output from the client to the data base, table creation distribution means 71 makes a request to member subsystems 80 and 81 to create subtables. When the client loads additional data into the data base for which the table has already been created, data addition distribution means 72 distributes the data and transfers it to each member subsystem. When the client makes a request to create an index using a designated table key, index creation means 73 creates the index using the data stored in the member subsystems. When a retrieval request is made, distributed table retrieval means 74 issues the retrieval request to the member subsystems and returns the merged data to the client. When a rollback request is made, rollback distribution means 75 distributes the rollback request to each member subsystem. When a commit request is made, commit distribution means 76 distributes the request. When a join processing is requested, join means 77 receives data from member subsystems and performs join processing and return the result to the client. When data update or delete is requested, update means 78 have the member subsystems to update or delete data.

The operations of the above means are outlined below.

Figure 50:
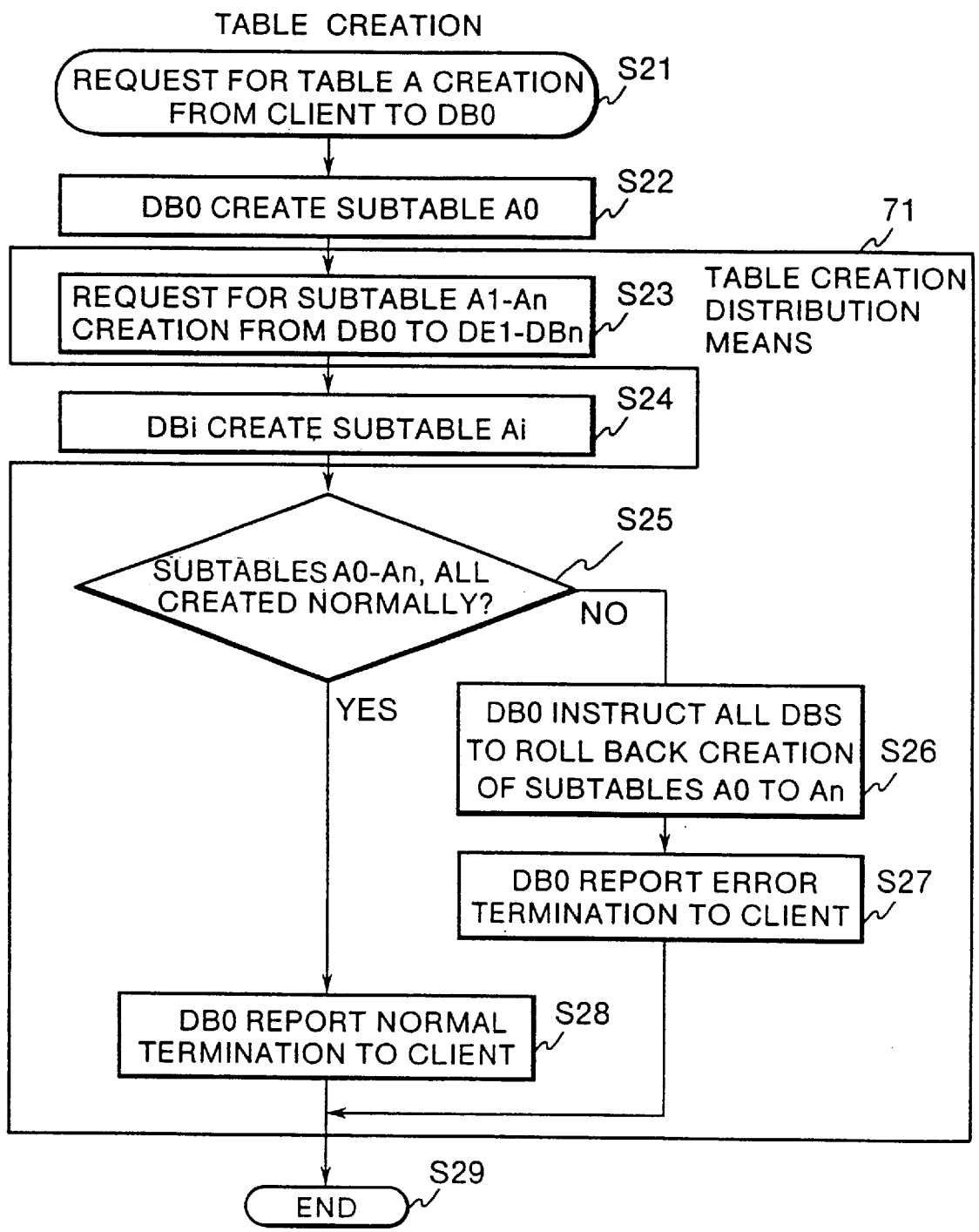
FIG. 50 is an operational flowchart of the table creation distribution means of an embodiment of the present invention.

FIG. 50 is an operational flowchart showing the operation of table creation distribution means 71. At S21, a request of creating table A is made from the client to DB0. Table A will be created in distributed form from table A0 to table An of each subsystem. At S22, DB0 creates subtable A0. At S23, DB0 outputs a request to create subtables Al to An to DB1 to DBn. Subtable Ai (i=1, 2, . . . , n) is created in DBi (i=1, 2, . . . , n) at S24. At S25, the creation of subtables A0 to An is checked. When the creation has been completed normally, DB0 reports the normal termination to the client at S28. If the creation of subtables has turned out to be a failure, a rollback processing is executed at S26 and S27 to cancel the creation, and the error termination is reported to the client.

Figure 51:
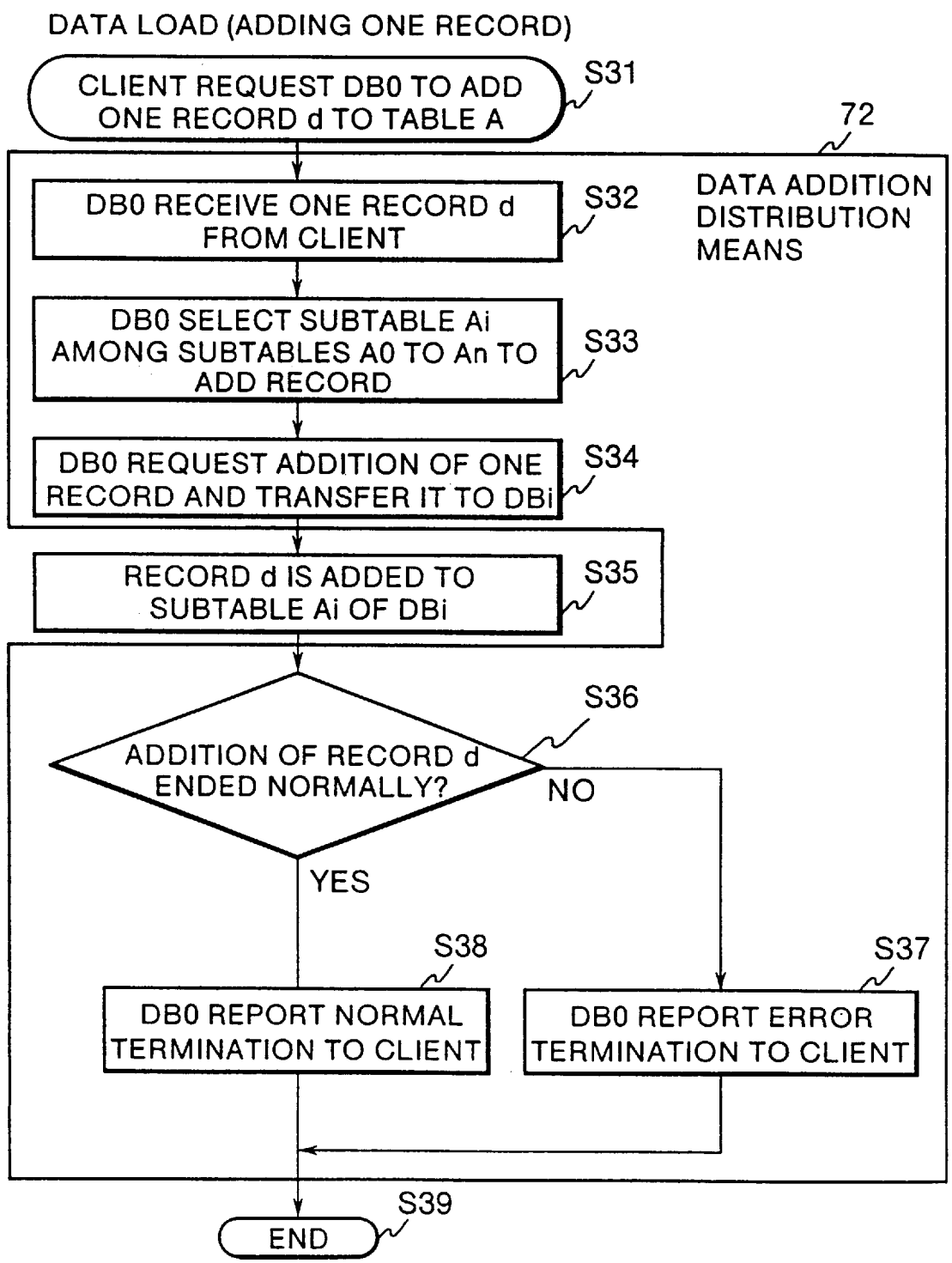
FIG. 51 is an operational flowchart of data addition distribution means of an embodiment of the present invention.

FIG. 51 is an operational flowchart showing operation of data addition distribution means 72. When a request of adding one record to table A is made from the client to DB0 at S31, the DB0 receives the record to be added from the client at S32. Then, at S33, DB0 selects one subtable among subtables A0 to An, subtable Ai in this example, to add the record. One possible reference for selection is that a subtable having the least number of records is picked up as the subtable to which the record is to be added. At S34, a request for record addition is made to the selected data base DBi and the record is transferred. At S35, the record is added to subtable Ai of DBi. At S36, whether or not the record has been normally added is checked, upon which error or normal termination is reported to the client at S37 or S38.

Figure 52:
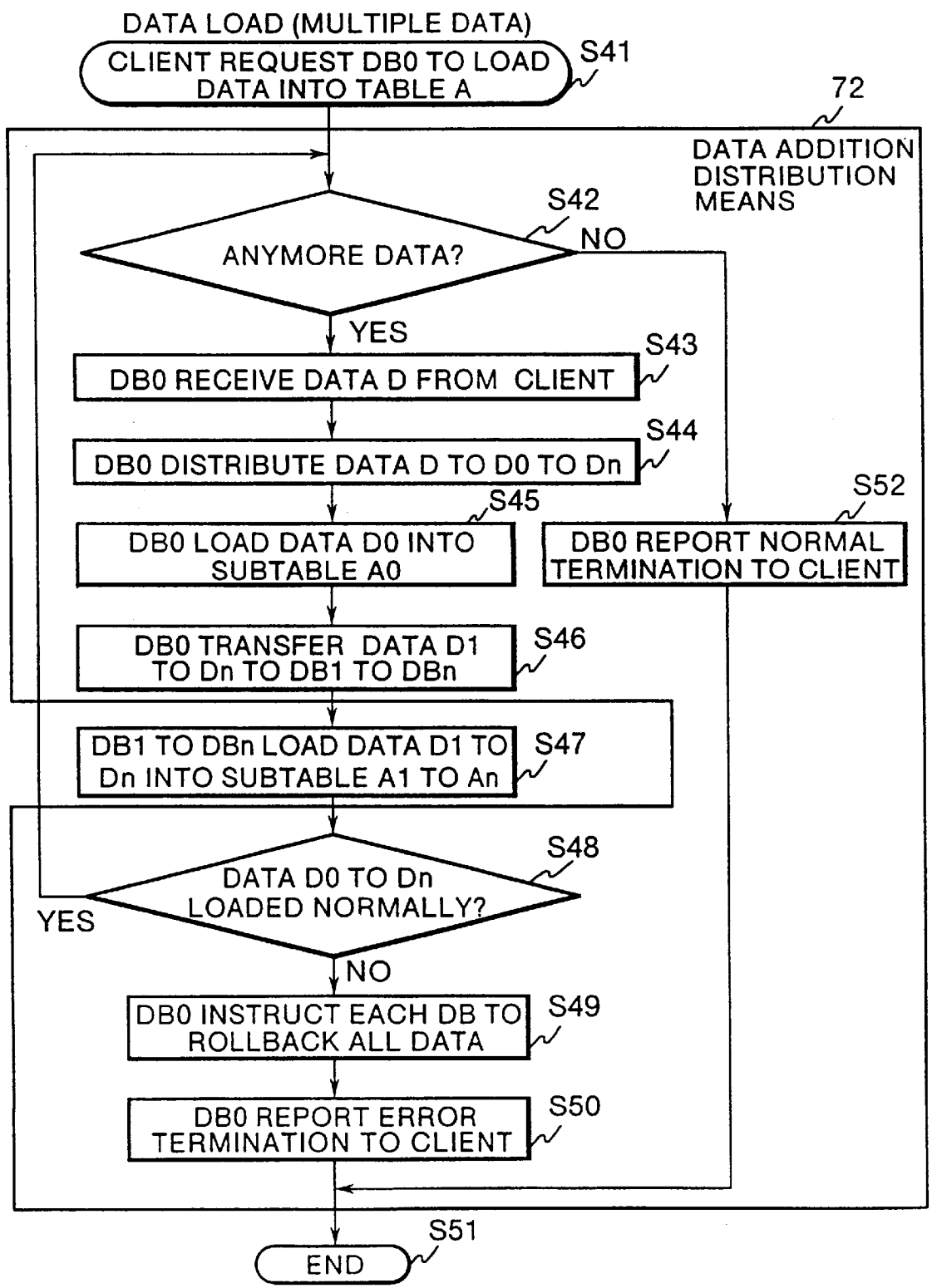
FIG. 52 is an operational flowchart of loading one or more pieces of data in accordance with an embodiment of the present invention.

FIG. 51 describes a case of adding one record. An example of loading multiple pieces of data into subtables is shown in FIG. 52. At S41, a request to load multiple pieces of data into Table A is made from the client to DB0. DB0 then continues performing loop processing from S42 to S48 until all pieces of receiving data have been loaded. DB0 can receive one piece of data after another or receives all pieces of data collectively at once (S43). It then divides one piece of data 0 D0 to Dn (S44). It loads data D0 into its own subtable A0 (S45), and transfers and loads the rest of data D1 to Dn to subtables Al to An of DB1 to DBn respectively (S46 and S47). If an error occurs during loop operation (S48), it indicates each data base to implement roll back processing (S49) and reports the client of the error (S50). After all pieces of data have been loaded into subtables, DB0 reports the normal termination to the client (S52).

When DB0 divides data D (S44), it can distribute more amount of data to subtables containing less amount of data than subtables having more amount of data. Also, it is possible to distribute data depending on the throughput of each data base. For instance, more amount of data can be distributed to data bases having larger capacity or higher-speed processing capability than the others.

Figure 53:
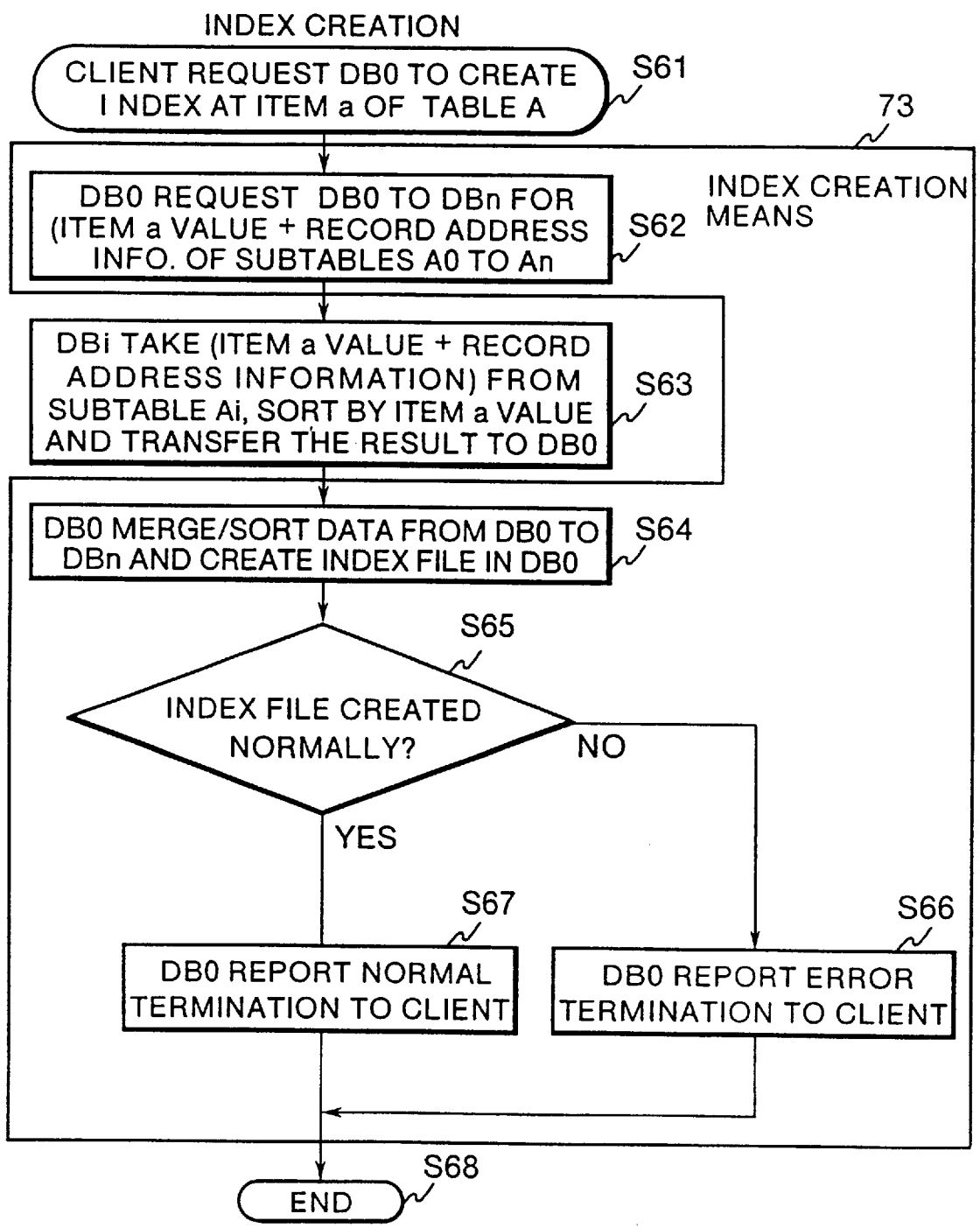
FIG. 53 is an operational flowchart of index creation means.

FIG. 53 is an operational flowchart showing operation of index creation means 73.

At S61, the client requests DB0 to create an index using key item a to the table. At S62, DB0 requests all data bases to give key items of subtables A0 to An and the address information of the record to which the key items belong. At S63, the data bases retrieves the key items and their record addresses. After sorted with the key items, the record addresses are transferred to DB0. At S64, DB0 merges and sorts a plurality of record addresses from all data bases to create an index file in itself.

Finally, the client receives a report indicating either a normal termination (S67) or error termination (S66).

Figure 54:
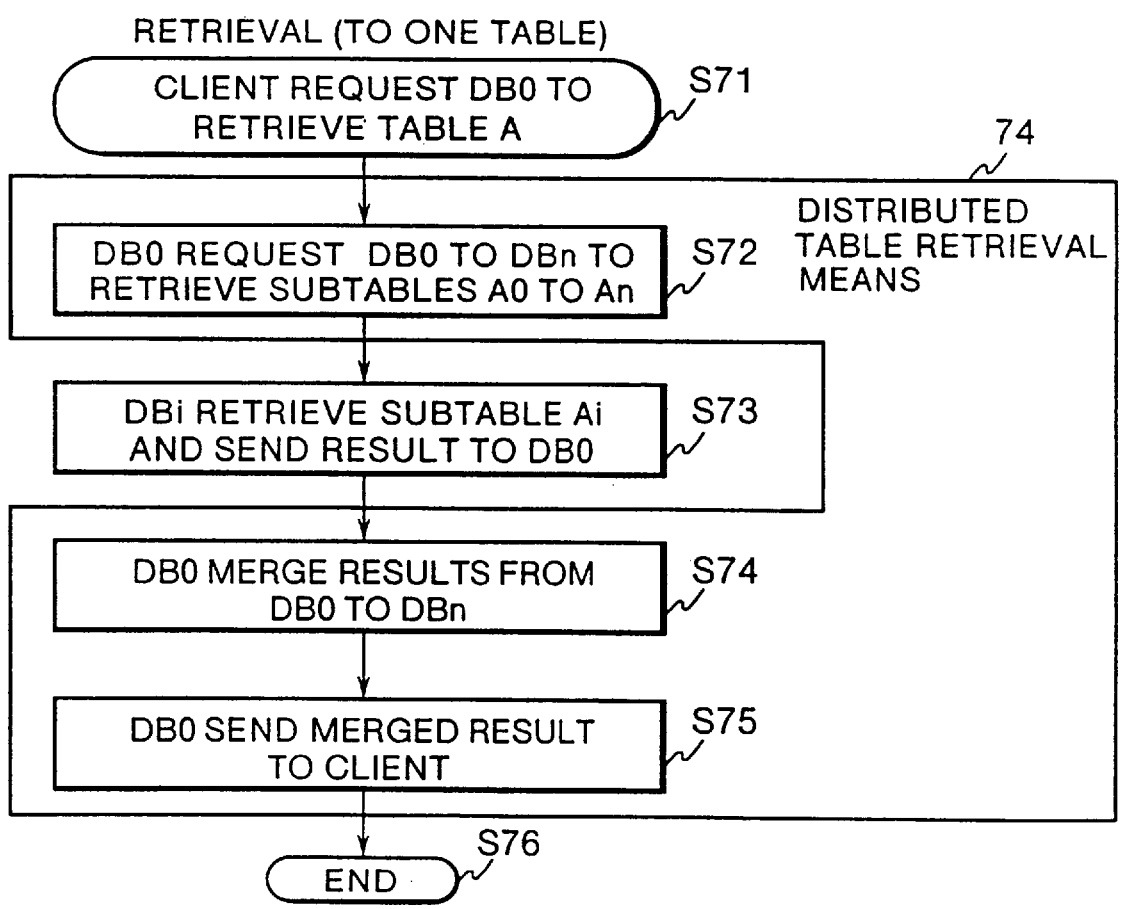
FIG. 54 is an operational flowchart of retrieving one distributed table.

FIG. 54 is an operational flowchart showing operation of distribution table retrieval means 74 by way of an example of retrieving data from a single table.

Figure 55:
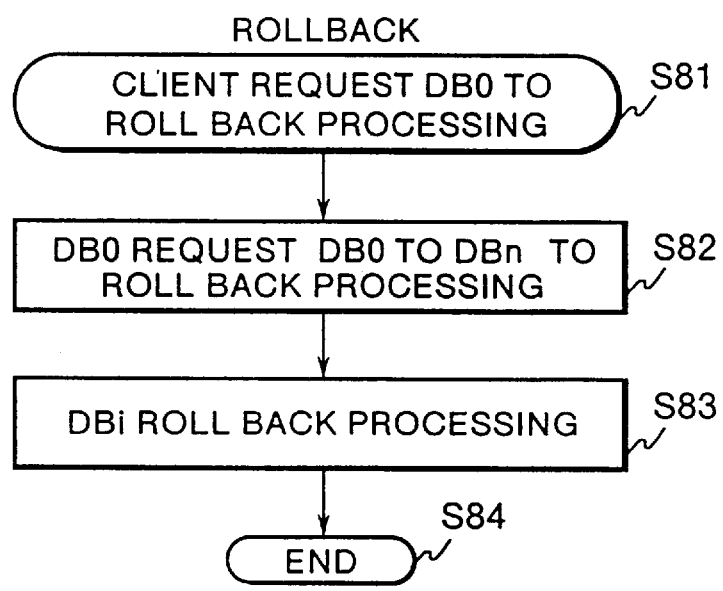
FIG. 55 is an operational flowchart of rollback processing.

When the client requests DB0 to retrieve table A at S71, DB0 demands all data bases to retrieve their subtables. Data bases retrieve all subtables and send back the result to DB0, where, the results are merged (S74) and the finding is transferred to the client (S75):

FIG. 55 shows the operation of roll back distribution means 75.

When the client requests data base 0 to perform roll back processing (S81), DB0 forwards the request to all data bases. The data bases implement roll back processing at S83.

Figure 56:
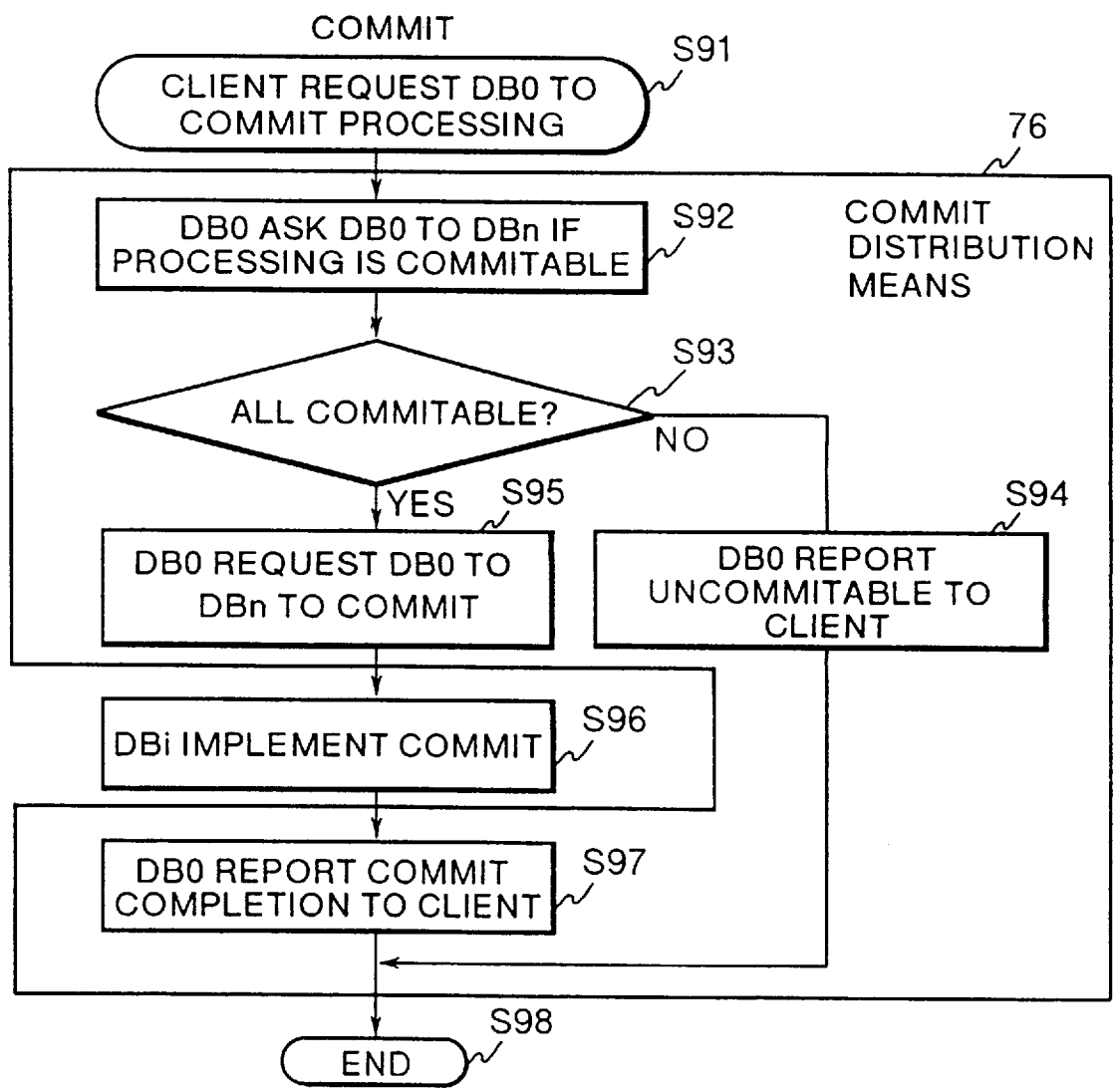
FIG. 56 is an operational flowchart of commit processing.

FIG. 56 is an operational flowchart of commit distribution means 76. When the client issues a commit request at S91, DB0 checks each data base whether or not a series of processing is committable. If the response from all data bases turns out to be positive, a request to commit processing is issued to each data base at S95. Upon receiving the request, all data bases implement commit processing (S96) and DB0 reports the completion of commit processing to the client at S97.

On the other hand, if any of the data bases responds in the negative, DB0 reports the client that the processing can not be committed (S94).

Figure 57:
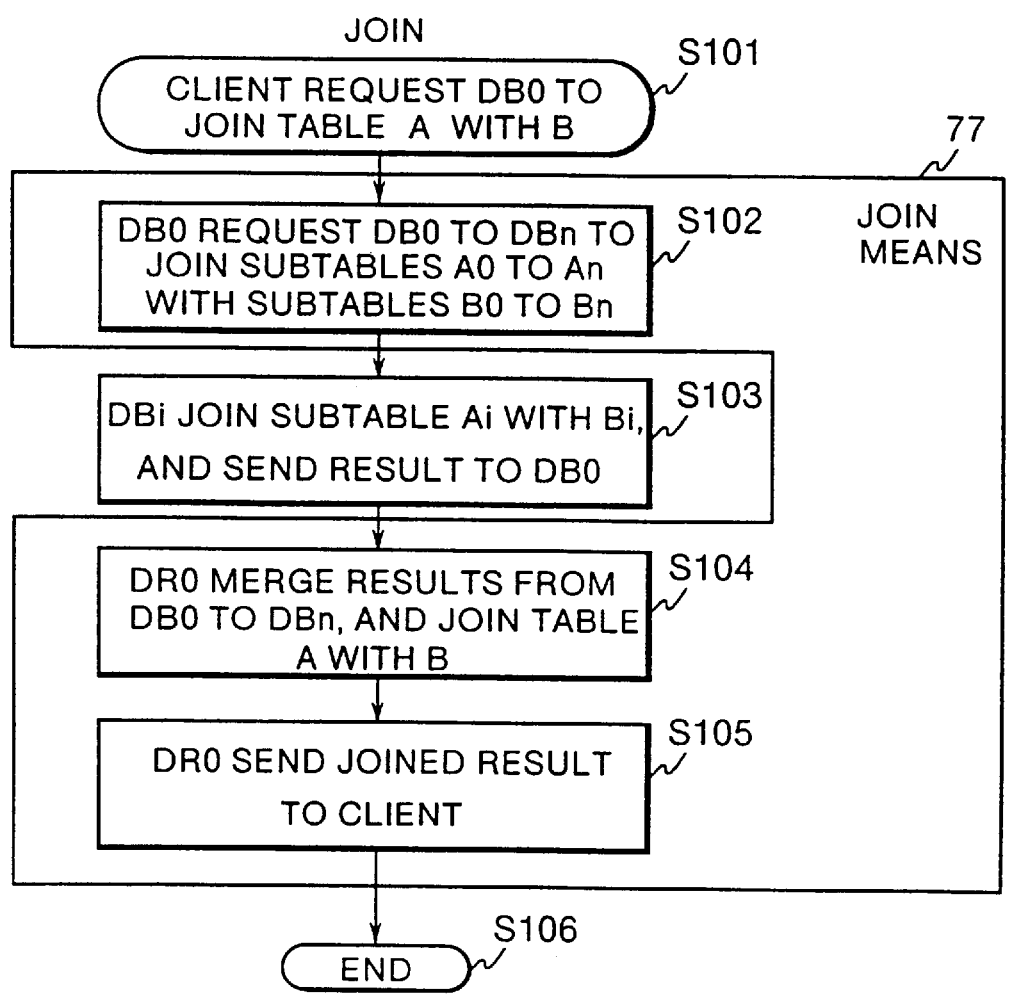
FIG. 57 is an operational flowchart of join processing.

FIG. 57 is an operational flowchart showing operation of join means 77.

At S101, data base 0 receives a request to join table A and table B from the client. DB0 sends the request to all data bases at S102, and indicates them to retrieve subtables at S103. After DB0 has received the results from all data bases, it merges the results and then implements join processing of table A and table B (S104). The findings obtained are transferred to the client at step 105.

Figure 58:
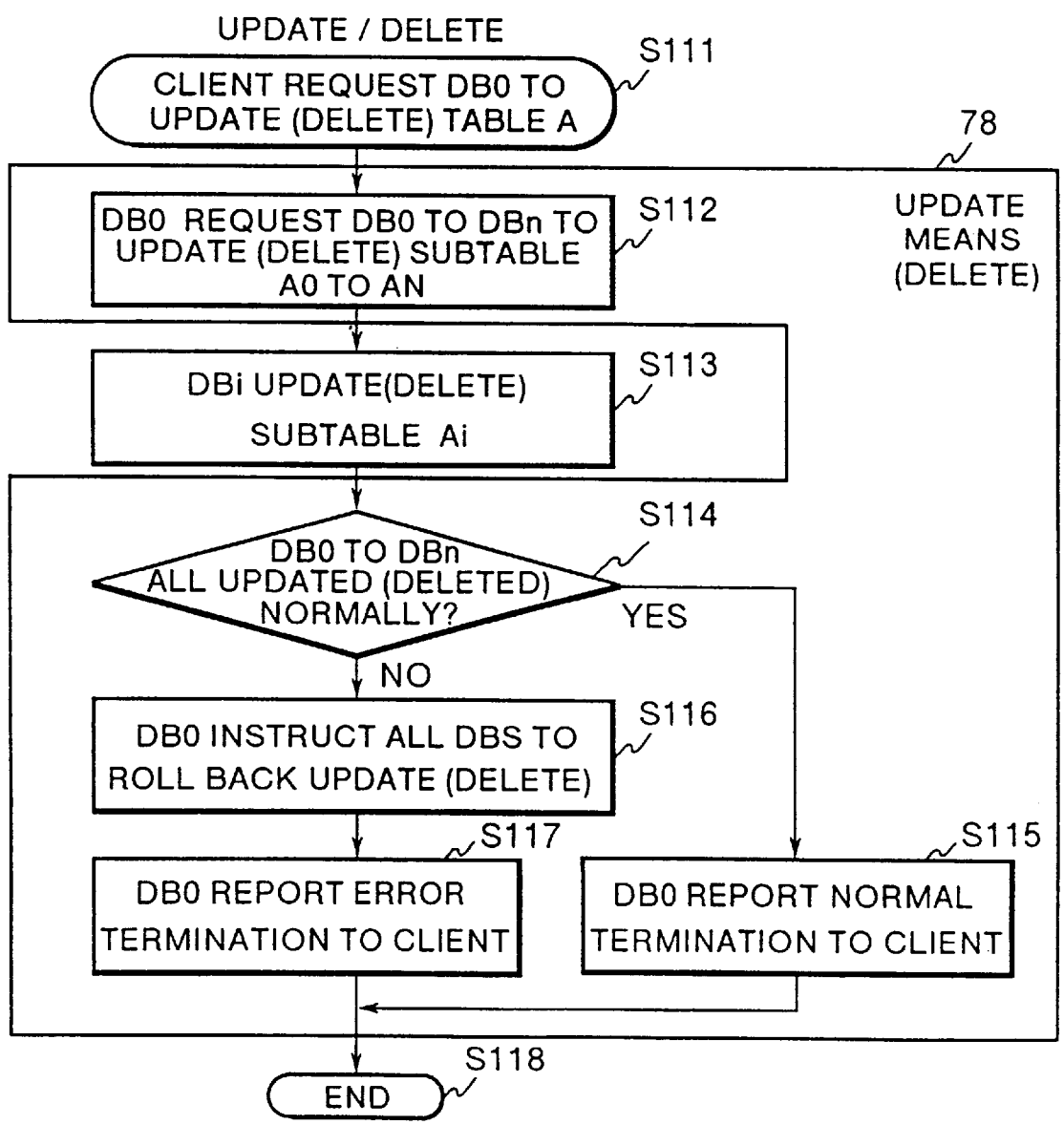
FIG. 58 is an operational flowchart of table updating or deleting of an embodiment of the present invention.
Figure 59:
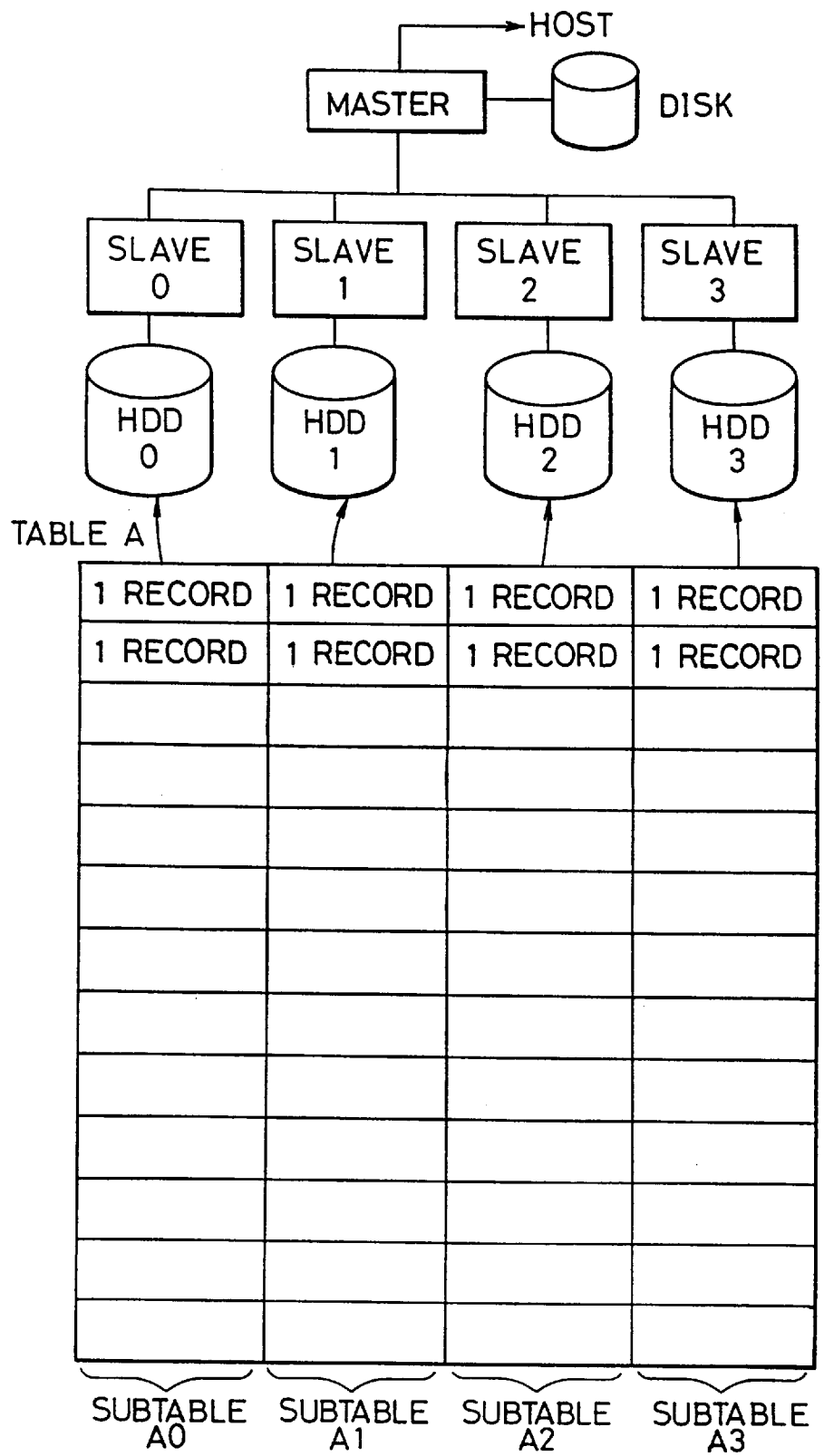
FIG. 59 shows the configuration of a conventional high-speed data access machine.
Figure 60:
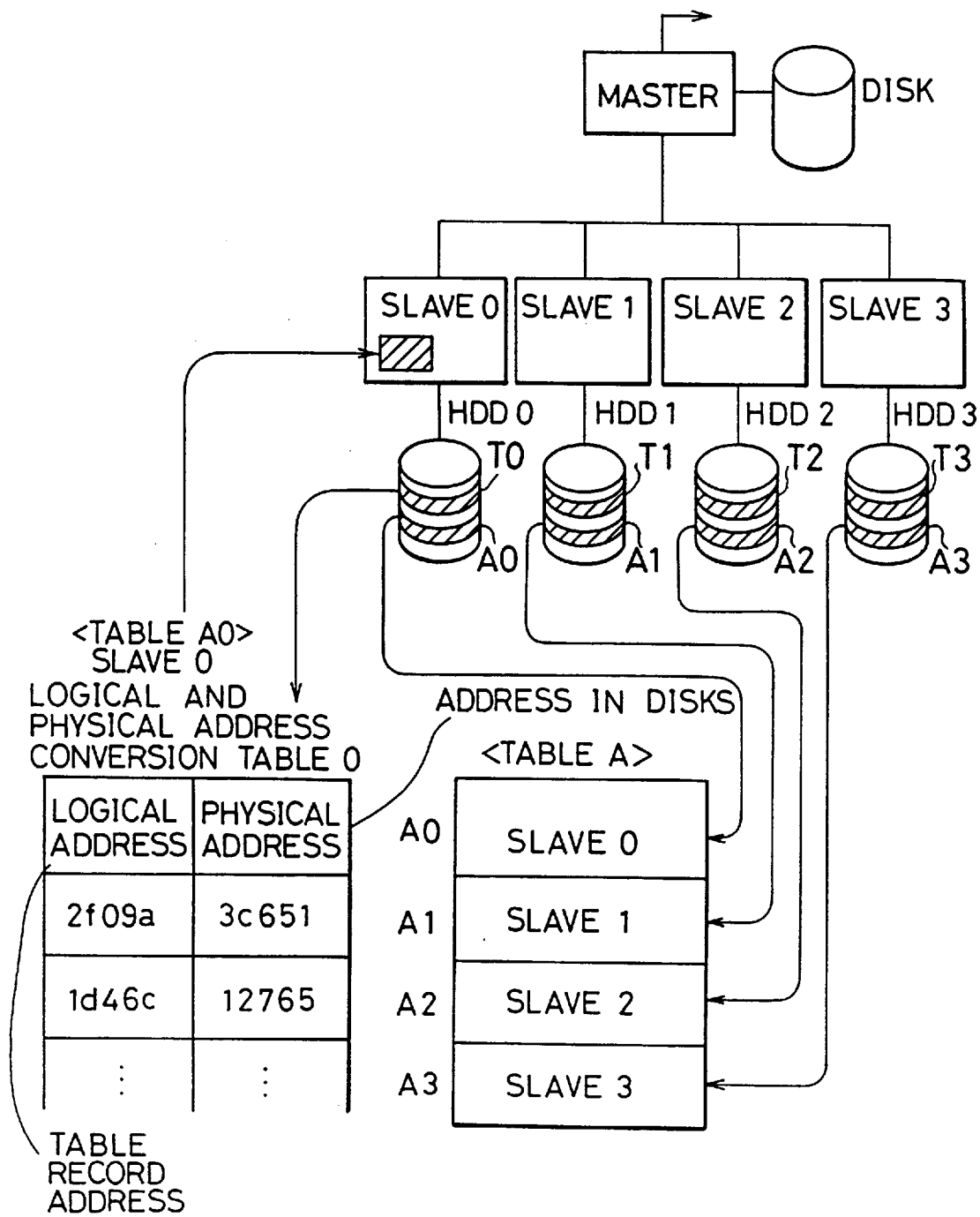
FIG. 60 depicts the operation of a conventional high-speed data access machine.
Figure 61:
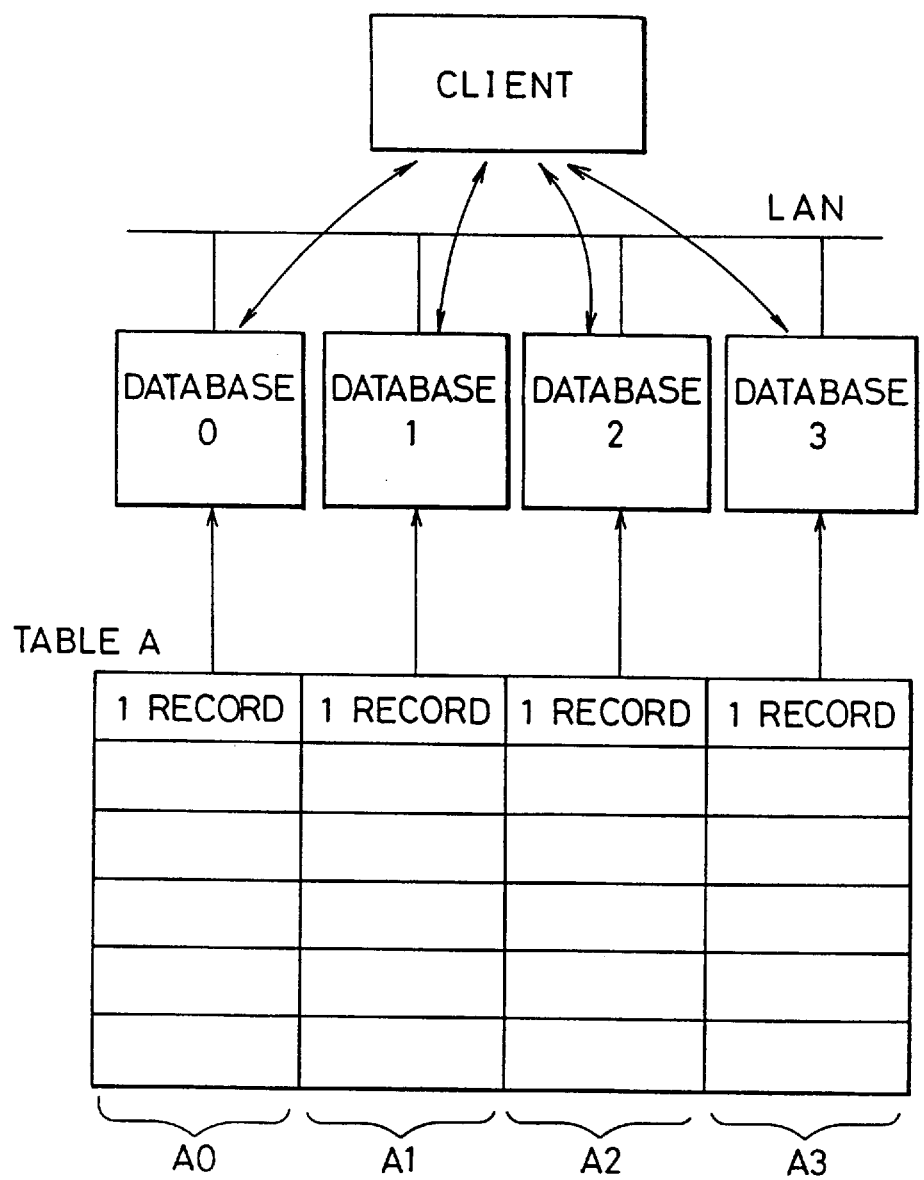
FIG. 61 is the configuration of a conventional distributed data base system.

FIG. 58 is an operational flowchart showing operation of update means 78. Because data update and data delete take the same procedure, data update will be focused below.

When DB0 receives a request to update Table A from the client at S111, DB0 distributes the request to all data bases to update their subtables A0 to An at S112. Then the individual data bases update the subtables. At S114, DB0 judges whether or not all the subtables have been updated normally. When all subtables are updated, DB0 reports the normal termination to the client (S115). If the update of Table A cannot be confirmed, DB0 requests all data bases to perform roll back at S116, and reports the failure to the client at S117.

Having thus described several particular embodiments of the invention, various alterations, modifications and improvements will readily occur to those skilled in the art. Such alterations, modifications, and improvements are intended to be part of this disclosure, and are intended to be within the spirit and scope of the invention. Accordingly, the foregoing description is by way of example only, and not intended to be limiting. The invention is limited only as defined in the following claims and the equivalents thereto.

What is claimed is:

1. A distributed data base system comprising:

an access apparatus for accessing distributed data;

a plurality of sub-systems for storing the distributed data to be accessed by the access apparatus; and a network for directly coupling the access apparatus and each of the plurality of sub-systems;

wherein one of the plurality of sub-systems functions as a manager sub-system and others of the plurality of subsystems function as member sub-systems;

wherein the manager sub-system includes means for receiving an access request from the access apparatus through the network, means for outputting processing requests corresponding to the access request to the member sub-systems through the network, means for receiving responses to the processing requests from the member sub-systems through the network, and means for sending a response to the access apparatus through the network;

wherein each of the member sub-systems includes means for receiving a processing request from the manager sub-system through the network, means for performing necessary data processing in response to the received processing request, and means for returning a response of the data processing to the manager sub-system through the network;

wherein the access apparatus includes means for outputting a request for creating a table of the distributed data to the network; and wherein the manager sub-system includes table create means for creating a distributed table for distribution among the plurality of sub-systems as a plurality of subtables based on the request from the access apparatus.

2. The distributed data base system of claim 1, wherein the access apparatus includes means for outputting a request for adding data to the network, and wherein the manager sub-system includes data adding means for distributing data for adding to the plurality of member sub-systems based on the request from the access apparatus.

3. The distributed data base system of claim 1, wherein the access apparatus includes means for outputting a request for creating an index for a table storing records of data in the network, the index storing, for each record of the table, a value and an address; and wherein the manager sub-system includes index create means for creating an index table for a distributed table stored in the plurality of sub-systems based on the request from the access apparatus.

4. The distributed data base system of claim 1, wherein the access apparatus includes means for outputting a request for retrieving data from a table to the network, and wherein the manager sub-system includes retrieve means for retrieving data for a distributed table stored in the plurality of member sub-systems based on the request from the access apparatus.

5. The distributed data base system of claim 1, wherein the access apparatus includes means for outputting a request for rolling back to the network, and wherein the manager sub-system includes roll back means for transferring the request to the plurality of member sub-systems based on the request from the access apparatus.

6. The distributed data base system of claim 1, wherein the access apparatus includes means for outputting a request for committing to the network, and wherein the manager sub-system includes commit means for transferring the request the plurality of member sub-systems based on the request from the access apparatus.

7. The distributed data base system of claim 1, wherein the access apparatus includes means for outputting a request for joining data to the network, and wherein the manager sub-system includes join means for joining data stored in different distributed tables based on the request from the access apparatus.

8. The distributed data base system of claim 1, wherein the access apparatus includes means for outputting a request for updating data to the network, and wherein the manager sub-system includes update means for updating data in the distributed table stored in the plurality of member sub-systems based on the request from the access apparatus.

9. A data access method for a distributed data base having an access apparatus and a plurality of sub-systems, the plurality of sub-systems including, a manager sub-system and a plurality of member sub-systems, the plurality of sub-systems storing data of the distributed data base, wherein the access apparatus, the manager sub-system and the plurality of member sub-systems are directly coupled by a network, the method comprising the steps of:

requesting a data access from the access apparatus to the network, wherein the data access corresponds to a distributed table stored as a plurality of subtables distributed in the plurality of sub-systems;

receiving the data access request at the manager sub-system through the network;

distributing the data access request to the related member sub-system from the manager sub-system; and receiving and processing the request with the related member sub-system.

10. The data access method of claim 9, further comprising the steps of:

responding to the manager sub-system from the member sub-system(s); and answering to the access apparatus from the manager sub-system.

* * * * *